(12) United States Patent
Feler et al.

(10) Patent No.: US 11,164,307 B1
(45) Date of Patent: Nov. 2, 2021

(54) MISREGISTRATION METROLOGY BY USING FRINGE MOIRÉ AND OPTICAL MOIRÉ EFFECTS

(71) Applicant: KLA Corporation, Milpitas, CA (US)

(72) Inventors: Yoel Feler, Haifa (IL); Mark Ghinovker, Yoqneam Ilit (IL); Evgeni Gurevich, Yoqneam Ilit (IL); Vladimir Levinski, Migdal HaEmek (IL); Alexander Svizher, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/935,117

(22) Filed: Jul. 21, 2020

(51) Int. Cl.
 *G06T 7/00* (2017.01)
 *G02B 27/60* (2006.01)
 *H04N 5/225* (2006.01)

(52) U.S. Cl.
 CPC .............. G06T 7/001 (2013.01); G02B 27/60 (2013.01); H04N 5/2256 (2013.01); *G06T 2207/10152* (2013.01); *G06T 2207/20216* (2013.01); *G06T 2207/30148* (2013.01)

(58) Field of Classification Search
 None
 See application file for complete search history.

(56) References Cited

U.S. PATENT DOCUMENTS

| | | | |
|---|---|---|---|
| 6,921,916 B2 | 7/2005 | Adel et al. | |
| 7,068,833 B1 | 6/2006 | Ghinovker et al. | |
| 7,177,457 B2 | 2/2007 | Adel et al. | |
| 7,349,105 B2 | 3/2008 | Weiss | |
| 7,440,105 B2 | 10/2008 | Adel et al. | |
| 7,528,941 B2 | 5/2009 | Kandel et al. | |
| 9,760,020 B2* | 9/2017 | Amir | G03F 7/70633 |
| 10,197,389 B2 | 2/2019 | Levinski et al. | |
| 2009/0034082 A1* | 2/2009 | Commander | B42D 25/29 359/619 |
| 2010/0310130 A1* | 12/2010 | Beghuin | G01N 21/95623 382/106 |
| 2012/0069344 A1* | 3/2012 | Liu | G02B 5/008 356/450 |
| 2018/0157058 A1* | 6/2018 | Chou | G02B 5/1861 |
| 2018/0188663 A1 | 7/2018 | Levinski et al. | |
| 2018/0321487 A1* | 11/2018 | Chang | G02B 27/0025 |
| 2020/0132446 A1 | 4/2020 | Shalibo et al. | |
| 2020/0249585 A1* | 8/2020 | Ghinovker | G03F 7/70683 |
| 2021/0072650 A1* | 3/2021 | Feler | G03F 7/70683 |

* cited by examiner

*Primary Examiner* — Tyler W. Sullivan
(74) *Attorney, Agent, or Firm* — Suiter Swantz pc llo

(57) ABSTRACT

A metrology system and metrology methods are disclosed. The metrology system includes an illumination sub-system, a collection sub-system, a detector, and a controller. The controller is configured to receive an image of an overlay target on a sample, determine an apparent overlay between two working zones along a measurement direction based on the image, and calculate an overlay between the two sample layers by dividing the apparent overlay by a Moiré gain to compensate for Moiré interference.

35 Claims, 45 Drawing Sheets

```
                    ┌─────────────────────────────────────────┐
                    │  ILLUMINATING A FIRST WORKING ZONE AND A │
           310 ─────│  SECOND WORKING ZONE OF AN OVERLAY TARGET│
                    │  WITH TWO ILLUMINATION LOBES AT TWO OBLIQUE│
                    │       ILLUMINATION ANGLES               │
                    └─────────────────────────────────────────┘
```

300 ↘

310 — ILLUMINATING A FIRST WORKING ZONE AND A SECOND WORKING ZONE OF AN OVERLAY TARGET WITH TWO ILLUMINATION LOBES AT TWO OBLIQUE ILLUMINATION ANGLES

320 — RECEIVING AN IMAGE OF THE OVERLAY TARGET, WHEREIN THE IMAGE IS BASED ON 0-ORDER DIFFRACTION AND ONE MOIRÉ DIFFRACTION ORDER ASSOCIATED WITH THE FIRST WORKING ZONE AND ON 0-ORDER DIFFRACTION AND ONE ADDITIONAL DIFFRACTION ORDER ASSOCIATED THE SECOND WORKING ZONE

330 — DETERMINING AN APPARENT OVERLAY BETWEEN THE TWO WORKING ZONES ALONG THE MEASUREMENT DIRECTION BASED ON THE IMAGE

340 — CALCULATING AN OVERLAY BETWEEN THE TWO SAMPLE LAYERS BY DIVIDING THE APPARENT OVERLAY BY A MOIRÉ GAIN TO COMPENSATE FOR THE MOIRÉ INTERFERENCE

FIG.3

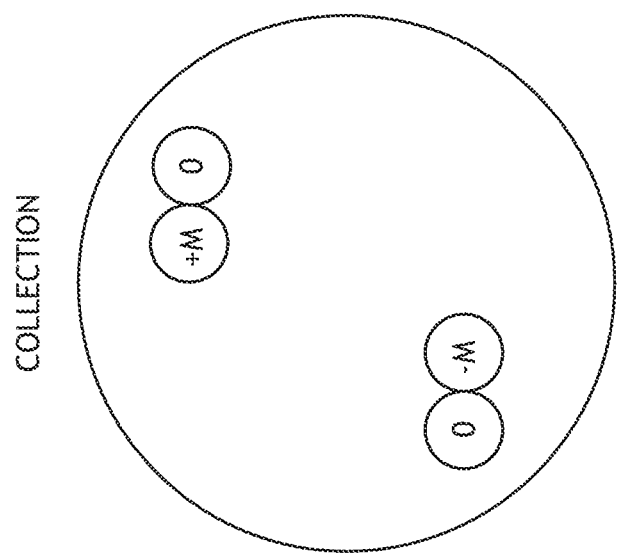
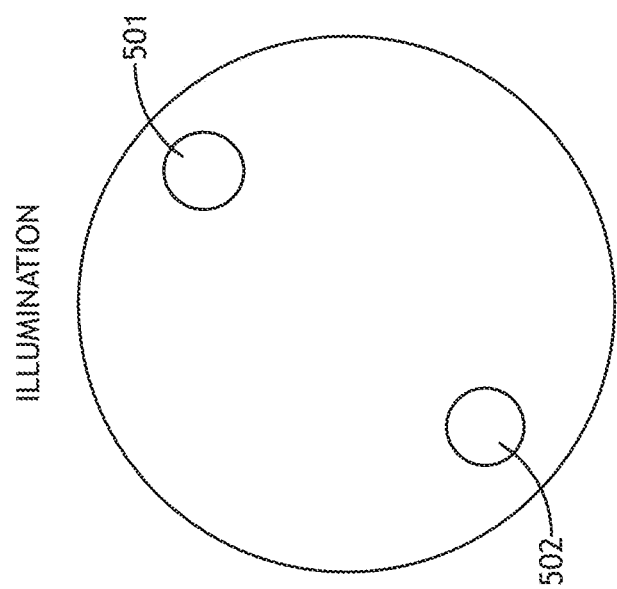
FIG. 6

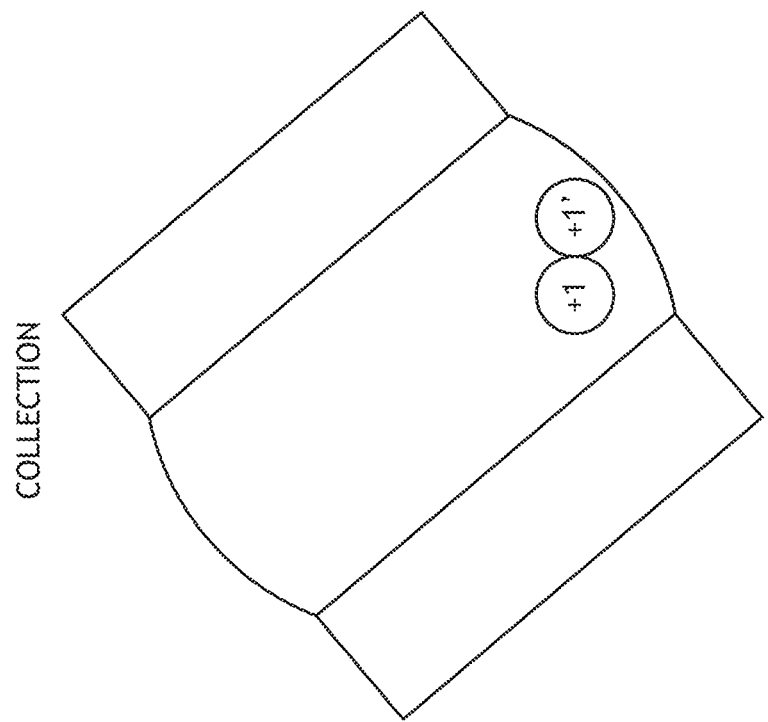
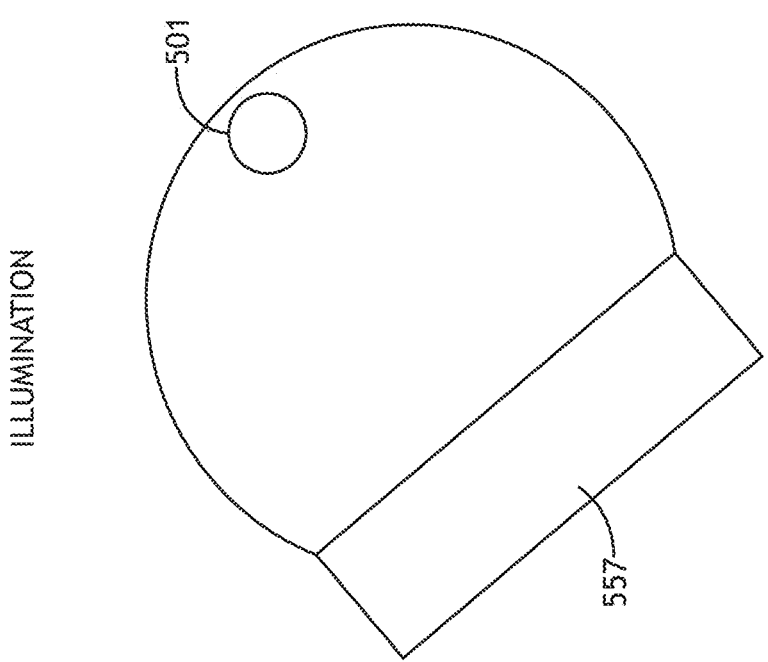
FIG. 18A

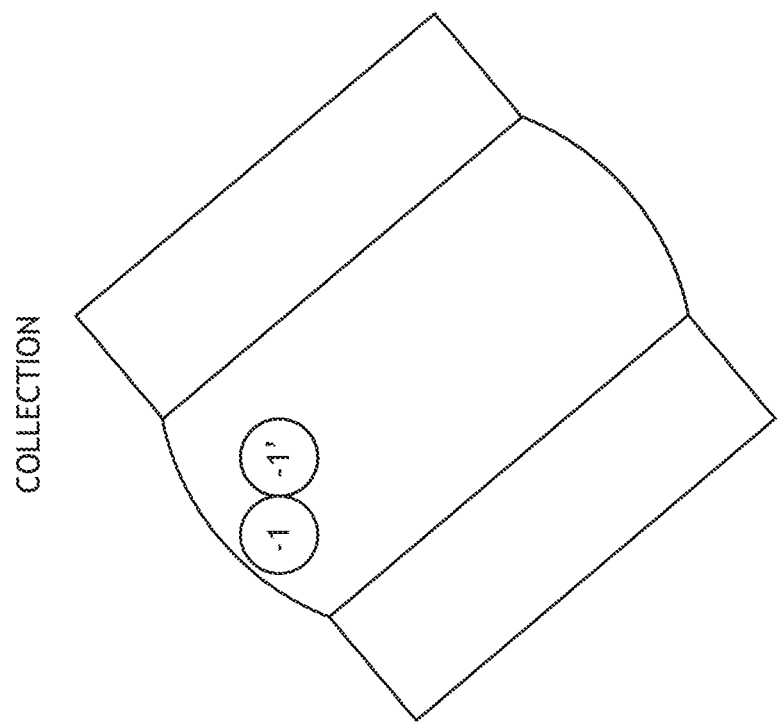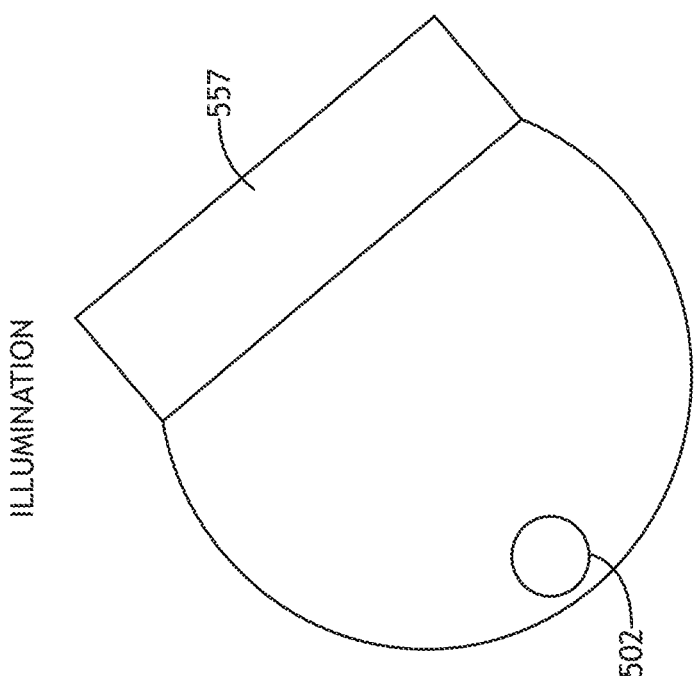
FIG. 18B

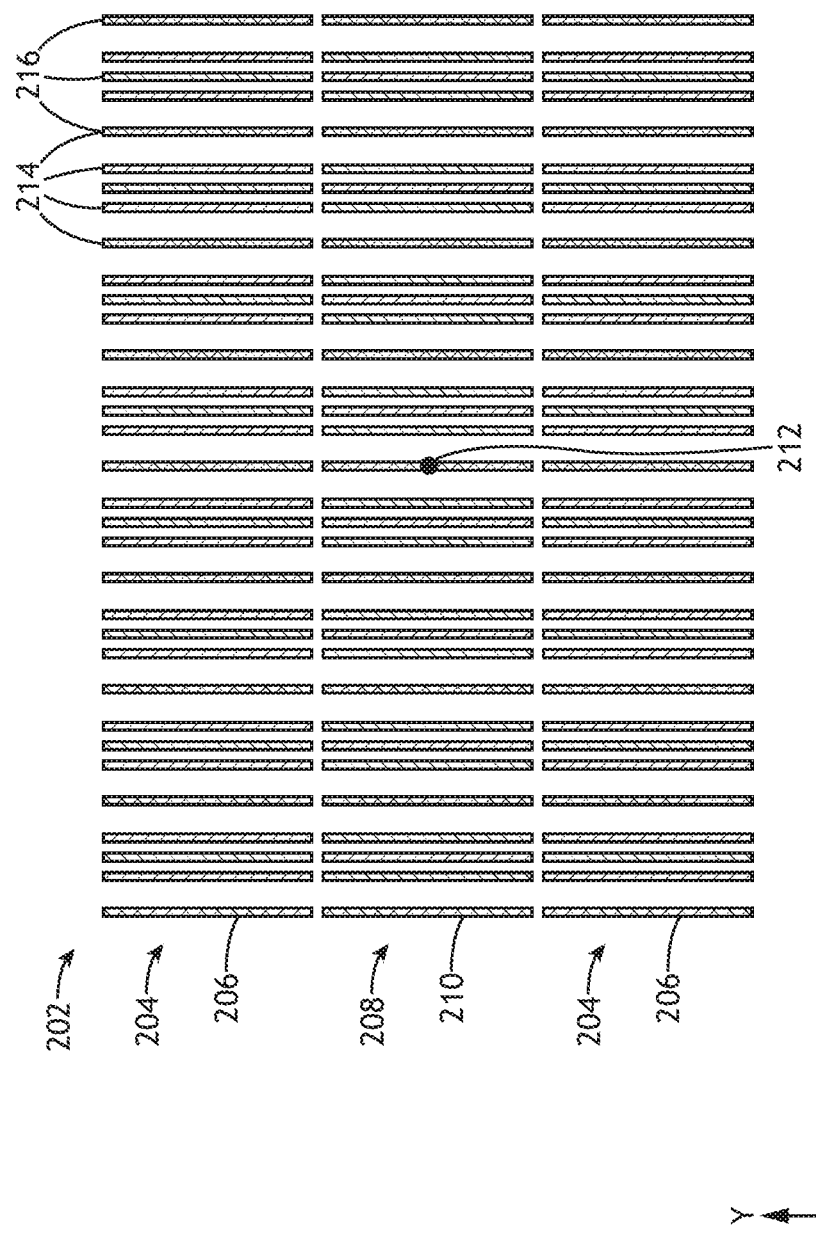

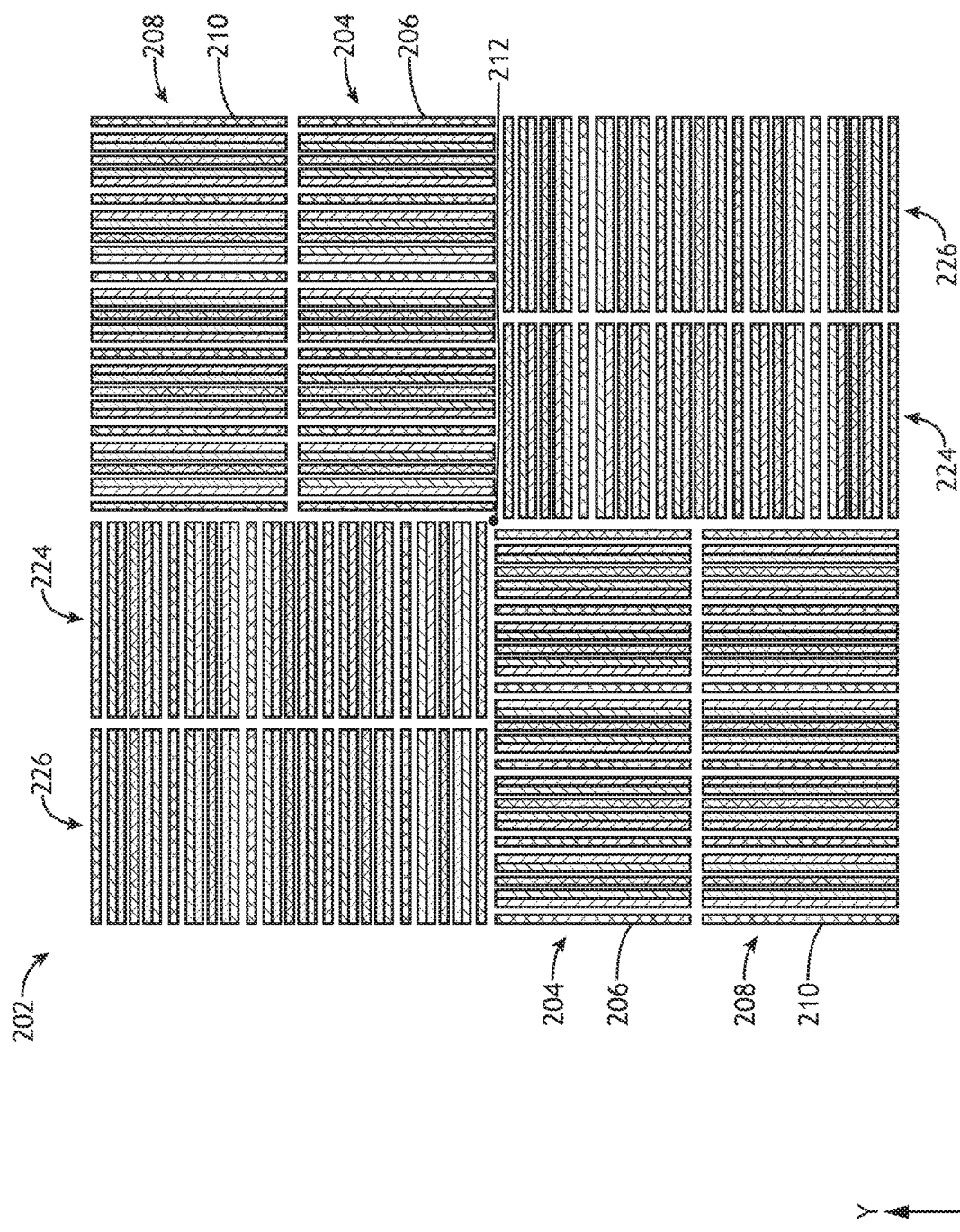

MISREGISTRATION METROLOGY BY USING FRINGE MOIRÉ AND OPTICAL MOIRÉ EFFECTS

TECHNICAL FIELD

The present disclosure relates generally to imaging overlay metrology and, more particularly, to imaging overlay targets with Moiré elements.

BACKGROUND

Shrinking design rules and more demanding specifications for overlay metrology are driving increased demands for the sensitivity and robustness of overlay metrology methods. Overlay metrology is typically performed by fabricating dedicated metrology targets having fabricated features in multiple sample layers of interest. Accordingly, an analysis of a fabricated metrology target may provide a measurement of the overlay error (e.g., relative alignment error) between the sample layers of interest. While a wide variety of overlay metrology target designs have been proposed, there is a continuous need to improve the metrology target designs as well as measurement methods for accurately and efficiently analyzing fabricated metrology targets.

SUMMARY

A metrology system is disclosed in accordance with one or more illustrative embodiments of the present disclosure. In one illustrative embodiment, the metrology system comprises an imaging system. In another illustrative embodiment, the imaging system comprises (1) an illumination sub-system configured to illuminate an overlay target with at least one illumination lobe at an oblique illumination angle with respect to the overlay target, the overlay target including at least a first working zone and a second working zone for overlay measurements along a measurement direction, wherein at least the first working zone includes a Moiré pattern formed from overlapping periodic structures along a measurement direction on two sample layers, wherein periods of the periodic structures on the two sample layers are different, (2) a collection sub-system configured to collect 0-order diffraction and one Moiré diffraction order associated with diffraction of each of the at least one illumination lobe by the first working zone, wherein the collection sub-system is further configured to collect 0-order diffraction and one additional diffraction order associated with diffraction of each of the at least one illumination lobe by the second working zone, and (3) a detector configured to generate an image of the overlay target using light collected by the collection sub-system. In another illustrative embodiment, the metrology system comprises a controller configured to be coupled to the imaging system, the controller including one or more processors configured to execute program instructions causing the one or more processors to: (a) receive an image of an overlay target on the sample, wherein an apparent period of the first working zone in the image is based on Moiré interference, (b) determine an apparent overlay between the first working zone and the second working zone along the measurement direction based on the image, and (c) calculate an overlay between the two sample layers by dividing the apparent overlay by a Moiré gain to compensate for the Moiré interference.

In another illustrative embodiment, the at least one illumination lobe comprises two illumination lobes at two oblique illumination angles with respect to the overlay target.

In another illustrative embodiment, the illumination sub-system illuminates the overlay target with the two illumination lobes simultaneously.

In another illustrative embodiment, the illumination sub-system illuminates the overlay target with the two illumination lobes sequentially.

In another illustrative embodiment, the two illumination lobes are oriented along the measurement direction.

In another illustrative embodiment, the two illumination lobes are oriented at a non-zero angle with respect to the measurement direction.

In another illustrative embodiment, the collection sub-system generates a first image of the overlay target based on the 0-order diffraction and one Moiré diffraction order associated with diffraction of each of the at least one illumination lobe by the first working zone, wherein the collection sub-system generates a second image of the overlay target based on the 0-order diffraction and one additional diffraction order associated with diffraction of each of the at least one illumination lobe by the second working zone, wherein the controller is further configured to determine the apparent overlay by averaging apparent overlays associated with the first image and the second image.

In another illustrative embodiment, the at least one illumination lobe comprises two illumination lobes at two oblique illumination angles with respect to the overlay target.

In another illustrative embodiment, the illumination sub-system illuminates the overlay target with the two illumination lobes simultaneously, wherein the collection sub-system generates the first image and the second image simultaneously by separating collected light associated with the first working zone from collected light associated with the second working zone.

In another illustrative embodiment, the illumination sub-system illuminates the overlay target with the two illumination lobes sequentially.

In another illustrative embodiment, the Moiré pattern of the first working zone is a first Moiré pattern, wherein the second working zone includes a second Moiré pattern formed from overlapping periodic structures along the measurement direction on the two sample layers, wherein periods of the periodic structures on the two sample layers in the second working zone are different, wherein the second Moiré pattern is different than the first Moiré pattern.

A metrology method is disclosed in accordance with one or more illustrative embodiments of the present disclosure. In one illustrative embodiment, the metrology method comprises receiving an image of an overlay target on a sample based on illumination of the overlay target with at least one illumination lobe at an oblique illumination angle with respect to the overlay target, the overlay target including at least a first working zone and a second working zone for overlay measurements along a measurement direction, wherein at least the first working zone includes a Moiré pattern formed from overlapping periodic structures along a measurement direction on two sample layers, wherein periods of the periodic structures on the two sample layers are different, wherein the image is based on 0-order diffraction and one Moiré diffraction order associated with diffraction of each of the at least one illumination lobe by the first working zone, wherein the image is further based on 0-order diffraction and one additional diffraction order associated with diffraction of each of the at least one illumination lobe by the second working zone, wherein an apparent period of the first working zone in the image is based on Moiré interference. In another illustrative embodiment, the metrology method comprises determining an apparent overlay between the first working zone and the second working zone along the measurement direction based on the image. In another illustrative embodiment, the metrology method comprises calculating an overlay between the two sample layers by dividing the apparent overlay by a Moiré gain to compensate for the Moiré interference.

In another illustrative embodiment, the at least one illumination lobe comprises two illumination lobes at two oblique illumination angles with respect to the overlay target.

A metrology system is disclosed in accordance with one or more illustrative embodiments of the present disclosure. In one illustrative embodiment, the metrology system comprises an imaging system. In another illustrative embodiment, the imaging system comprises (1) an illumination sub-system configured to illuminate an overlay target with at least one illumination lobe at an oblique illumination angle with respect to the overlay target, the overlay target including at least a first working zone and a second working zone for overlay measurements along a measurement direction, wherein at least the first working zone includes a Moiré pattern formed from overlapping periodic structures along a measurement direction on two sample layers, the two sample layers including a first sample layer and a second sample layer, wherein periods of the periodic structures on the two sample layers are different, (2) a collection sub-system configured to collect 1st-order diffraction from each of the two sample layers associated with the first working zone, wherein the collection sub-system is further configured to collect 1st-order diffraction from each of the two sample layers associated with the second working zone, and (3) a detector configured to generate an image of the overlay target using light collected by the collection sub-system. In another illustrative embodiment, the metrology system comprises a controller configured to be coupled to the imaging system, the controller including one or more processors configured to execute program instructions causing the one or more processors to: (a) receive an image of an overlay target on the sample, wherein an apparent period of the first working zone in the image is based on Moiré interference at the detector, (b) filter the image to isolate the Moiré interference, (c) determine an apparent overlay between the first working zone and the second working zone along the measurement direction based on the image, and (d) calculate an overlay between the two sample layers by dividing the apparent overlay by a Moiré gain to compensate for the Moiré interference.

In another illustrative embodiment, the collection sub-system includes one or more blockers to block 0-order diffraction from at least one of the first working zone or the second working zone.

In another illustrative embodiment, a numerical aperture of the collection sub-system is smaller than a numerical aperture of the illumination sub-system to prevent collection of 0-order diffraction from at least one of the first working zone or the second working zone.

In another illustrative embodiment, the at least one illumination lobe comprises two illumination lobes at two oblique illumination angles with respect to the overlay target.

In another illustrative embodiment, the illumination sub-system illuminates the overlay target with the two illumination lobes simultaneously.

In another illustrative embodiment, the illumination sub-system illuminates the overlay target with the two illumination lobes sequentially.

In another illustrative embodiment, the two illumination lobes are oriented along the measurement direction.

In another illustrative embodiment, the two illumination lobes are oriented at a non-zero angle with respect to the measurement direction.

In another illustrative embodiment, the collection sub-system generates a first image of the overlay target based on the 1st-order diffraction from each of the two sample layers associated with the first working zone, wherein the collection sub-system generates a second image of the overlay target based on the 1st-order diffraction from each of the two sample layers associated with the second working zone, wherein the controller is further configured to determine the apparent overlay by averaging apparent overlays associated with the first image and the second image.

In another illustrative embodiment, the at least one illumination lobe comprises two illumination lobes at two oblique illumination angles with respect to the overlay target.

In another illustrative embodiment, the illumination sub-system illuminates the overlay target with the two illumination lobes simultaneously, wherein the collection sub-system generates the first image and the second image simultaneously by separating collected light associated with the first working zone from collected light associated with the second working zone.

In another illustrative embodiment, the illumination sub-system illuminates the overlay target with the two illumination lobes sequentially.

A metrology method is disclosed in accordance with one or more illustrative embodiments of the present disclosure. In one illustrative embodiment, the metrology method comprises receiving an image of an overlay target on a sample based on illumination of the overlay target with at least one illumination lobe at an oblique illumination angle with respect to the overlay target, the overlay target including at least a first working zone and a second working zone for overlay measurements along a measurement direction, wherein at least the first working zone includes a Moiré pattern formed from overlapping periodic structures along a measurement direction on two sample layers, wherein periods of the periodic structures on the two sample layers are different, wherein the image is based 1st-order diffraction from each of the two sample layers associated with the first working zone, wherein the image is further based on 1st-order diffraction from each of the two sample layers associated with the second working zone, wherein an apparent period of the first working zone in the image is based on Moiré interference. In another illustrative embodiment, the metrology method comprises determining an apparent overlay between the first working zone and the second working zone along the measurement direction based on the image. In another illustrative embodiment, calculating an overlay between the two sample layers by dividing the apparent overlay by a Moiré gain to compensate for the Moiré interference.

In another illustrative embodiment, the at least one illumination lobe comprises two illumination lobes at two oblique illumination angles with respect to the overlay target.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3 is a flow diagram illustrating a method for calculating overlay using a double scattering Moiré effect, in accordance with one or more embodiments of the present disclosure.

FIG. 6 illustrates a one-step off-center configuration for sample illumination and collection using the double scattering Moiré effect, in accordance with one or more embodiments of the present disclosure.

FIGS. 18A-18B illustrate a two-step off-center configuration for sample illumination and collection using the single scattering optical Moiré effect, in accordance with one or more embodiments of the present disclosure.

FIG. 26A is a top view of a metrology target including a first working zone including two instances of a first Moiré pattern and a second working zone including a single instance of a second Moiré pattern, in accordance with one or more embodiments of the present disclosure.

FIG. 28C is a top view of a metrology target based on FIGS. 28A and 28B for measurement along two orthogonal directions, in accordance with one or more embodiments of the present disclosure.

DETAILED DESCRIPTION

Figure 1:
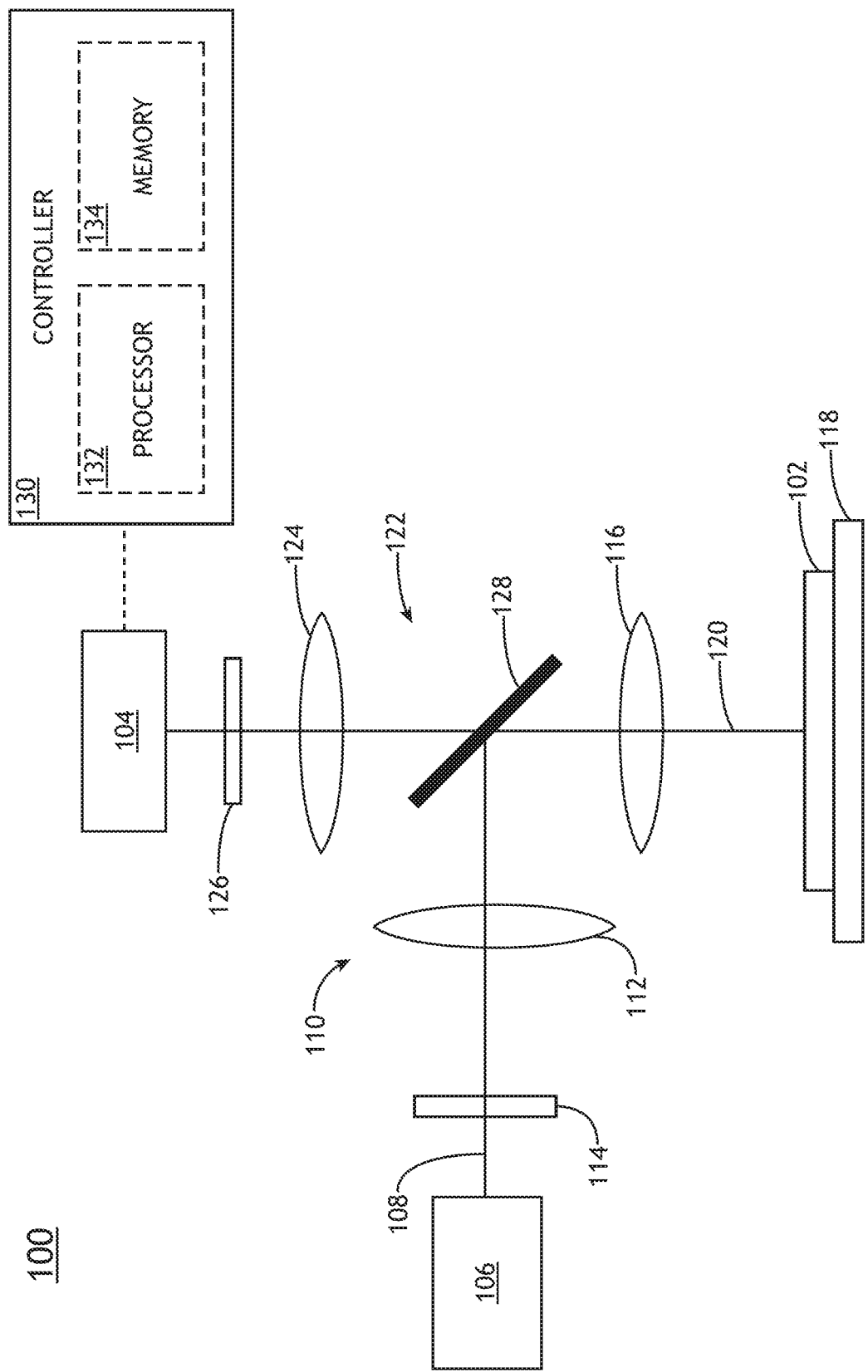
FIG. 1 is a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. As used herein, directional terms such as "left", "right", "top", "bottom", "over", "under", "upper", "upward", "lower", "down" and "downward" are intended to provide relative positions for purposes of description, and are not intended to designate an absolute frame of reference. It should be readily apparent to those of ordinary skill in the art that various changes and modifications in form and detail may be made without departing from the spirit and scope of the disclosure.

Currently, there are several major technologies used for overlay measurements, including imaging, scatterometry and scanning electron microscopy (SEM). The main optical architecture used in imaging is centrally illuminated regular imaging. There are several disadvantages to using conventional imaging technologies for overlay metrology, including (1) limited sensitivity due to the focus dependence of the imaging system, (2) amplitude inaccuracy depending on the focus choice, and (3) the numerical aperture (NA) of the objective limiting the pitch of gratings in a measurement map.

The present disclosure is directed to an imaging overlay measurement technology, which entails placing a collection camera or another collection device in a field plane to capture an image of an overlay target on a sample. In particular, the present disclosure is directed to measuring overlay using a Moiré grating-over-grating effect. The present disclosure provides a method of measuring overlay using a double scattering Moiré effect (e.g., collecting 0-order diffraction and at least one Moiré diffraction order), and a method of measuring overlay using a single scattering optical Moiré effect (a Moiré effect that appears on a camera due to the interference between single scattering effects, e.g., collecting 1st-order diffraction and filtering an image to isolate Moiré interference). The illumination and collection systems of the present disclosure are advantageous in that (a) the Moiré effect is measurable, (b) no other effects influence the measurements, (c) accuracy is maximized, (d) measurability is maximized, and (e) design simplicity is emphasized.

Regarding the double scattering Moiré effect, contrast is improved and amplitude inaccuracy is removed by designing an optical scheme so that only two diffraction orders interfere at any given time. Wherever 0-order diffraction is used, the 0-order diffraction may be substituted with a reference beam, and instead of regular imaging, one can produce an interferometric solution (with its problems, for example, instability, and its benefits, for example, intensity control). Regarding the single scattering optical Moiré effect, contrast is improved and amplitude inaccuracy is removed by removing the 0th order and the Moiré fringe.

Figure 2A:
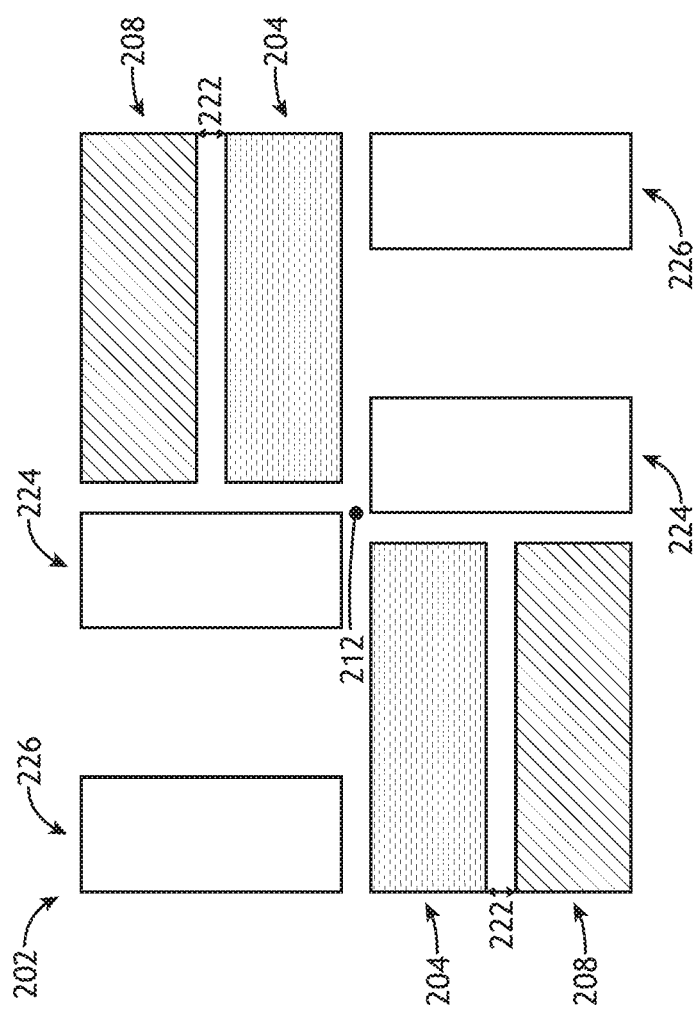
FIG. 2A is a top block diagram view of a metrology target having Moiré patterns based on grating-over-grating structures in multiple rotationally-symmetric working zones, in accordance with one or more embodiments of the present disclosure.
Figure 2B:
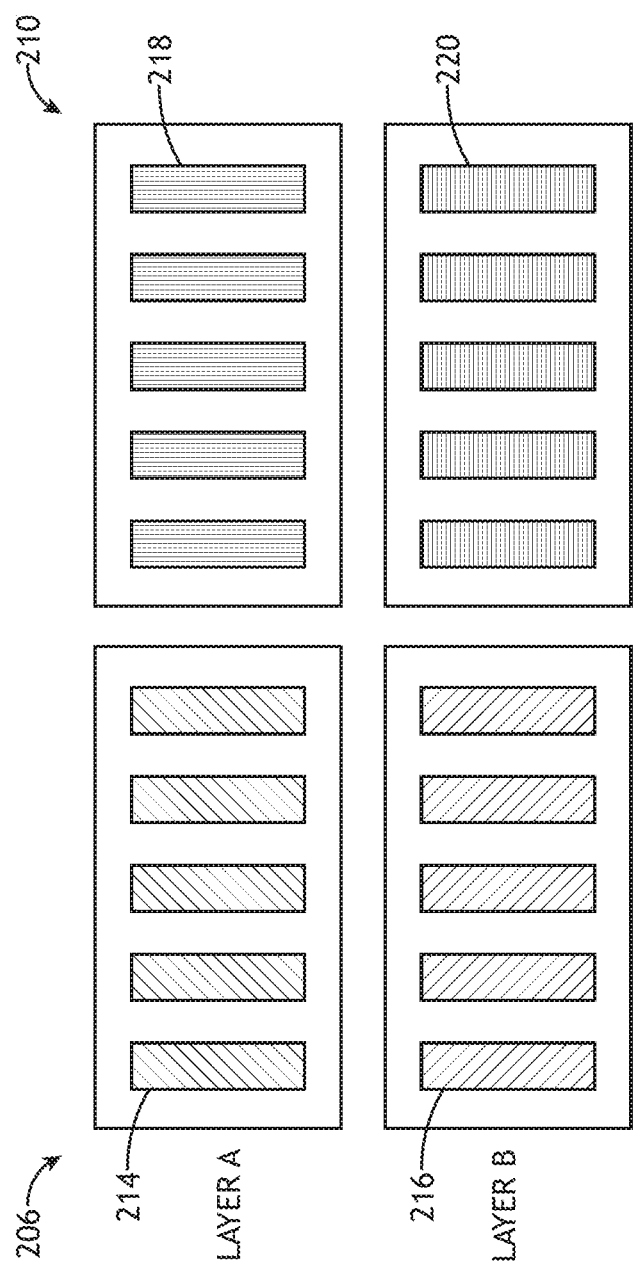
FIG. 2B is a conceptual view of multi-layer grating structures in the Moiré patterns of FIG. 2A, in accordance with one or more embodiments of the present disclosure.
Figure 2C:
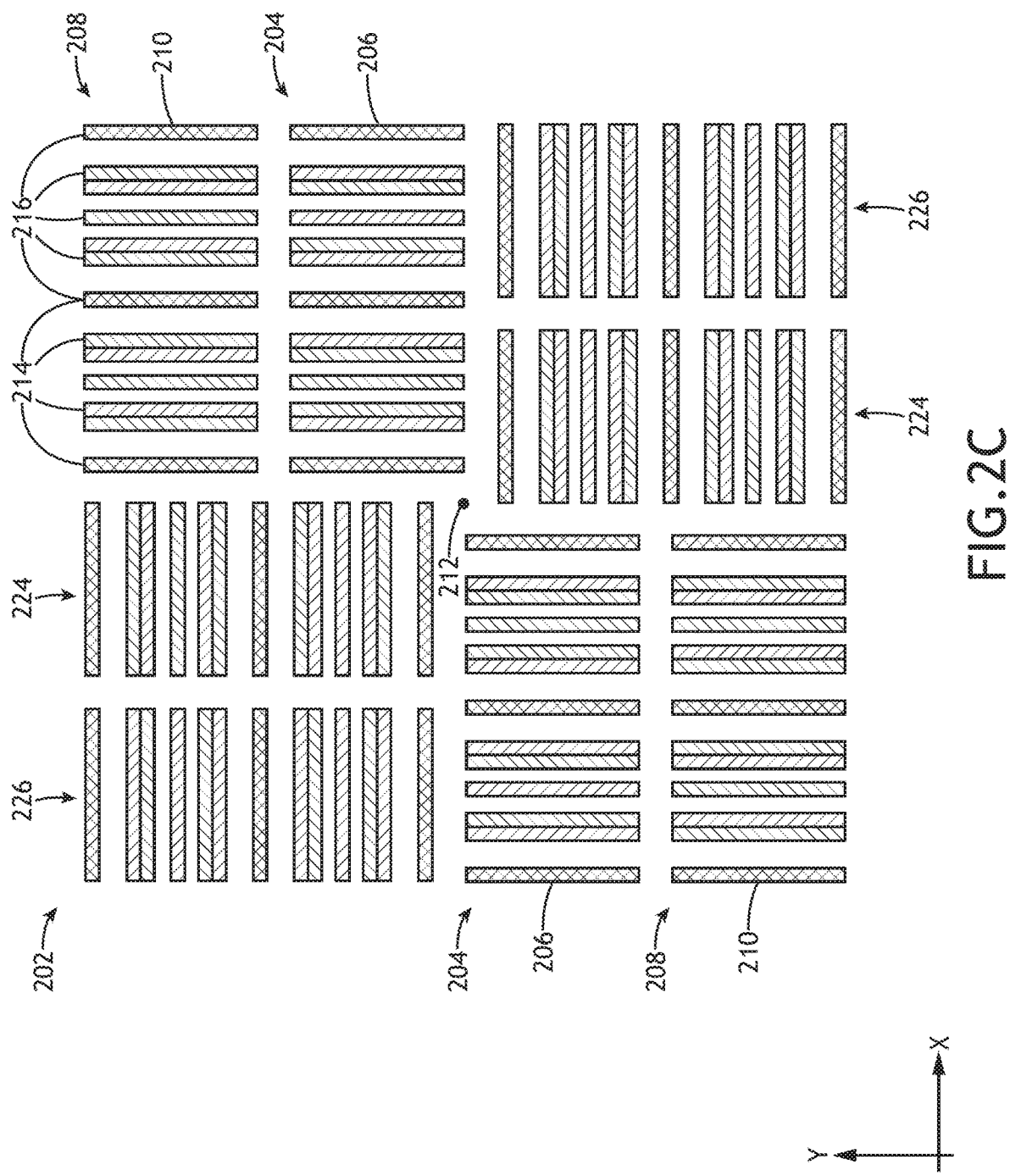
FIG. 2C is a top view of a metrology target based on FIGS. 2A and 2B for measurement along two orthogonal directions, in accordance with one or more embodiments of the present disclosure.

FIG. 1 illustrates a metrology system configured to generate an image of a sample. FIGS. 2A through 2C illustrate the metrology of overlay targets having Moiré patterns based on grating-over-grating structures in one or more rotationally-symmetric working zones. FIGS. 3 through 9B illustrate using a double scattering Moiré effect to calculate the overlay of a sample. FIGS. 10 through 22 illustrate using a single scattering optical Moiré effect to calculate the overlay of a sample. FIGS. 23A-B are flow diagrams illustrating methods to calculate overlay by exploiting the symmetry of working zones. FIGS. 24A through 26B illustrate overlay using metrology targets having Moiré patterns in two working zones. FIGS. 27 through 28C illustrate overlay using metrology targets having Moiré patterns in one working zone and single-layer structures (e.g., not a grating over grating structure) in a second working zone. FIGS. 29A and 29B illustrate overlay using metrology targets with three or more layers having Moiré patterns in two working zones, where one layer serves as a reference layer.

A Moiré pattern on a metrology target may include a grating-over-grating structure formed from grating structures on different sample layers with different periods. For the purposes of this disclosure, a "grating" or a "grating structure" may describe any periodic structure or series of elements that may include, but is not limited to, line/space patterns. An image of the Moiré pattern will include Moiré fringes at a Moiré pitch, which is associated with spatially-varying overlap between the gratings on the different sample layers. The Moiré pitch is typically a longer pitch than either of the grating structures and is related to the difference between the pitches of the grating structures. For example, the Moiré pitch ($p_M$) may be characterized as:

$$p_M = \frac{p_1 \cdot p_2}{p_1 - p_2} \quad (1)$$

where $p_1$ is the period of a first grating structure on a first layer, and $p_2$ is the period of the second grating structure on the second layer.

It is contemplated herein that metrology targets including Moiré patterns may facilitate sensitive overlay measurements. In particular, a physical shift of one grating with respect to another grating in a Moiré pattern (e.g., an overlay error associated with a relative shift of two sample layers on a sample) along a direction of periodicity will result in a corresponding lateral shift of the Moiré fringes along the measurement direction. Further, the magnitude of the shift of the Moiré fringes is typically greater than the magnitude of the physical shift. In particular, the magnitude of the shift of the Moiré fringes is proportional to the physical shift (e.g., the overlay error) by a conditional Moiré factor, which depends on the frame of reference. Continuing the example above, a shift of the second layer with respect to the first layer will result in a shift of the Moiré fringes from a nominal position (e.g., no overlay error) by a conditional Moiré factor (M) of:

$$M = \frac{p_1}{p_1 - p_2}. \qquad (2)$$

However, in the context of the present disclosure, references to "first layer," "second layer," "third layer," or the like are intended merely to distinguish various sample layers and do not indicate a physical ordering of layers on the sample. Accordingly, a "first layer" may be above or below a "second layer" on the sample.

In this regard, an overlay measurement may be performed by measuring a shift of the Moiré fringes along the direction of periodicity of the associated grating structures on a metrology target and adjusting this value by a Moiré gain, which will depend on the particular design of the metrology target and the particular measurements made. For example, it may be desirable to measure a shift of Moiré fringes relative to another structure or another set of Moiré fringes since an absolute measurement of a single Moiré fringe shift may be difficult, impractical, or impossible for some target designs. The use of Moiré patterns in overlay metrology is generally described in U.S. Pat. No. 7,440,105 issued on Oct. 21, 2008, U.S. Pat. No. 7,349,105 issued on Mar. 25, 2008, and U.S. Patent Appl. Publ. No. 2018/0188663 published on Jul. 5, 2018, all of which are incorporated herein in their entirety.

It is further recognized herein that arranging elements of a metrology target in a symmetric configuration may facilitate the determination of relative positions of the elements based on exploitation of the symmetry. For example, an overlay metrology target may be formed such that a center of symmetry of elements on a first sample layer overlaps a center of symmetry of elements on a second sample layer. Accordingly, any difference between the centers of symmetry for elements in the first layer with respect to the second layer in a fabricated metrology target may be attributed to overlay error. The exploitation of symmetry in overlay metrology targets (e.g., Advanced Imaging Metrology (AIM) targets) is described generally in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007, all of which are incorporated herein by reference in their entirety.

Embodiments of the present disclosure may be directed to overlay metrology targets having at least one working zone with one or more Moiré patterns arranged in a symmetric distribution. For example, the Moiré patterns within the working zone may be distributed in a mirror symmetric distribution or a rotationally symmetric distribution (e.g., a 90° rotationally-symmetric distribution, a 180° rotationally-symmetric distribution, or the like). In this regard, advantages of Moiré patterns and advantages of symmetry in metrology targets may be combined and exploited together to facilitate accurate and robust overlay metrology.

It is recognized herein that the impact of a physical overlay error on a working group including one or more instances of a Moiré pattern may be to shift a center of symmetry based on a shift of Moiré fringes as described previously herein. Accordingly, any measurement of overlay based on the center of symmetry must be adjusted based on a Moiré gain factor. It is further recognized herein that the Moiré gain factor may depend on the particular arrangement of elements in an overlay metrology target.

FIG. 1 is a block diagram view of a metrology system 100, in accordance with one or more embodiments of the present disclosure. The metrology system 100 may generate one or more images of a sample 102 on at least one detector 104 using any method known in the art.

In one embodiment, the metrology system 100 includes an illumination source 106 to generate an illumination beam 108. The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum.

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like). In some embodiments, the illumination beam 108 may comprise incoherent light. In other embodiments, the illumination beam 108 may comprise coherent light.

In another embodiment, the illumination source 106 directs the illumination beam 108 to a sample 102 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 102 and/or field stops to control the spatial extent of illumination on the sample 102. In one instance, the illumination pathway 110 includes an aperture stop located at a plane conjugate to the back focal plane of the objective lens 116 to provide telecentric illumination of the sample. In another embodiment, the metrology system 100 includes an objective lens 116 to focus the illumination beam 108 onto the sample 102.

In another embodiment, the sample 102 is disposed on a sample stage 118. The sample stage 118 may include any device suitable for positioning the sample 102 within the metrology system 100. For example, the sample stage 118 may include any combination of linear translation stages, rotational stages, tip/tilt stages or the like.

In another embodiment, a detector 104 is configured to capture radiation emanating from the sample 102 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 102 or generated by the sample 102 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of an optical element the objective lens 116 to provide telecentric imaging of the sample.

The detector 104 may include any type of optical detector known in the art suitable for measuring illumination received from the sample 102. For example, a detector 104 may include a sensor suitable for generating one or more images of a static sample 102 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. Further, the detector 104 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

By way of another example, a detector 104 may include a sensor suitable for generating one or more images of a sample 102 in motion (e.g., a scanning mode of operation). For instance, the detector 104 may include a line sensor including a row of pixels. In this regard, the metrology system 100 may generate a continuous image (e.g., a strip image) one row at a time by translating the sample 102 in a scan direction perpendicular to the pixel row through a measurement field of view and continuously clocking the line sensor during a continuous exposure window.

In another instance, the detector 104 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, a detector 104 may include a spectroscopic detector suitable for identifying wavelengths of radiation emanating from the sample 102. In another embodiment, the metrology system 100 may include multiple detectors 104 (e.g. associated with multiple beam paths generated by one or more beamsplitters to facilitate multiple metrology measurements by the metrology system 100. For example, the metrology system 100 may include one or more detectors 104 suitable for static mode imaging and one or more detectors 104 suitable for scanning mode imaging. In another embodiment, the metrology system 100 may include one or more detectors 104 suitable for both static and scanning imaging modes.

In one embodiment, as illustrated in FIG. 1, the metrology system 100 includes a beamsplitter 128 oriented such that the objective lens 116 may simultaneously direct the illumination beam 108 to the sample 102 and collect radiation emanating from the sample 102.

In another embodiment, the angle of incidence of the illumination beam 108 on the sample 102 is adjustable. For example, the path of the illumination beam 108 through the beamsplitter 128 and the objective lens 116 may be adjusted to control the angle of incidence of the illumination beam 108 on the sample 102. In this regard, the illumination beam 108 may have a nominal path through the beamsplitter 128 and the objective lens 116 such that the illumination beam 108 has a normal incidence angle on the sample 102. By way of another example, the angle of incidence of the illumination beam 108 on the sample 102 may be controlled by modifying the position and/or angle of the illumination beam 108 on the beamsplitter 128 (e.g. by rotatable mirrors, a spatial light modulator, a free-form illumination source, or the like). In another embodiment, the illumination source 106 directs the one or more illumination beam 108 to the sample 102 at an angle (e.g. a glancing angle, a 45-degree angle, or the like).

In another embodiment, the metrology system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, images of the sample 102 from the detector 104.

The one or more processors 132 of a controller 130 may include any processing element known in the art. In this sense, the one or more processors 132 may include any microprocessor-type device configured to execute algorithms and/or instructions. In one embodiment, the one or more processors 132 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 134. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the metrology system 100 or external to the metrology system 100.

The memory medium 134 may include any storage medium known in the art suitable for storing program instructions executable by the associated one or more processors 132. For example, the memory medium 134 may include a non-transitory memory medium. By way of another example, the memory medium 134 may include, but is not limited to, a read-only memory, a random access memory, a magnetic or optical memory device (e.g., disk), a magnetic tape, a solid state drive and the like. It is further noted that memory medium 134 may be housed in a common controller housing with the one or more processors 132. In one embodiment, the memory medium 134 may be located remotely with respect to the physical location of the one or more processors 132 and controller 130. For instance, the one or more processors 132 of controller 130 may access a remote memory (e.g., server), accessible through a network (e.g., internet, intranet and the like). Therefore, the above description should not be interpreted as a limitation on the present invention but merely an illustration.

In another embodiment, the controller 130 is communicatively coupled to one or more elements of the metrology system 100. In this regard, the controller 130 may transmit and/or receive data from any component of the metrology system 100. Further, the controller 130 may direct or otherwise control any component of the metrology system 100 by generating one or more drive signals for the associated components. For example, the controller 130 may be communicatively coupled to the detector 104 to receive one or more images from the detector 104.

Further, the controller 130 may provide one or more drive signals to the detector 104 to carry out any of the detection techniques described herein. By way of another example, the controller 130 may be communicatively coupled to any combination of components to control the optical configuration associated with an image including, but not limited to, the illumination source 106, the illumination optical components 114, the collection optical components 126, the detector 104, or the like.

FIG. 2A is a top block diagram view of a metrology target 202 having Moiré patterns based on grating-over-grating structures in multiple rotationally-symmetric working zones, in accordance with one or more embodiments of the present disclosure. FIG. 2B is a conceptual view of multi-layer grating structures in the Moiré patterns of FIG. 2A, in accordance with one or more embodiments of the present disclosure.

In one embodiment, a metrology target 202 includes a first working zone 204 formed from two instances of a first Moiré pattern 206 arranged such that the first working zone 204 is rotationally symmetric. In another embodiment, the metrology target 202 includes a second working zone 208 formed from two instances of a second Moiré pattern 210 arranged such that the second working zone 208 is rotationally symmetric. In the context of the present disclosure, a working zone is a group of features that are intended to be analyzed together. For example, an overlay measurement may be performed by comparing characteristics of one working zone to another.

In a general sense, the centers of rotational symmetry of various working zones in a metrology target 202 may be independent. However, it may be desirable to design the metrology target 202 such that the centers of symmetry of some or all of the working zones coincide (within a selected tolerance) when there is no overlay error. This target design may minimize errors that may arise due to rotational misalignment between a measurement system (e.g., metrology system 100) and the wafer axes. In one embodiment, working zones of the same direction (e.g., X direction overlay measurements) have the same centers of symmetry. Further, centers of symmetry of working zones associated with overlay measurements along different directions may, but are not required to, coincide.

As illustrated in FIG. 2A, which depicts a situation with no overlay error, the first working zone 204 and the second working zone 208 are symmetric to 180° rotation about a center of symmetry 212.

The metrology target 202 in FIG. 2A may have similar rotational symmetry characteristics as an Advanced Imaging Metrology (AIM) target, which is generally described in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007. However, whereas each working zone in a typical AIM target include features in a single layer, at least one working zone of the metrology target 202 (e.g., the first working zone 204 and second working zone 208) includes a Moiré pattern formed from grating structures in multiple layers of interest. As illustrated in FIG. 2B, the first Moiré pattern 206 is formed from a first grating structure 214 having a pitch Q in a first layer (layer A) and a second grating structure 216 having a pitch P in a second layer (layer B), where P≠Q. Further, the second Moiré pattern 210 is formed from a third grating structure 218 having a pitch T in the first layer (layer A) and a fourth grating structure 220 having a pitch S in the second layer (layer B), where S≠T. In a general sense, the values of P, Q, S, and T may be independently varied such that FIGS. 2A and 2B represents a generic Moiré AIM target.

As described previously herein with respect to equations (1) and (2), the first working zone 204 will then have a Moiré pitch ($p_{M1}$) of $$p_{M1} = \frac{QP}{Q-P} \tag{3}$$

and the second working zone 208 will have a Moiré pitch ($p_{M2}$) of $$p_{M2} = \frac{ST}{S-T}. \tag{4}$$

The first working zone 204 will then have a conditional Moiré factor ($M_1$) of $$M_1 = \frac{P}{P-Q} \tag{5}$$

associated with a misalignment of layer A with respect to layer B, and the second working zone 208 will have a conditional Moiré factor ($M_2$) of $$M_2 = \frac{S}{S-T}. \tag{6}$$

associated with a shift of layer A with respect to layer B. Similarly, a shift of layer B with respect to layer A would provide $$M_1 = \frac{Q}{Q-P} \text{ and } M_2 = \frac{T}{T-S}.$$

In one embodiment, the first Moiré pattern 206 and/or the second Moiré pattern 210 include a grating-over-grating structure in which the respective gratings are fully overlapping. For example, the first grating structure 214 and the second grating structure 216 of the first Moiré pattern 206 may be fully overlapping on the sample 102. Similarly, the third grating structure 218 and the fourth grating structure 220 of the second Moiré pattern 210 may be fully overlapping on the sample 102. In this regard, the size of the metrology target 202 may be minimized to efficiently utilize space on the sample 102.

It is contemplated herein that a metrology target 202 including adjacent Moiré patterns may be susceptible to cross-talk. Further, the severity of cross-talk may depend on several factors including, but not limited to, the stack thicknesses, material properties, grating design, or conditions of a measurement system (e.g., metrology system 100). In some embodiments, the metrology target 202 includes exclusion zones between working zones, or Moiré patterns associated with different working zones, to reduce cross-talk to within a selected tolerance. For example, instances of the first Moiré pattern 206 and the second Moiré pattern 210 may be separated by an exclusion zone 222 sufficiently large to mitigate cross-talk between the corresponding Moiré fringes to within a specified tolerance. In some embodiments, the exclusion zone 222 is in the range of 0.25 to 0.5 microns or greater.

The exclusion zone 222 may be empty or may be filled with sub-resolution assist features, which may be required by some design rules. In one embodiment, the exclusion zone 222 is filled with sub-resolution assist features oriented orthogonal to the measurement direction (the X direction here). In a general sense, as long as each working zone is rotationally symmetric, elements in each working zone (including Moiré patterns) may be placed in any 2D distribution suitable for mitigating cross-talk to within a selected tolerance.

Further, although FIG. 2A depicts working zones associated with measurements along a single direction (e.g., the X direction), the metrology target 202 targets and methods for measurement along additional directions (e.g., the Y direction) are within the spirit and scope of the present disclosure. In one embodiment, the metrology target 202 includes a third working zone 224 and a fourth working zone 226 suitable for measurement along the Y direction. Further, the features in the third working zone 224 and/or the fourth working zone 226 may have any features suitable for overlay measurement and may, but are not required to, include one or more Moiré patterns. In another embodiment, though not shown, the metrology target 202 includes a working zone having a 2D Moiré pattern including periodic features in multiple directions (e.g., the X and Y directions). In this regard, the 2D Moiré pattern may exhibit Moiré fringes simultaneously along the multiple dimensions and may thus be suitable for simultaneous overlay measurements in multiple directions.

FIG. 2C is a top view of a metrology target 202 based on FIGS. 2A and 2B for measurement along two orthogonal directions, in accordance with one or more embodiments of the present disclosure. In particular, the metrology target 202 illustrated in FIG. 2C represents an example in which P=T and Q=S. Further, FIG. 2C illustrates a situation with no overlay error in either the X-direction or the Y-direction. In this regard, the axes of symmetry of the first working zone 204 and the second working zone 208 overlap along both the X and Y directions (e.g., the axes of symmetry of the first working zone 204 and the second working zone 208 overlap).

However, it is to be understood that FIG. 2C and the associated descriptions are provided solely for illustrative purposes and should not be interpreted as limiting.

In one embodiment, the metrology target 202 includes a first working zone 204 with two instances of a first Moiré pattern 206 for measurement along the X direction, a second working zone 208 including two instances of a second Moiré pattern 210, a third working zone 224 with two instances of the first Moiré pattern 206 for measurement along the Y direction, and a fourth working zone 226 with two instances of the second Moiré pattern 210 for measurement along the vertical direction. In this regard, the third working zone 224 and the fourth working zone 226 are rotated versions of the first working zone 204 and the second working zone 208, respectively.

FIG. 3 is a flow diagram illustrating a method 300 for measuring overlay using a double scattering Moiré effect, in accordance with one or more embodiments of the present disclosure. For example, the method 300 may be applied to measure overlay based on an overlay target such as, but not limited to, the metrology targets illustrated in FIGS. 2A-2C and 24A-29B and their associated working zones (e.g., metrology target 202 and working zones 204 and 208). Applicant notes that the embodiments and enabling technologies described previously herein in the context of the metrology system 100 should be interpreted to extend to the method 300. It is further noted, however, that the method 300 is not limited to the architecture of the metrology system 100. Further, the method 300 may be applied to measure overlay along one or more measurement directions.

In one embodiment, the method 300 includes a step 310 of illuminating an overlay target (e.g., metrology target 202) on a sample with two illumination lobes at two oblique illumination angles. The overlay target may include at least a first working zone and a second working zone for overlay measurements along a measurement direction (e.g., working zones 204 and 208). The first working zone may include a Moiré pattern (e.g. Moiré pattern 206) formed from overlapping periodic structures along a measurement direction on two sample layers (e.g., grating structures 214 and 216), where periods of the periodic structures on the two sample layers are different.

In another embodiment, the method 300 includes a step 320 of receiving an image based on the illumination. The image may be based on 0-order diffraction and one Moiré diffraction order associated with diffraction of each of the two illumination lobes by the first working zone (e.g., working zone 204), and may be based on 0-order diffraction and one additional diffraction order associated with diffraction of each of the two illumination lobes by the second working zone (e.g., working zone 208). An apparent period of the first working zone in the image may be based on Moiré interference.

In another embodiment, the method 300 includes a step 330 of determining an apparent overlay between the first working zone and the second working zone along the measurement direction based on the image. This determination may be performed, for example, by methods 2300 and 2312 as described with respect to FIGS. 23A and 23B (e.g., finding the difference between centers of symmetry), however the step 330 is not limited thereto, and any method of computing the misregistration between the working zones may be used. It is noted that the apparent overlay is not equal to the physical overlay error between the two sample layers. Rather, the apparent overlay corresponds to relative shifts of the Moiré fringes between the first and second working zones. Accordingly, the physical overlay error between the sample layers along a measurement direction may be determined by dividing the difference between the axes of symmetry orthogonal to the measurement direction by a Moiré gain.

In another embodiment, the method 300 includes a step 340 of calculating an overlay between the two sample layers by dividing the apparent overlay by a Moiré gain to compensate for the Moiré interference. This calculation may be done, for example, by step 2322 of the method 2300 as described with respect to FIG. 23A, however the step 340 is not limited thereto.

Figure 4:
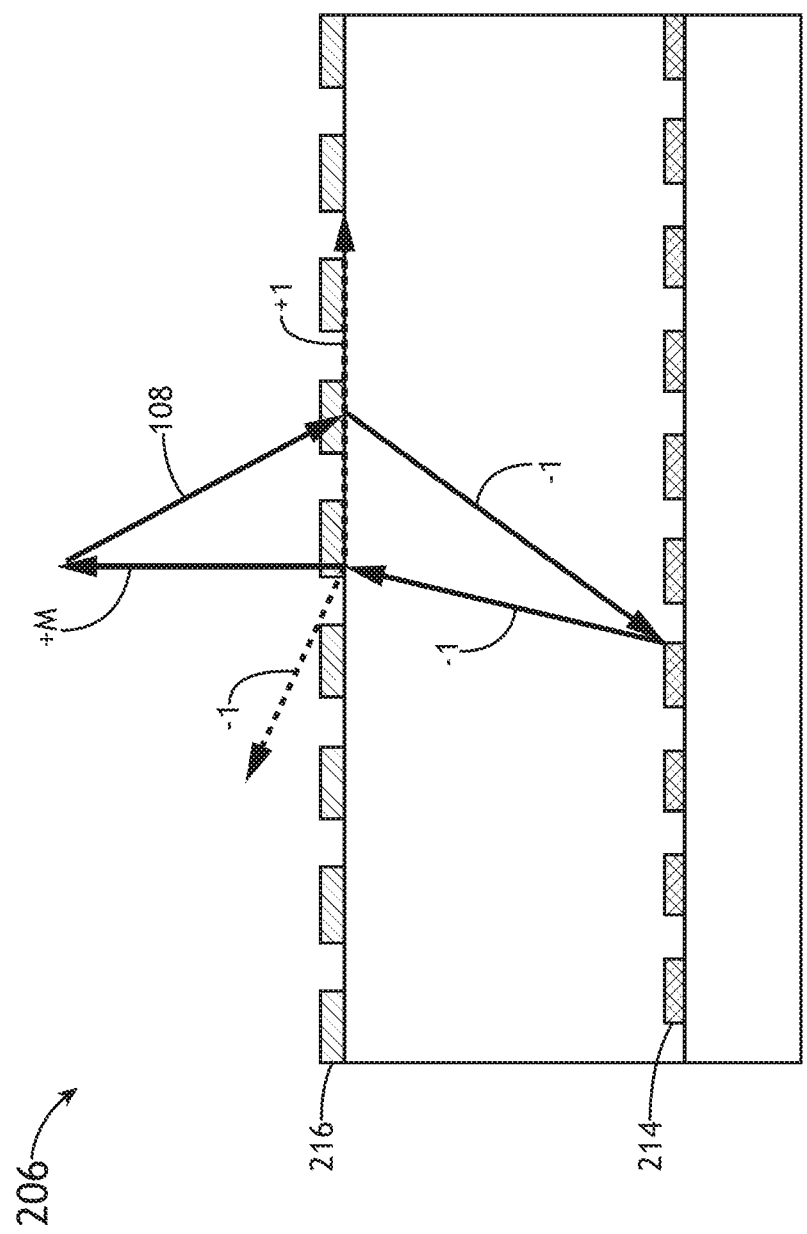
FIG. 4 is a conceptual image illustrating the double scattering Moiré effect, in accordance with one or more embodiments of the present disclosure.

FIG. 4 is a conceptual image illustrating the double scattering Moiré effect between the two sample layers 214 and 216 in the working zone 204 (shown in FIGS. 2A-C). A light beam (e.g., Illumination beam 108) may illuminate the sample layers 214 and 216 such that one Moiré diffraction order (+M) may be collected by a collection system (e.g., detector 104). The light beam may comprise incoherent light. The angle of incidence of the light beam may be configured such that at least one of the diffraction orders (either the 1st or −1st orders when the light diffracts from the top grating or the 1st or −1st orders when the light diffracts from the bottom grating) propagates within the stack of the two sample layers 214 and 216. It is noted that this effect is not limited to the sample layers 214 and 216, and may occur, for example, between the sample layers 218 and 220 of FIG. 2B, between the sample layers 806 and 808 of FIG. 28B, between the sample layers 914 and 916 of FIG. 29B, etc.

FIGS. 5-9B show various configurations for sample illumination (e.g., at the illumination or entrance pupil) and collection (e.g., at the collection or exit pupil) using the double scattering Moiré effect. The sample to be illuminated may be, for example, the sample layers 214 and 216 in the working zone 204. Additional sample layers (e.g., sample layers 218 and 220 in the working zone 208) may be illuminated simultaneously or separately. One measurement direction may be measured at a time (e.g., the X direction), or two measurement directions may be measured (e.g., the X and Y directions). By configuring the pitches of the metrology target, the numerical apertures of the illumination and collection paths, the placement of illumination, and the wavelengths of the sample light, the proper diffraction orders may be collected by the collection path to generate an image for overlay measurement.

Figure 5:
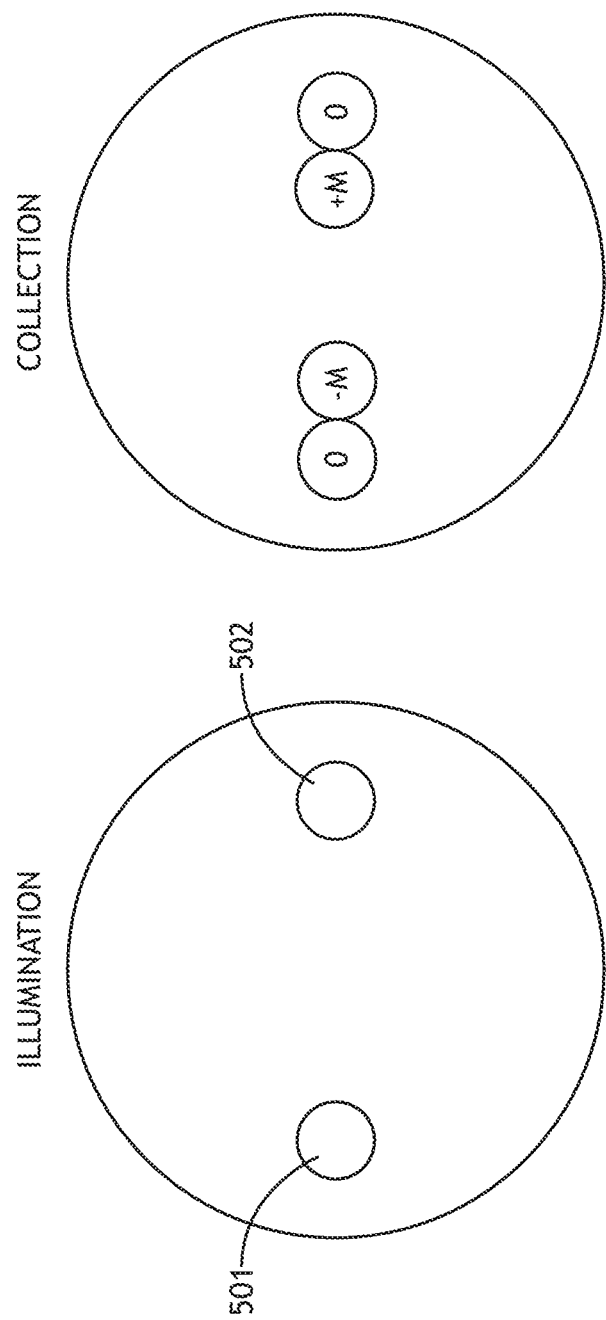
FIG. 5 illustrates a one-step off-center configuration for sample illumination and collection using the double scattering Moiré effect, in accordance with one or more embodiments of the present disclosure.

FIG. 5 shows a one-step off-center configuration for sample illumination and collection using the double scattering Moiré effect. Illumination lobes 501 and 502 may illuminate the sample (e.g., sample layers 214 and 216, and/or sample layers 218 and 220, etc.), and Moiré diffraction orders (+M and −M) and zero order diffraction (0) may be collected by the collection system. In this embodiment, the Moiré diffraction orders and zero order diffraction may be in a Littrow illumination configuration. Littrow illumination is depicted in U.S. Pat. Appl. Publ. No. 2020/0132446 (see, e.g., FIG. 1). In the Littrow illumination configuration, one of the Moiré diffraction orders (e.g., +M) may be diffracted at 180° to the direction of an illumination lobe (e.g., illumination lobe 501), and another of the Moiré diffraction orders (e.g., −M) may be diffracted at 180° to the direction of the other illumination lobe (e.g., illumination lobe 502). Additionally, each of the Moiré diffraction orders may be mirror-symmetrical to the other of the Moiré diffraction orders, and each of the zero diffraction orders may be mirror-symmetrical to the other of the zero diffraction orders. The advantages of the Littrow illumination configuration may include focus independence and increased accuracy. It is noted that the present disclosure is not limited thereto, and other illumination configurations (e.g. asymmetrical arrangements of the diffraction orders) are also possible. If the Littrow illumination configuration is used, then the overlay measurement and the contrast may both be insensitive to the focal position. If the Littrow illumination configuration is not used, then only the contrast may be insensitive to the focal position.

FIG. 6 shows an alternative one-step off-center configuration for sample illumination and collection using the double scattering Moiré effect. Illumination lobes 501 and 502 may illuminate the sample (e.g., sample layers 214 and 216, and/or sample layers 218 and 220, etc.), and Moiré diffraction orders (+M and −M) and zero order diffraction (0) may be collected by the collection system. By moving the position of the illumination lobes 501 and 502, the 1st and −1st diffraction orders of the top and bottom gratings may be blocked from collection while still collecting the Moiré orders (+M and −M) and the zero order diffraction (0), and thus the Moiré target design and measurement modes are widened. Additionally, the same configuration may be used for the X and Y directions simultaneously (e.g., when the X and Y directions have the same design).

Figure 7:
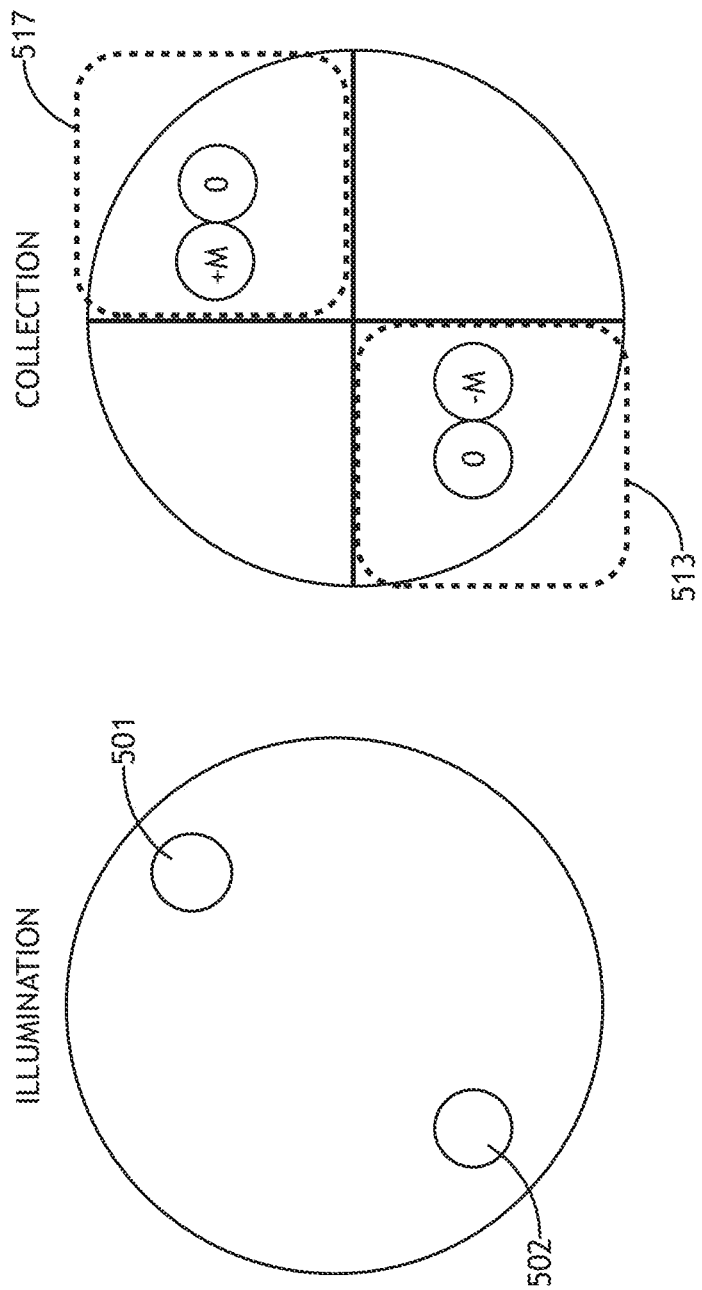
FIG. 7 illustrates a one-step off-center configuration for sample illumination and collection using the double scattering Moiré effect, in accordance with one or more embodiments of the present disclosure.

FIG. 7 shows a one-step off-center configuration for sample illumination and collection using the double scattering Moiré effect. Illumination lobes 501 and 502 may illuminate the sample (e.g., sample layers 214 and 216, and/or sample layers 218 and 220, etc.), and Moiré diffraction orders (+M and −M) and zero order diffraction (0) may be collected by the collection system. In this configuration, the collection may be split into a number of regions (e.g., collection regions 513 and 517) using a prism. Since two beams are used for imaging, asymmetry in the amplitude between 1st and −1st Moiré orders does not imply inaccuracy, and contrast of the measurement may be less sensitive to the focal position (e.g., there is a lower requirement on the focusing system). By using two different images (one from the collection region 513 and another from the collection region 517) for overlay computation, the differences between the images may be used for additional metrics during the measurement, thus enabling accuracy and stability improvement in future measurements.

Figure 8A:
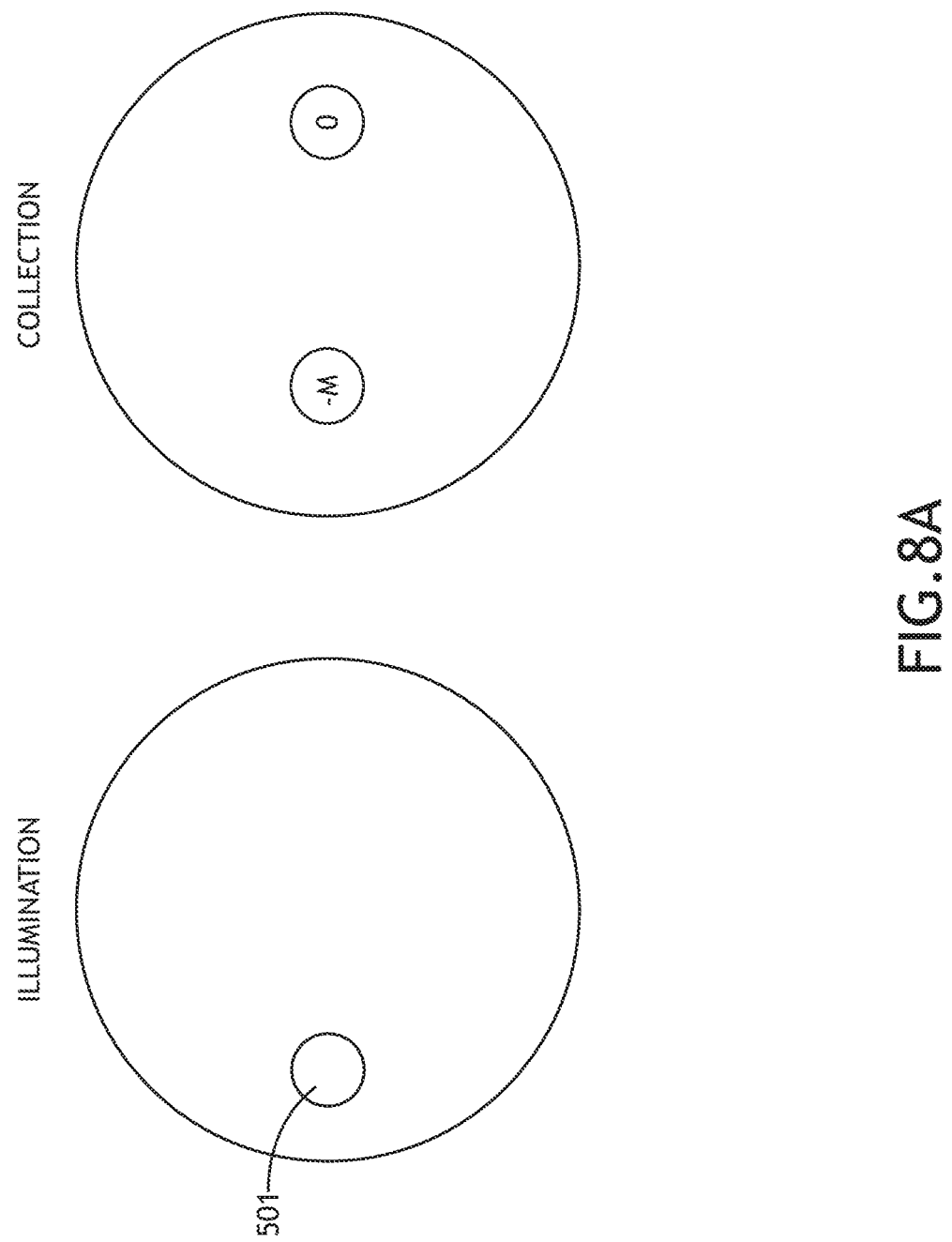
FIGS. 8A-8B illustrate a two-step off-center configuration for sample illumination and collection using the double scattering Moiré effect, in accordance with one or more embodiments of the present disclosure.
Figure 8B:
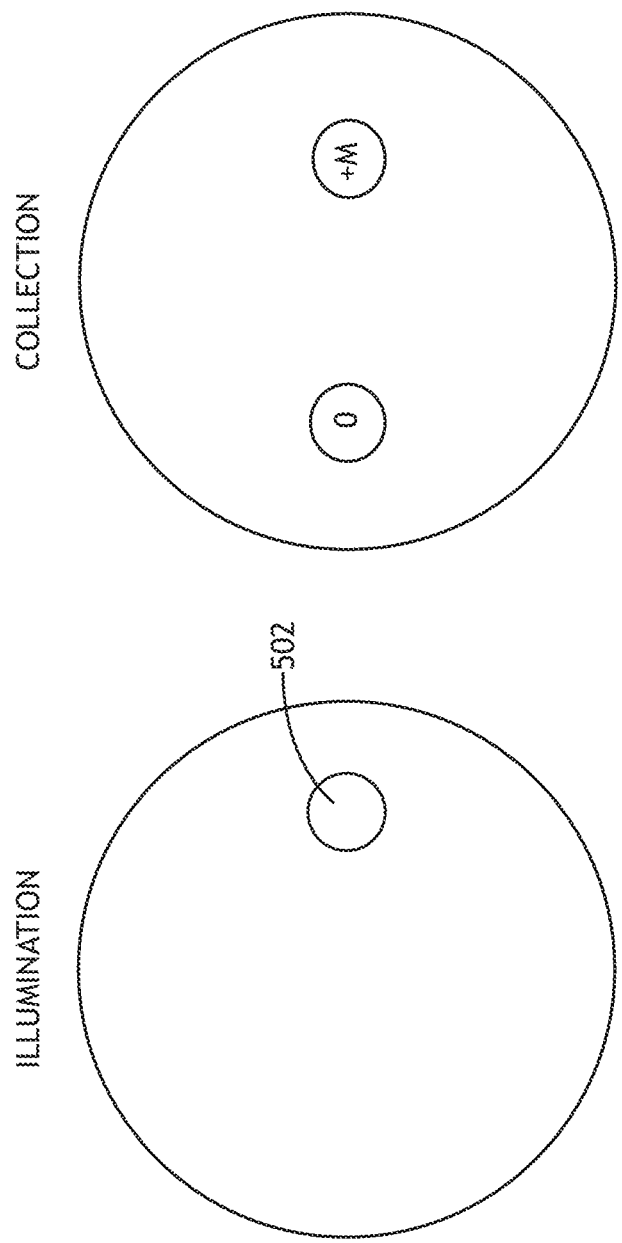

FIGS. 8A-B show a two-step off-center configuration for sample illumination and collection using the double scattering Moiré effect. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 8A, an illumination lobe 501 may illuminate the sample, and Moiré diffraction orders (−M) and zero order diffraction (0) may be collected by the collection system. In FIG. 8B an illumination lobe 502 may illuminate the sample, and Moiré diffraction orders (+M) and zero order diffraction (0) may be collected by the collection system. Since two beams are used for imaging, asymmetry in the amplitude between 1st and −1st orders does not imply inaccuracy, and overlay measurement may be less sensitive to the focal position (e.g., there is a lower requirement on the focusing system). In this embodiment, the Moiré diffraction orders and zero order diffraction may be in a Littrow illumination configuration. Littrow illumination is depicted in U.S. Pat. Appl. Publ. No. 2020/0132446

(see, e.g., FIG. 1). In the Littrow illumination configuration, one of the Moiré diffraction orders (e.g., +M) may be diffracted at 180° to the direction of an illumination lobe (e.g., illumination lobe 501), and another of the Moiré diffraction orders (e.g., −M) may be diffracted at 180° to the direction of the other illumination lobe (e.g., illumination lobe 502). Additionally, each of the Moiré diffraction orders may be mirror-symmetrical to the other of the Moiré diffraction orders, and each of the zero diffraction orders may be mirror-symmetrical to the other of the zero diffraction orders. The advantages of the Littrow illumination configuration may include focus independence and increased accuracy. If the Littrow illumination configuration is used, then the overlay measurement and the contrast may both be insensitive to the focal position. If the Littrow illumination configuration is not used, then only the contrast may be insensitive to the focal position.

Additionally, compared to the configuration described with respect to FIG. 7, the configuration of FIGS. 8A-B may be configured to use a smaller Moiré pitch. For example, when the numerical aperture of the objective is 0.7, the numerical aperture of the illumination is 0.2, and the wavelength is 500 nm, the pitch is (wavelength)/(NA distance) =500/1=500 nm. This pitch may enable smaller metrology targets (e.g., about 5-6 pitches may be needed for algorithms to work robustly, so a valid target size may be about 6 microns by 6 microns for a two directional metrology target). In some embodiments, a valid target size may be of from 5-50 microns by of from 5-50 microns (for example, 20 microns by 20 microns, 25 microns by 25 microns, etc.).

Figure 9A:
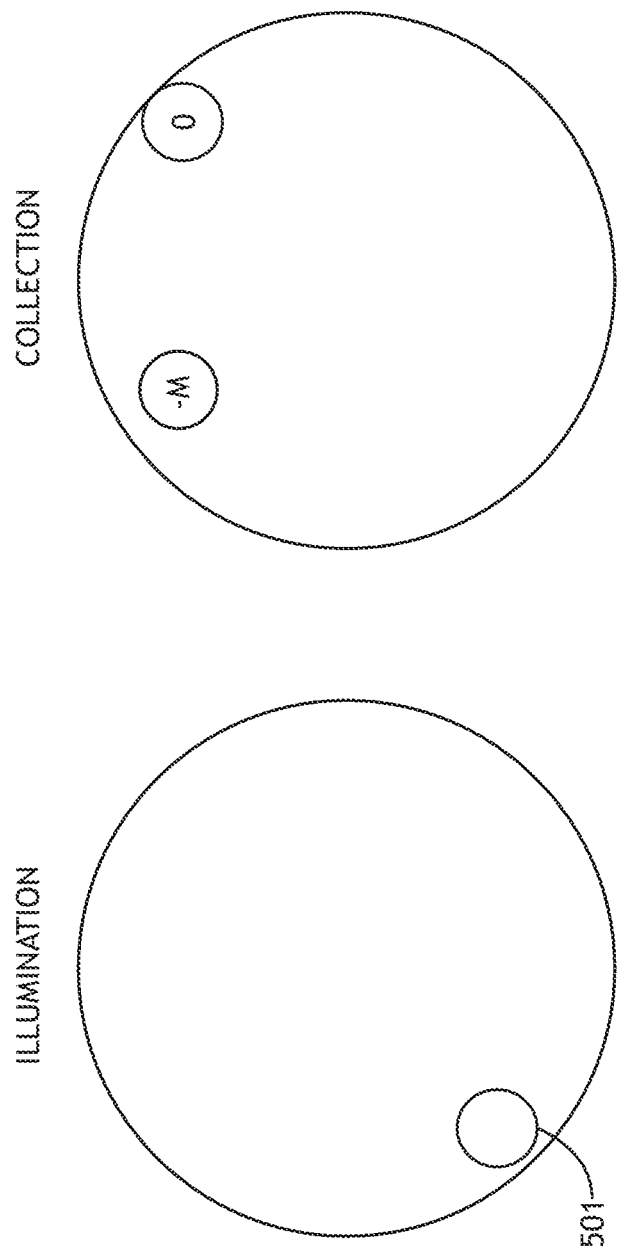
FIGS. 9A-9B illustrate a two-step off-center configuration for sample illumination and collection using the double scattering Moiré effect, in accordance with one or more embodiments of the present disclosure.
Figure 9B:
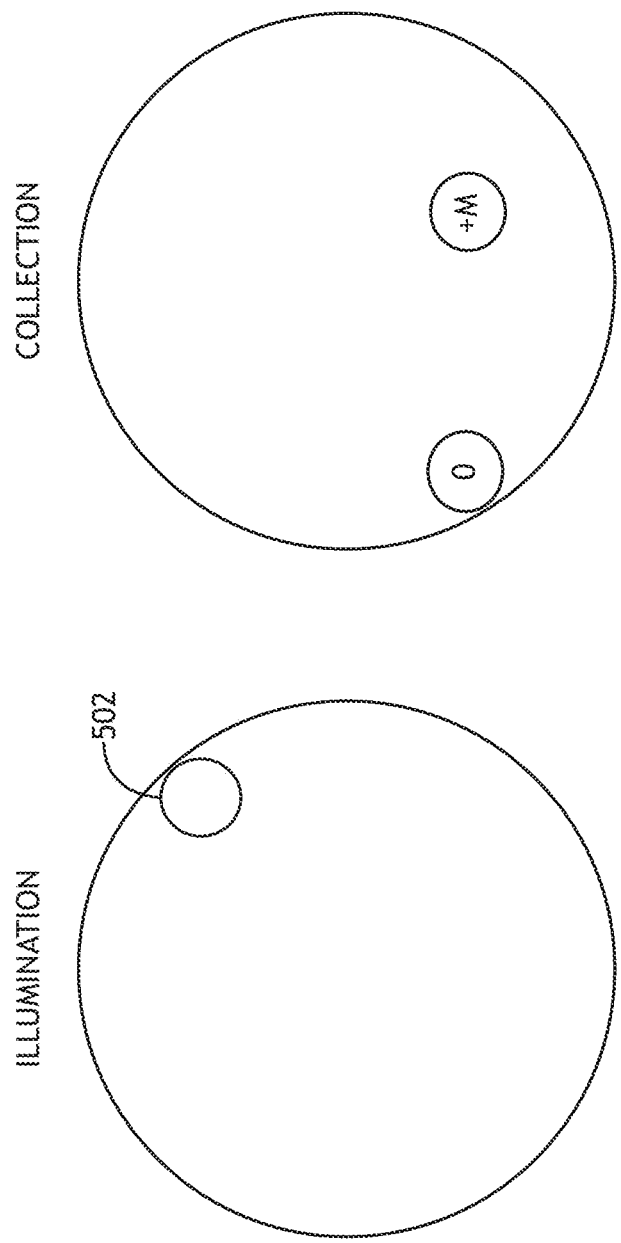

FIGS. 9A-B show an alternative two-step off-center configuration for sample illumination and collection using the double scattering Moiré effect. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 9A, an illumination lobe 501 may illuminate the sample, and Moiré diffraction orders (−M) and zero order diffraction (0) may be collected by the collection system. In FIG. 9B an illumination lobe 502 may illuminate the sample, and Moiré diffraction orders (+M) and zero order diffraction (0) may be collected by the collection system. By moving the position of the illumination lobes 501 and 502, the 1st and −1st diffraction orders of the top and bottom gratings may be blocked from collection while still collecting the Moiré orders (+M and −M) and the zero order diffraction (0), and thus the Moiré target design and measurement modes are widened. Additionally, the same configuration may be used for the X and Y directions simultaneously (e.g., when the X and Y directions have the same design). Since two beams are used for imaging, asymmetry in the amplitude between 1st and −1st orders does not imply inaccuracy, and the contrast of the images may be less sensitive to the focal position (e.g., there is a lower requirement on the focusing system).

Figure 17A:
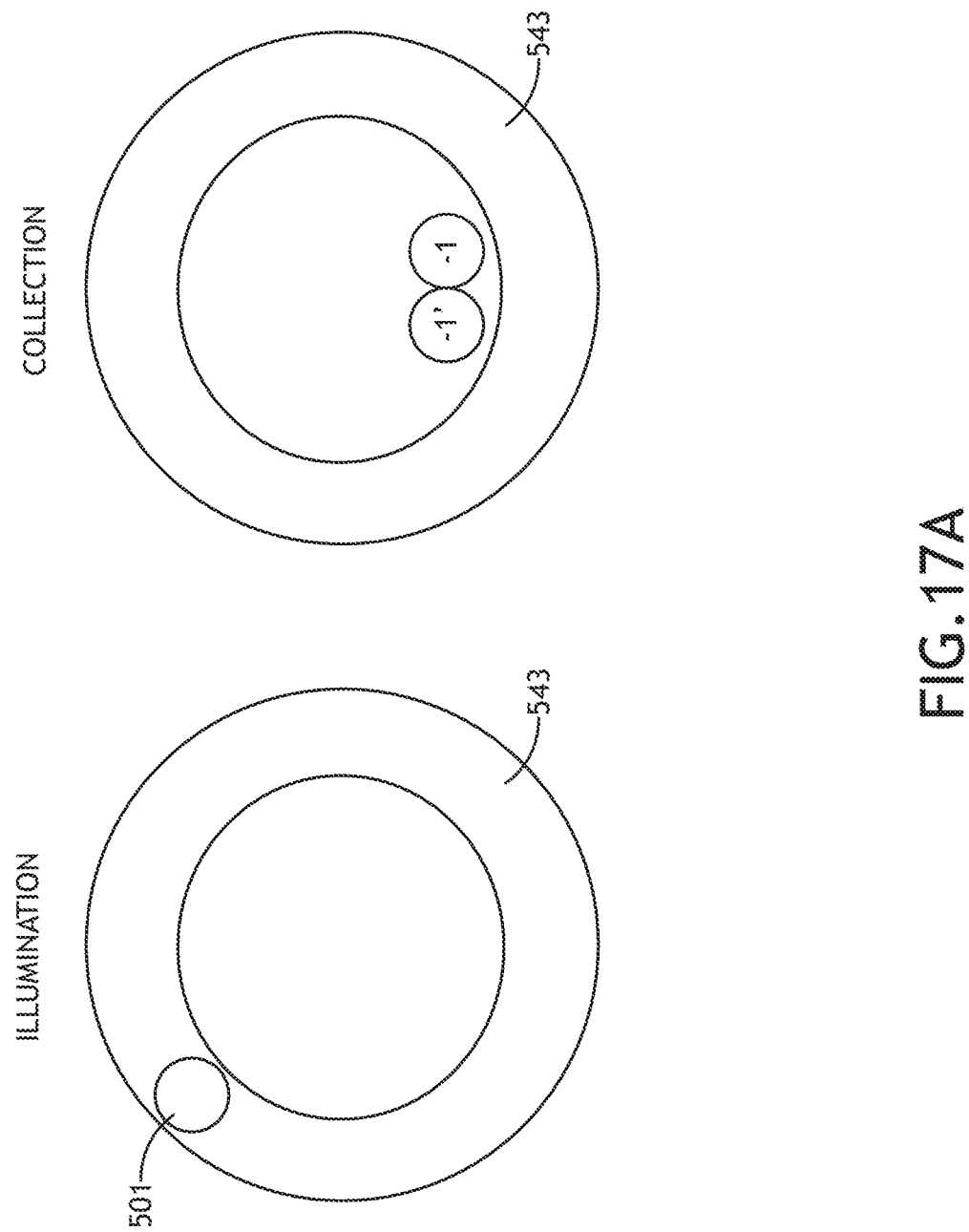
FIGS. 17A-17B illustrate a two-step off-center configuration for sample illumination and collection using the single scattering optical Moiré effect, in accordance with one or more embodiments of the present disclosure.

In some embodiments, the present disclosure may be directed to the one-step centric configuration for sample illumination and collection shown in FIG. 17A of U.S. Pat. No. 7,528,941 (incorporated by reference herein in its entirety). As shown in FIG. 17A, a spatial modulation device 543 (e.g., blocker 543) may block zero-order diffraction 404b from being collected, while allowing diffraction orders 404a and 404c (e.g., +M and −M Moiré diffraction orders) to be collected. In these embodiments, signal DC is minimized (e.g., DC is of the same magnitude as the collected non-zero harmonics). Since two beams are used for imaging, asymmetry in the amplitude between 1st and −1st orders does not imply inaccuracy, and moreover contrast and overlay measurement may be less dependent on the focus (overlay focus independence requires the target sample layers to be of a PQQP type). Since the +M and −M Moiré diffraction orders have a similar optical path, there is a high sensitivity to focal position, and tool induced shifts are minimal.

Figure 10:
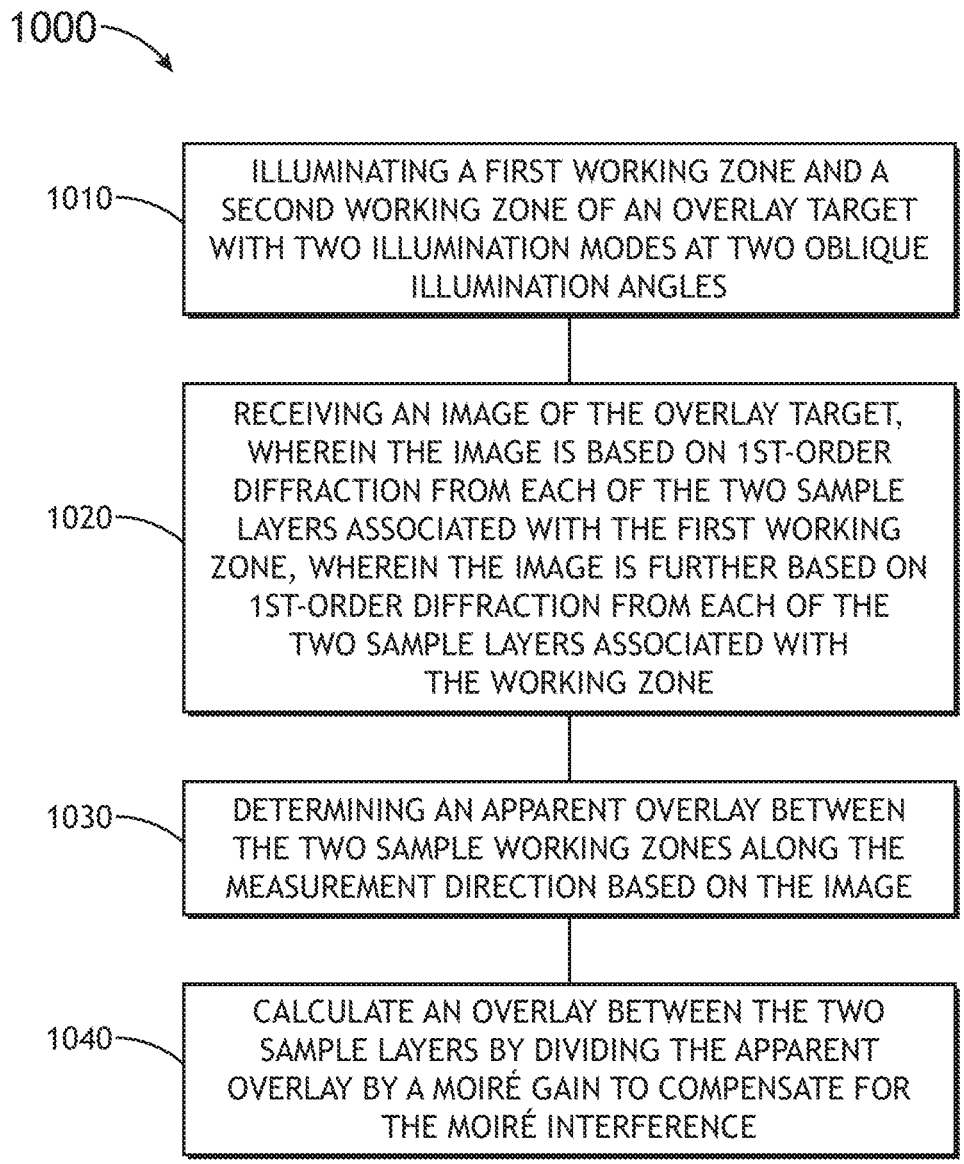
FIG. 10 is a flow diagram illustrating a method for calculating overlay using a single scattering optical Moiré effect, in accordance with one or more embodiments of the present disclosure.

FIG. 10 is a flow diagram illustrating a method 1000 for measuring overlay using a single scattering optical Moiré effect, in accordance with one or more embodiments of the present disclosure. For example, the method 1000 may be applied to measure overlay based on an overlay target such as, but not limited to, the metrology targets illustrated in FIGS. 2A-2C and 24A-29B and their associated working zones (e.g., metrology target 202 and working zones 204 and 208). Applicant notes that the embodiments and enabling technologies described previously herein in the context of the metrology system 100 should be interpreted to extend to the method 1000. It is further noted, however, that the method 1000 is not limited to the architecture of the metrology system 100. Further, the method 1000 may be applied to measure overlay along one or more measurement directions.

In one embodiment, the method 1000 includes a step 1010 of illuminating an overlay target (e.g., metrology target 202) on a sample with two illumination lobes at two oblique illumination angles. The overlay target may include at least a first working zone and a second working zone for overlay measurements along a measurement direction (e.g., working zones 204 and 208). The first working zone may include a Moiré pattern (e.g. Moiré pattern 206) formed from overlapping periodic structures along a measurement direction on two sample layers (e.g., grating structures 214 and 216), where periods of the periodic structures on the two sample layers are different.

In another embodiment, the method 1000 includes a step 1020 of receiving an image based on the illumination. The image may be based on 1st-order diffraction from each of the two sample layers associated with the first working zone (e.g., working zone 204), and may be based on 1st-order diffraction from each of the two sample layers associated with the second working zone (e.g., working zone 208). An apparent period of the first working zone in the image may be based on Moiré interference In another embodiment, the method 1000 includes a step 1030 of determining an apparent overlay between the first working zone and the second working zone along the measurement direction based on the image. This determination may be done, for example, by methods 2300 and 2312 as described with respect to FIGS. 23A and 23B (e.g., finding the difference between centers of symmetry), however the step 1030 is not limited thereto, and any method of computing the misregistration between two working zones may be used. It is noted that the apparent overlay is not equal to the physical overlay error between the two sample layers. Rather, the apparent overlay corresponds to relative shifts of the Moiré fringes between the first and second working zones. Accordingly, the physical overlay error between the two sample layers along a measurement direction may be determined by dividing the difference between the axes of symmetry orthogonal to the measurement direction by a Moiré gain.

In another embodiment, the method 1000 includes a step 1040 of calculating an overlay between the two sample layers by dividing the apparent overlay by a Moiré gain to compensate for the Moiré interference. This calculation may be done, for example, by step 2322 of the method 2300 as described with respect to FIG. 23A, however the step 1040 is not limited thereto.

Figure 11:
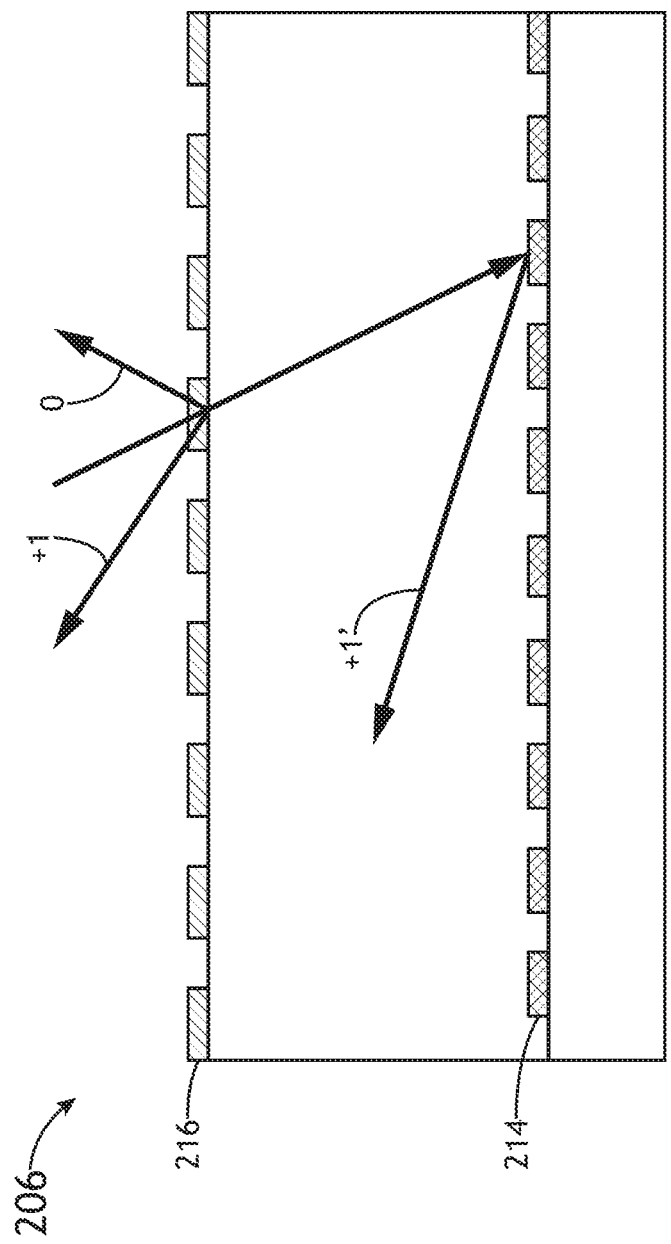
FIG. 11 is a conceptual image illustrating the single scattering optical Moiré effect, in accordance with one or more embodiments of the present disclosure.

FIG. 11 is a conceptual image illustrating the single scattering optical Moiré effect between the two sample layers 214 and 216 in the working zone 204 (shown in FIGS. 2A-C). A light beam (e.g., sample light 120) may illuminate the sample layers 214 and 216 such that 1st-order diffraction (e.g., +1 and +1') may be collected by a collection system (e.g., detector 104) from each of the sample layers 214 and 216. The light beam may comprise incoherent light. It is noted that this effect is not limited to the sample layers 214 and 216, and may occur, for example, between the sample layers 218 and 220 of FIG. 2B, between the sample layers 806 and 808 of FIG. 28B, between the sample layers 914 and 916 of FIG. 29B, etc. By using the single scattering optical Moiré effect, less light may be required and metrology target design and measurement mode selection may be more straightforward.

FIGS. 12-22 show various configurations for sample illumination (e.g., at the illumination or entrance pupil) and collection (e.g., at the collection or exit pupil) using the single scattering optical Moiré effect. The sample to be illuminated may be, for example, the sample layers 214 and 216 in the working zone 204. Additional sample layers (e.g., sample layers 218 and 220 in the working zone 208) may be illuminated simultaneously or separately. One measurement direction may be measured at a time (e.g., the X direction), or two measurement directions may be measured (e.g., the X and Y directions). By configuring the pitches of the metrology target, the numerical apertures of the illumination and collection paths, the placement of illumination, and the wavelengths of the sample light, the proper diffraction orders may be collected by the collection path to generate an image for overlay measurement.

Figure 12:
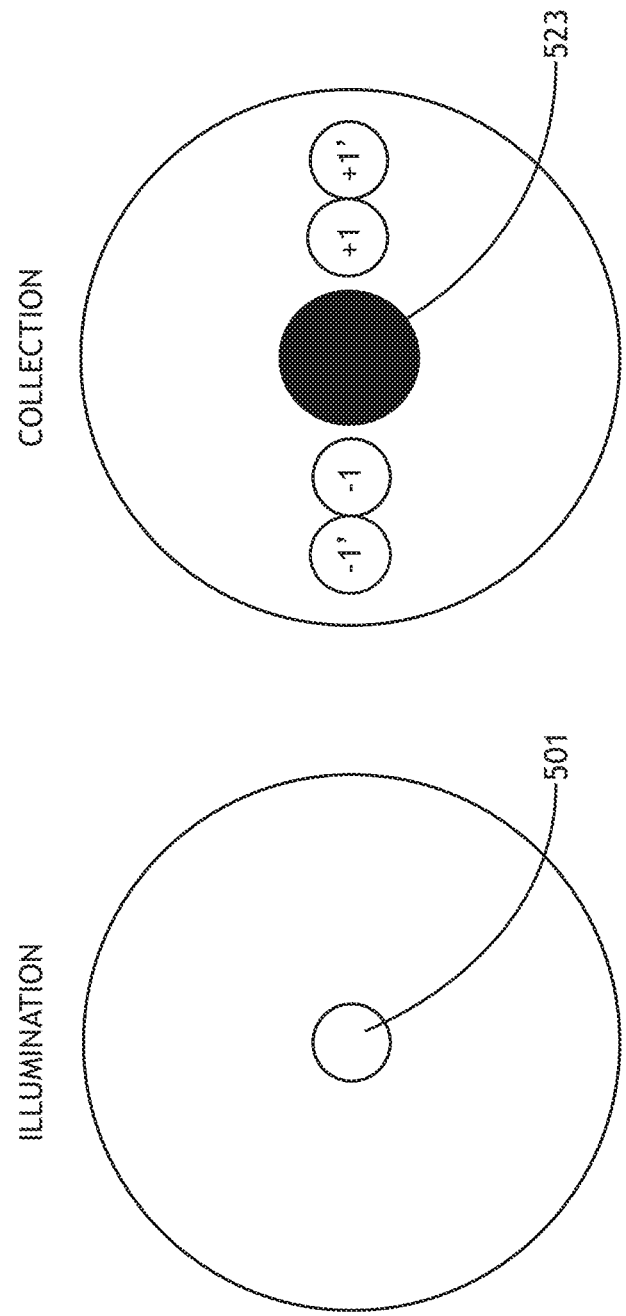
FIG. 12 illustrates a one-step centric configuration for sample illumination and collection using the single scattering optical Moiré effect, in accordance with one or more embodiments of the present disclosure.

FIG. 12 shows a one-step centric configuration for sample illumination and collection using the single scattering optical Moiré effect including a blocker 523. The blocker 523 may block zero order diffraction and possibly Moiré diffraction orders. An illumination lobe 501 may illuminate the sample (e.g., sample layers 214 and 216, and/or sample layers 218 and 220, etc.), and 1st order diffraction (+1, +1', −1, −1') may be collected by the collection system. The illumination lobe 501 may illuminate the sample at an angle of about 90° with respect to the sample, and may impinge the sample at or near a central portion of a first working zone or a second working zone (e.g., working zones 204 or 208). In this embodiment, signal DC is minimized (e.g., DC is of the same magnitude as the collected non-zero harmonics). The image generated by this configuration may include Moiré pitch harmonics and at least three additional harmonics of a much smaller pitch. Thus, when the image is generated, non-Moiré harmonics may be removed algorithmically (e.g., using any analog of a Fourier low-path filter).

Figure 13A:
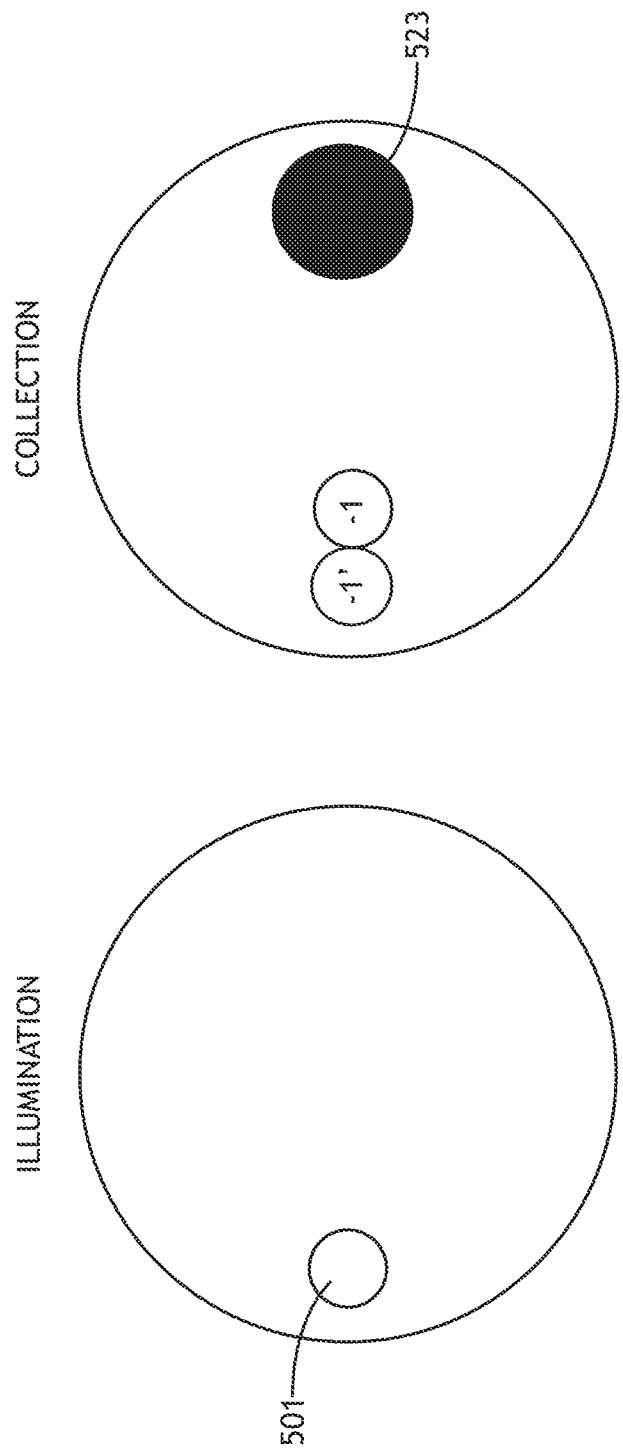
FIGS. 13A-13B illustrate a two-step off-center configuration for sample illumination and collection using the single scattering optical Moiré effect, in accordance with one or more embodiments of the present disclosure.
Figure 13B:
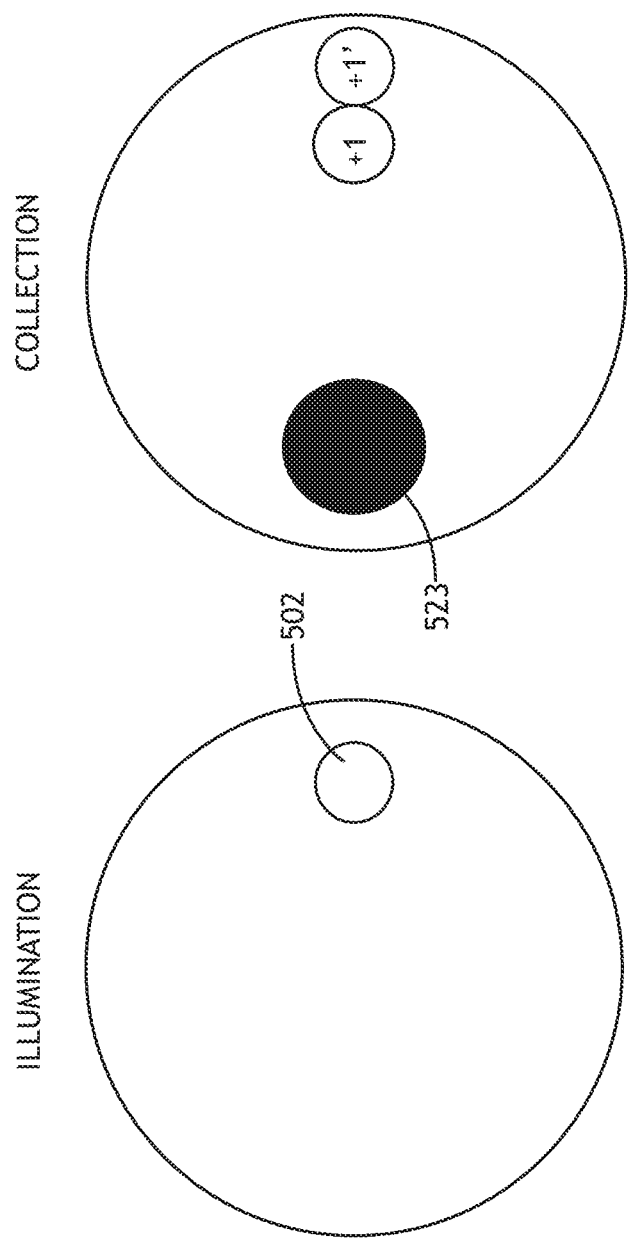

FIGS. 13A-13B show a two-step off-center configuration for sample illumination and collection using the single scattering optical Moiré effect including a blocker 523. The blocker 523 may block zero order diffraction and possibly Moiré diffraction orders. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 13A, an illumination lobe 501 may illuminate the sample, and first order diffraction (−1 and −1') may be collected by the collection system. In FIG. 13B an illumination lobe 502 may illuminate the sample, and first order diffraction (+1 and +1') may be collected by the collection system. In this embodiment, signal DC is minimized (e.g., DC is of the same magnitude as the collected non-zero harmonics). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

Figure 14A:
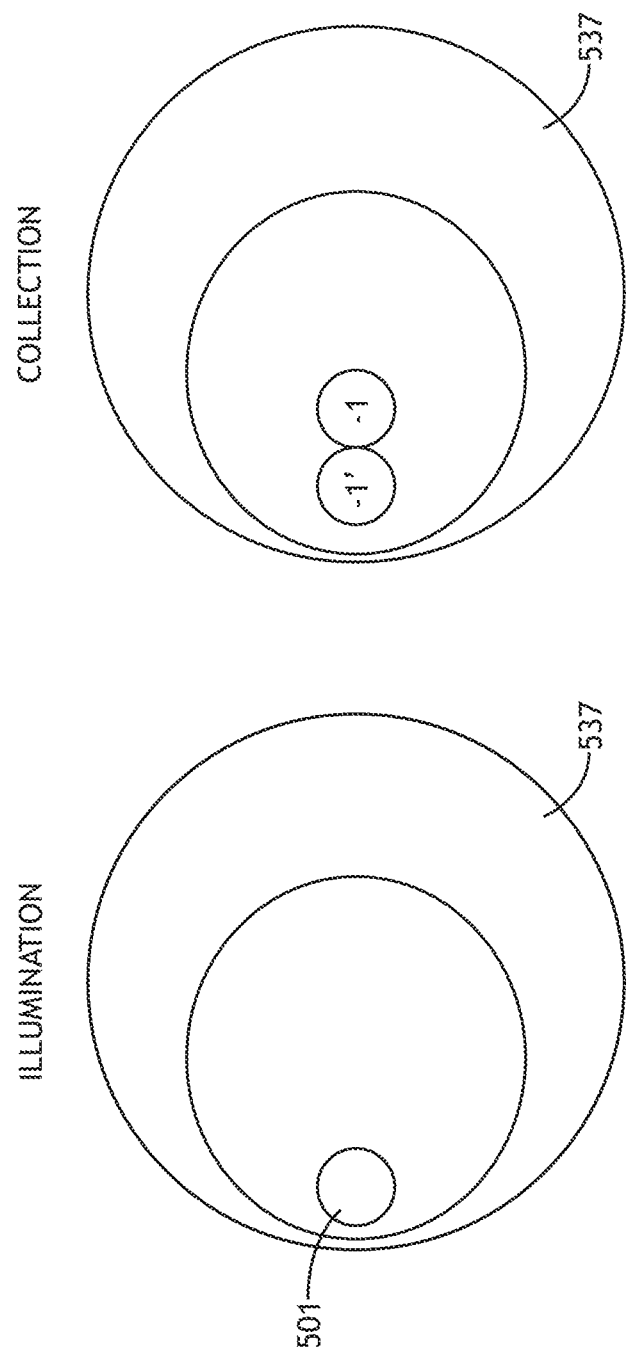
FIGS. 14A-14B illustrate a two-step off-center configuration for sample illumination and collection using the single scattering optical Moiré effect, in accordance with one or more embodiments of the present disclosure.
Figure 14B:
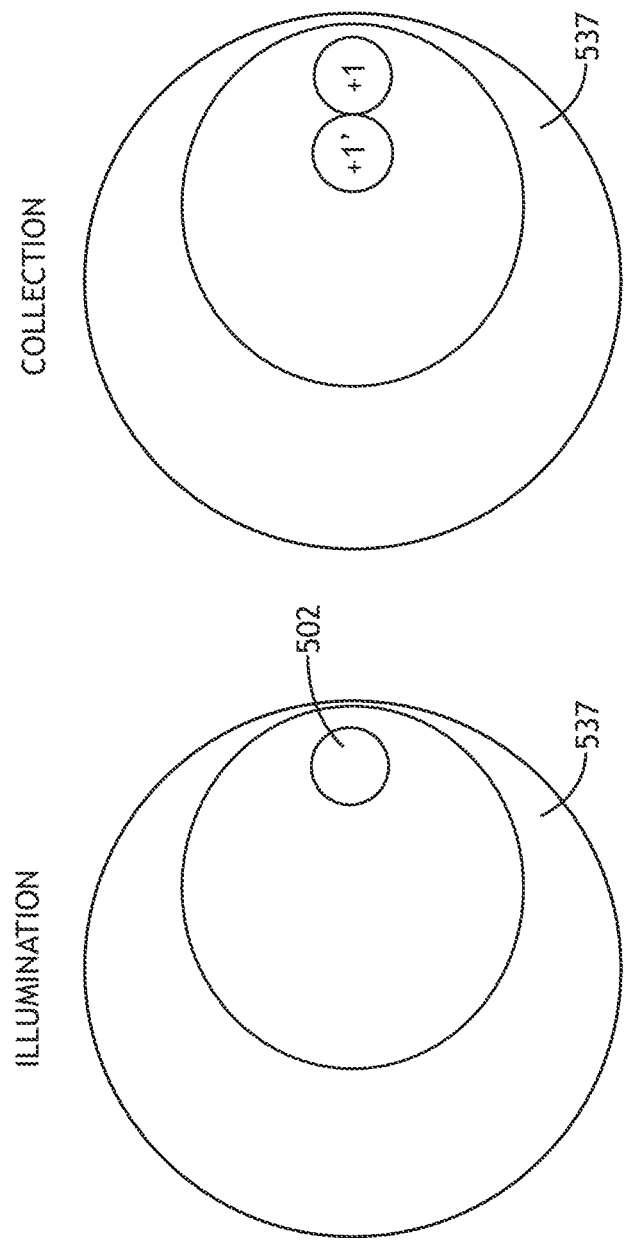

FIGS. 14A-14B show an alternative two-step off-center configuration for sample illumination and collection using the single scattering optical Moiré effect including an objective 537 having a non-centered working area. The objective 537 having a non-centered working area may block zero order diffraction and possibly Moiré diffraction orders. This configuration is simple as it does not require any access for the collection pupil. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 14A, an illumination lobe 501 may illuminate the sample, and first order diffraction (−1 and −1') may be collected by the collection system. In FIG. 14B an illumination lobe 502 may illuminate the sample, and first order diffraction (+1 and +1') may be collected by the collection system. In this embodiment, signal DC is minimized (e.g., DC is of the same magnitude as the collected non-zero harmonics). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

Figure 15A:
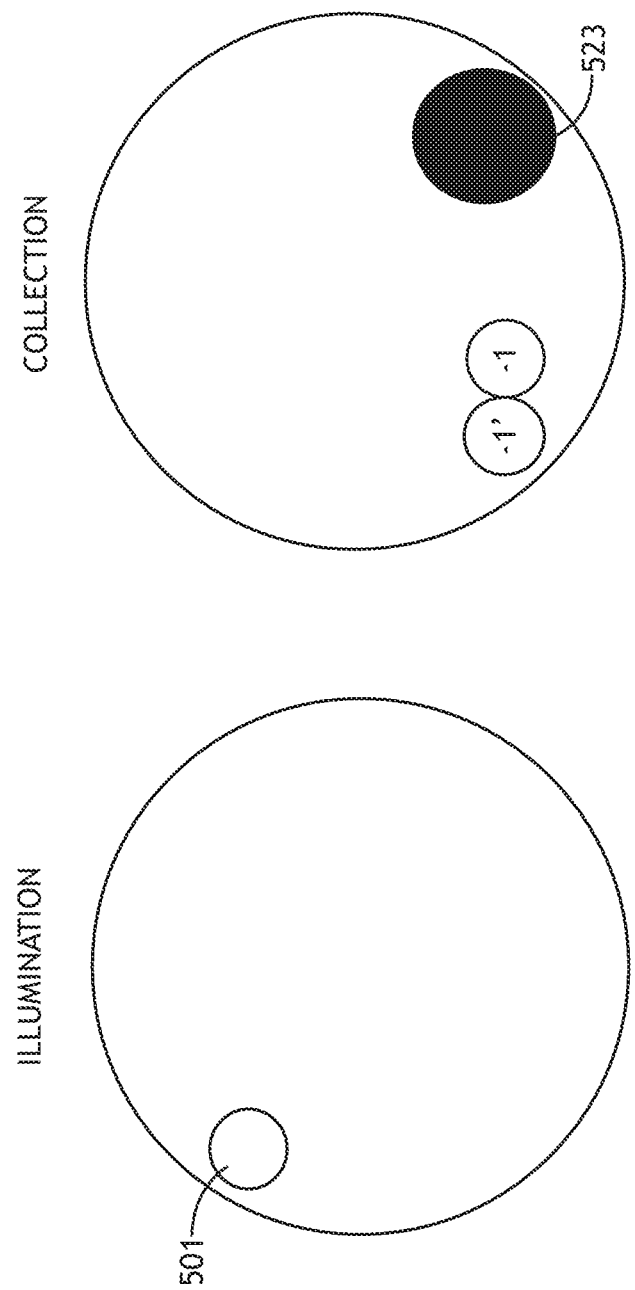
FIGS. 15A-15B illustrate a two-step off-center configuration for sample illumination and collection using the single scattering optical Moiré effect, in accordance with one or more embodiments of the present disclosure.
Figure 15B:
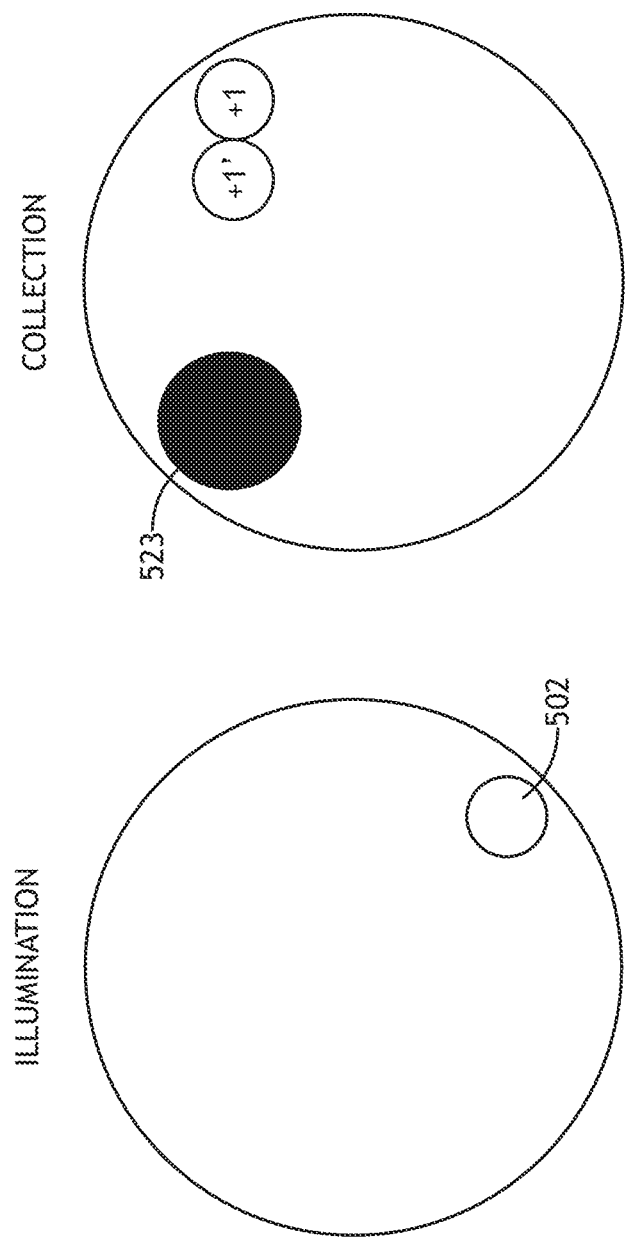

FIGS. 15A-15B show an alternative two-step off-center configuration for sample illumination and collection using the single scattering optical Moiré effect including a blocker 523. The blocker 523 may block zero order diffraction and possibly Moiré diffraction orders. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 15A, an illumination lobe 501 may illuminate the sample, and first order diffraction (−1 and −1') may be collected by the collection system. In FIG. 15B an illumination lobe 502 may illuminate the sample, and first order diffraction (+1 and +1') may be collected by the collection system. In this embodiment, signal DC is minimized (e.g., DC is of the same magnitude as the collected non-zero harmonics). Using this configuration, the Moiré target design and measurement modes are widened and the same configuration may be used for the X and Y directions simultaneously (e.g., when the X and Y directions have the same design). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

Figure 16A:
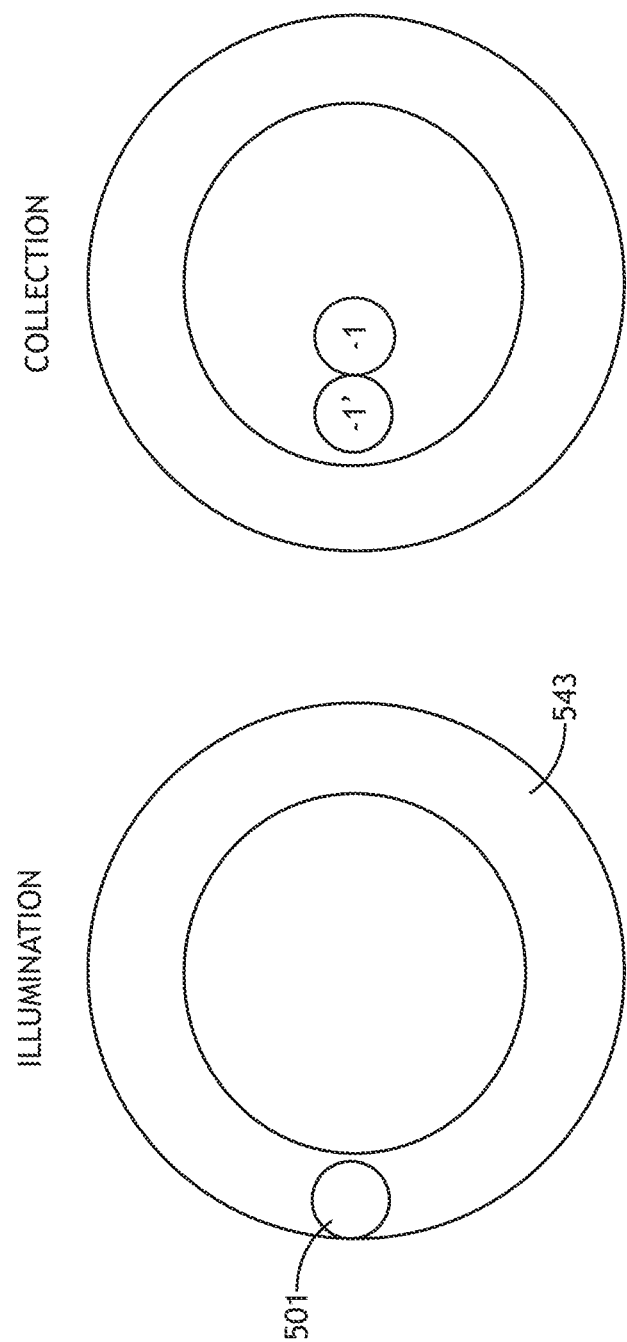
FIGS. 16A-16B illustrate a two-step off-center configuration for sample illumination and collection using the single scattering optical Moiré effect, in accordance with one or more embodiments of the present disclosure.
Figure 16B:
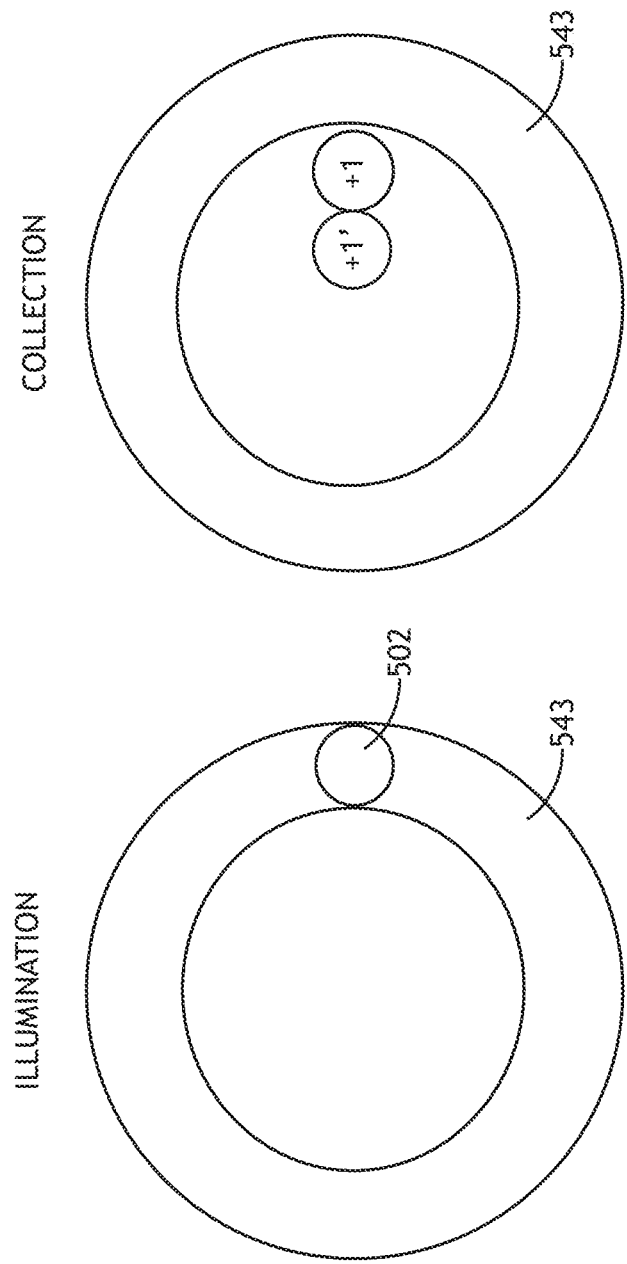

FIGS. 16A-16B show an alternative two-step off-center configuration for sample illumination and collection using the single scattering optical Moiré effect including an objective 543. By illuminating outside of the objective 543, zero order diffraction and possibly Moiré diffraction orders may be blocked. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 16A, an illumination lobe 501 may illuminate the sample, and first order diffraction (−1 and −1') may be collected by the collection system. In FIG. 16B an illumination lobe 502 may illuminate the sample, and first order diffraction (+1 and +1') may be collected by the collection system. In this embodiment, signal DC is minimized (e.g., DC is of the same magnitude as the collected non-zero harmonics). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

Figure 17B:
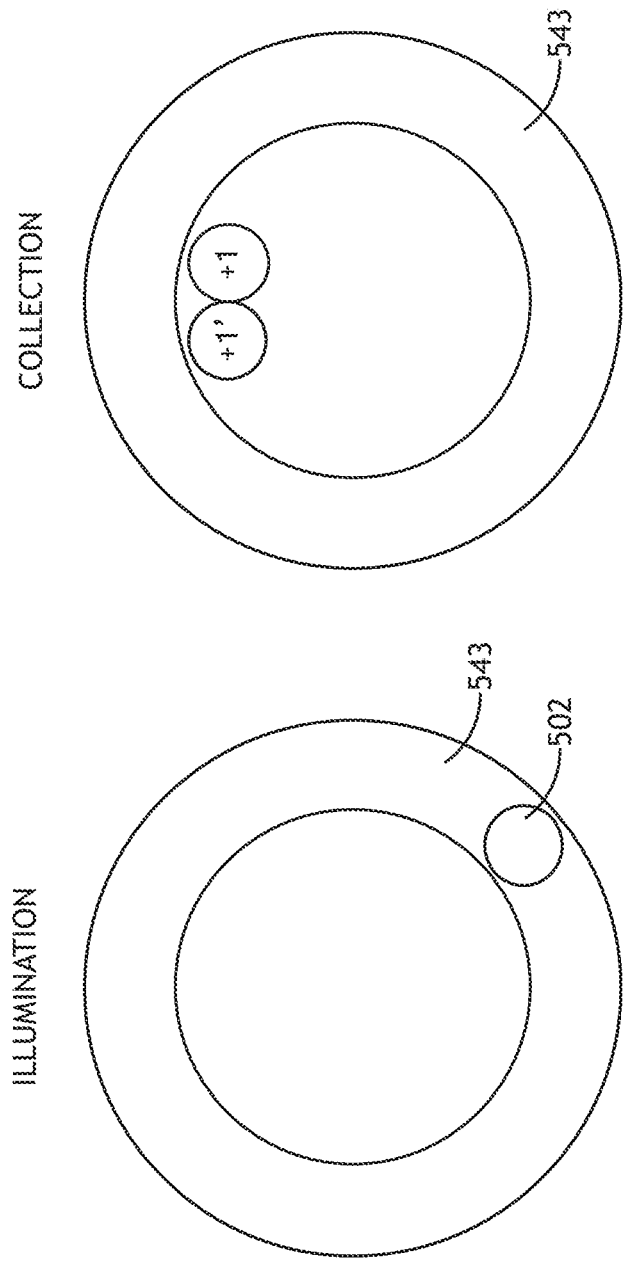

FIGS. 17A-17B show an alternative two-step off-center configuration for sample illumination and collection using the single scattering optical Moiré effect including an objective 543. By illuminating outside of the objective 543, zero order diffraction and possibly Moiré diffraction orders may be blocked. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 17A, an illumination lobe 501 may illuminate the sample, and first order diffraction (−1 and −1') may be collected by the collection system. In FIG. 17B an illumination lobe 502 may illuminate the sample, and first order diffraction (+1 and +1') may be collected by the collection system. In this embodiment, signal DC is minimized (e.g., DC is of the same magnitude as the collected non-zero harmonics). Using this configuration, the Moiré target design and measurement modes are widened and the same configuration may be used for the X and Y directions simultaneously (e.g., when the X and Y directions have the same design). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

FIGS. 18A-18B show an alternative two-step off-center configuration for sample illumination and collection using the single scattering optical Moiré effect including an objective 557 at the illumination pupil having a specially designed working area. The objective 557 having a specially designed working area may block zero order diffraction and possibly Moiré diffraction orders. This configuration is simple as it does not require any access for the collection pupil. In this embodiment, the sample (e.g., sample layers 214 and 216, and/or sample layers 218 and 220, etc.) may be illuminated sequentially (first by an illumination lobe 501, and then by an illumination lobe 502 afterwards). In FIG. 18A, an illumination lobe 501 may illuminate the sample, and first order diffraction (−1 and −1') may be collected by the collection system. In FIG. 18B an illumination lobe 502 may illuminate the sample, and first order diffraction (+1 and +1') may be collected by the collection system. In this embodiment, signal DC is minimized (e.g., DC is of the same magnitude as the collected non-zero harmonics). Using this configuration, the Moiré target design and measurement modes are widened and the same configuration may be used for the X and Y directions simultaneously (e.g., when the X and Y directions have the same design). Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type).

Figure 19:
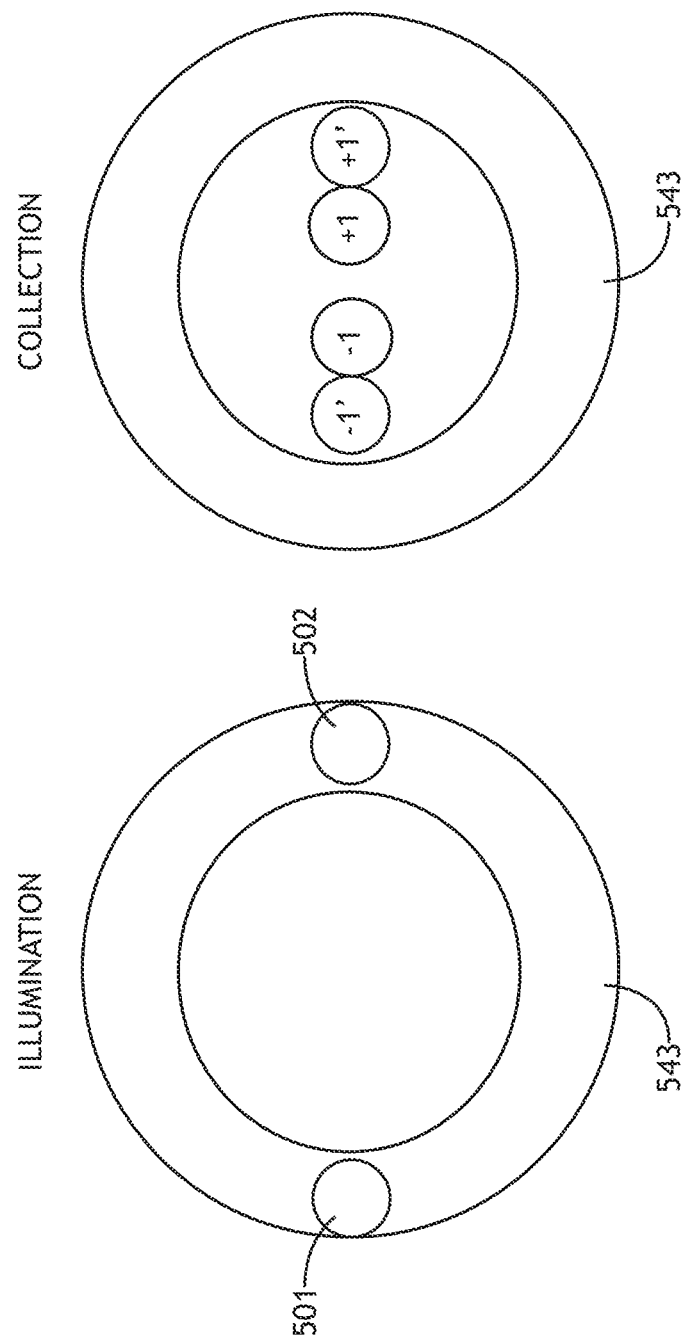
FIG. 19 illustrates a one-step off-center configuration for sample illumination and collection using the single scattering optical Moiré effect, in accordance with one or more embodiments of the present disclosure.

FIG. 19 shows a one-step off-center configuration for sample illumination and collection using the single scattering optical Moiré effect including an objective 543. By illuminating outside of the objective 543, zero order diffraction and possibly Moiré diffraction orders may be blocked. This configuration is simple as it does not require any access for the collection pupil. In this embodiment, illumination lobes 501 and 502 may illuminate the sample (e.g., sample layers 214 and 216, and/or sample layers 218 and 220, etc.), and first order diffraction (+1, +1', −1, −1') may be collected by the collection system. In this embodiment, signal DC is minimized (e.g., DC is of the same magnitude as the collected non-zero harmonics). The image generated by this configuration may include Moiré pitch harmonics and additional harmonics of a different pitch. Thus, when the image is generated, non-Moiré harmonics may be removed algorithmically (e.g., using any analog of a Fourier low-path filter).

Figure 20:
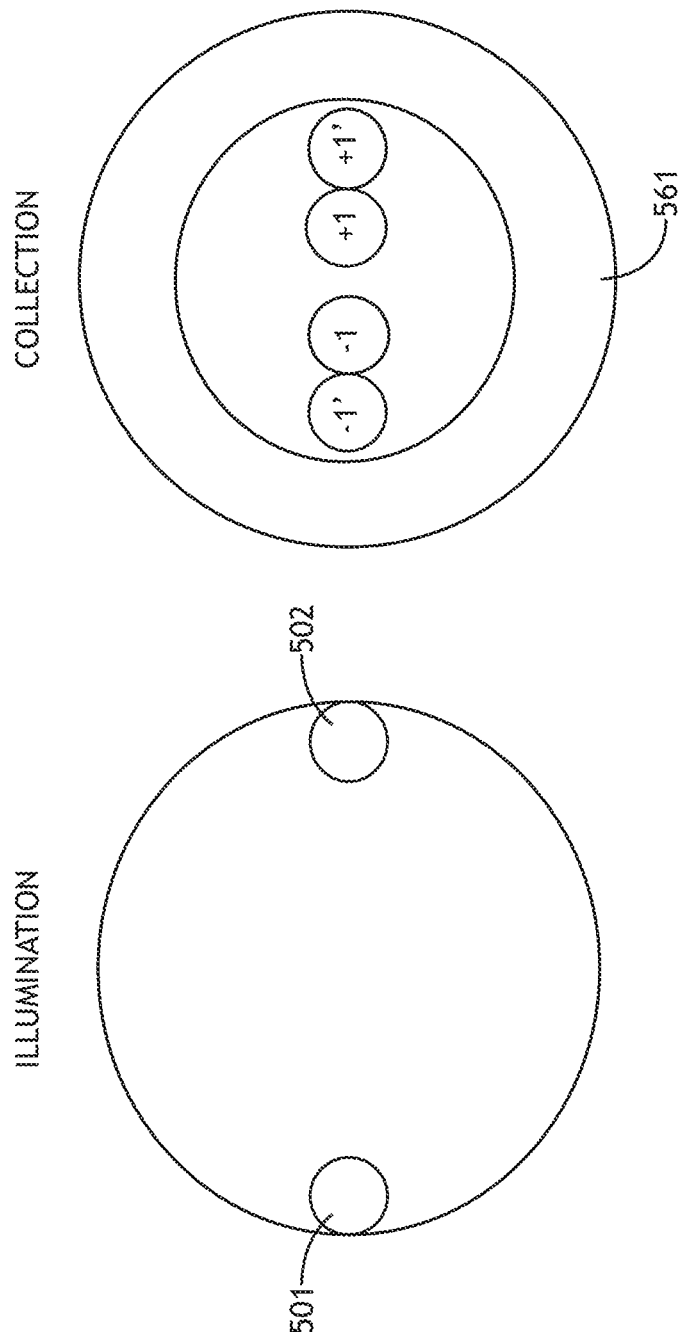
FIG. 20 illustrates a one-step off-center configuration for sample illumination and collection using the single scattering optical Moiré effect, in accordance with one or more embodiments of the present disclosure.

FIG. 20 shows a one-step off-center configuration for sample illumination and collection using the single scattering optical Moiré effect including a blocker 561. The blocker 561 may block zero order diffraction and possibly Moiré diffraction orders. In this embodiment, illumination lobes 501 and 502 may illuminate the sample (e.g., sample layers 214 and 216, and/or sample layers 218 and 220, etc.), and first order diffraction (+1, +1', −1, −1') may be collected by the collection system. In this embodiment, signal DC is minimized (e.g., DC is of the same magnitude as the collected non-zero harmonics). The image generated by this configuration may include Moiré pitch harmonics and additional harmonics of a different pitch. Thus, when the image is generated, non-Moiré harmonics may be removed algorithmically (e.g., using any analog of a Fourier low-path filter).

Figure 21:
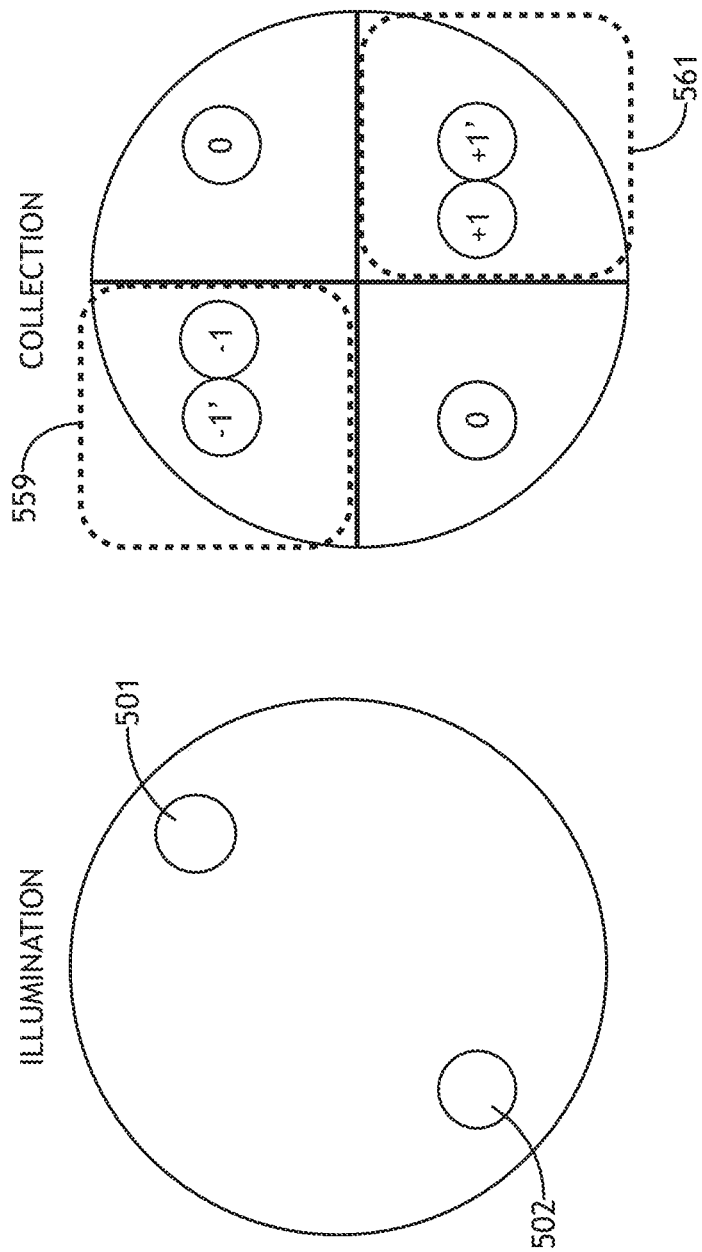
FIG. 21 illustrates a one-step off-center configuration for sample illumination and collection using the single scattering optical Moiré effect, in accordance with one or more embodiments of the present disclosure.

FIG. 21 shows a one-step off-center configuration for sample illumination and collection using the single scattering optical Moiré effect In this embodiment, illumination lobes 501 and 502 may illuminate the sample (e.g., sample layers 214 and 216, and/or sample layers 218 and 220, etc.), and first order diffraction (+1, +1', −1, −1') may be collected by the collection system. In this configuration, the collection may be split into a number of regions (e.g., collection regions 563 and 567) using a prism. Since two beams are used for imaging, asymmetry in the amplitude between 1st and −1st orders does not imply inaccuracy, moreover contrast and overlay measurement may be less sensitive to the focal position (overlay focus independence requires the target sample layers to be of a PQQP type). In this embodiment, signal DC is minimized (e.g., DC is of the same magnitude as the collected non-zero harmonics). The image generated by this configuration may include Moiré pitch harmonics and additional harmonics of a different pitch. Thus, when the image is generated, non-Moiré harmonics may be removed algorithmically (e.g., using any analog of a Fourier low-path filter).

Figure 22:
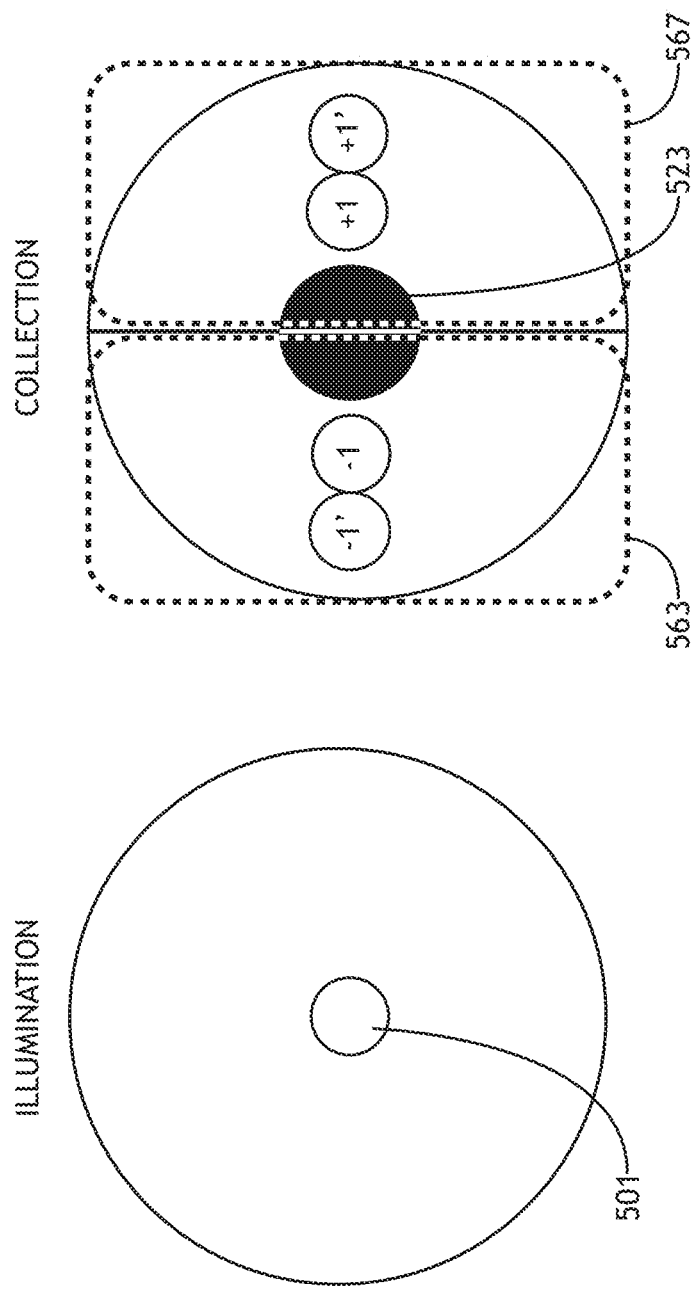
FIG. 22 illustrates a one-step centric configuration for sample illumination and collection using the single scattering optical Moiré effect, in accordance with one or more embodiments of the present disclosure.
Figure 23A:
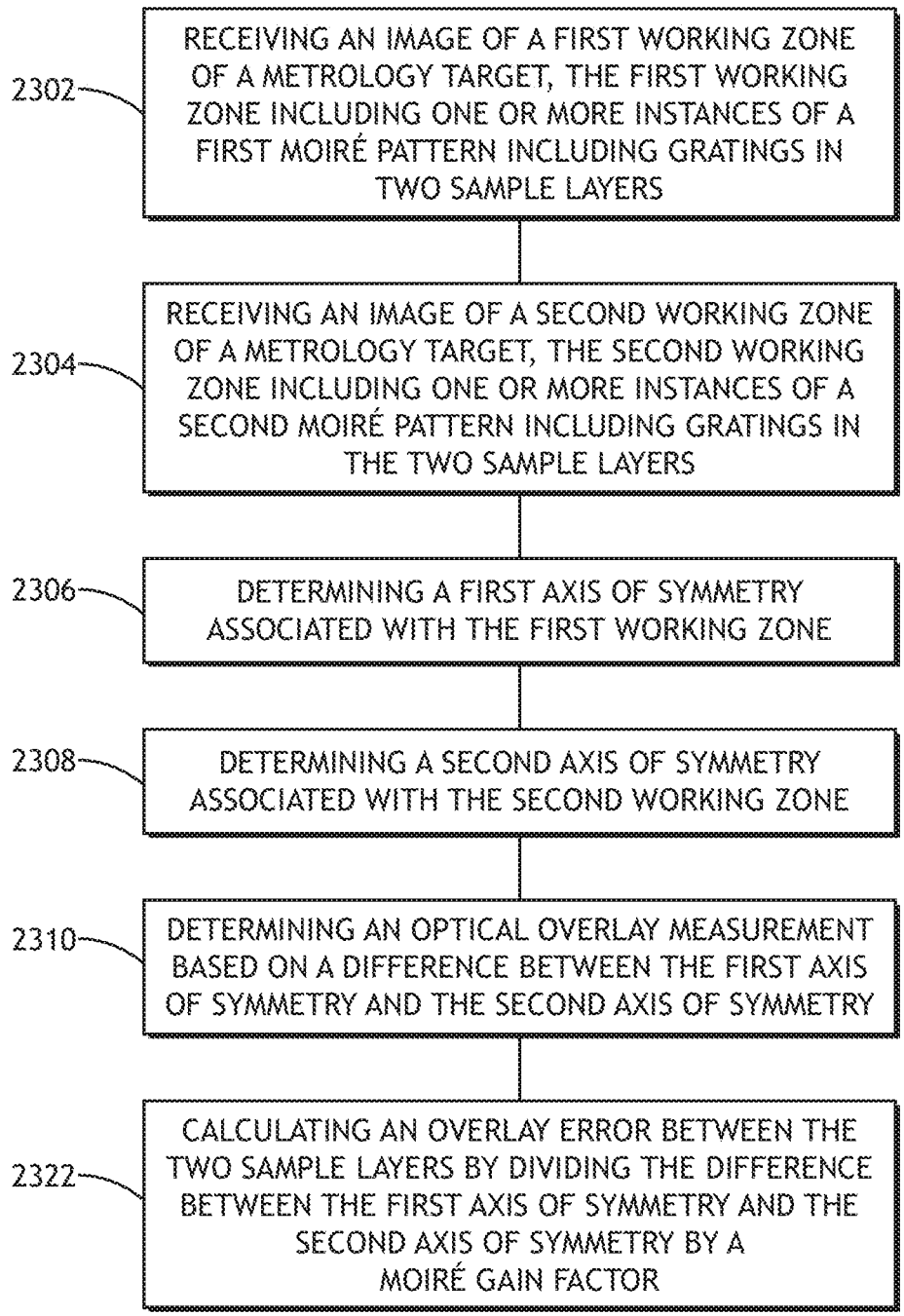
FIG. 23A is a flow diagram illustrating steps performed in a method for measuring overlay, in accordance with one or more embodiments of the present disclosure.
Figure 23B:
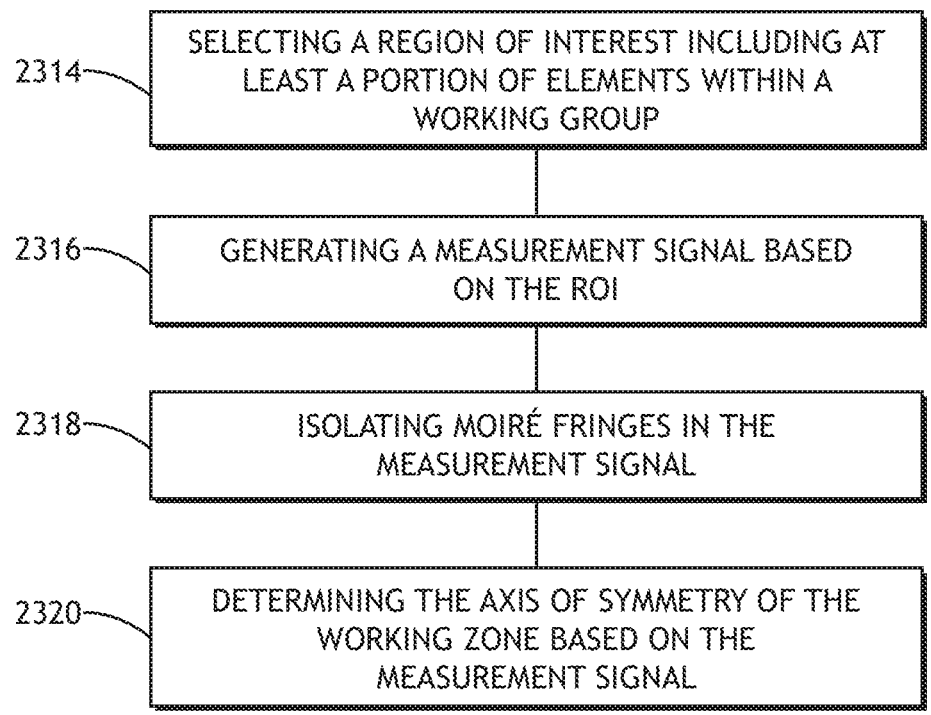
FIG. 23B is a flow diagram illustrating a method for determining an axis of symmetry of a working group, in accordance with one or more embodiments of the present disclosure.

FIG. 22 shows a one-step centric configuration for sample illumination and collection using the single scattering optical Moiré effect including a blocker 523. The blocker 523 may block zero order diffraction and possibly Moiré diffraction orders. An illumination lobe 501 may illuminate the sample (e.g., sample layers 214 and 216, and/or sample layers 218 and 220, etc.), and 1st order diffraction (+1, +1', −1, −1') may be collected by the collection system. The illumination lobe 501 may illuminate the sample at an angle of about 90° with respect to the sample, and may impinge the sample at or near a central portion of a first working zone or a second working zone (e.g., working zones 204 or 208).

In this configuration, the collection may be split into a number of regions (e.g., collection regions 563 and 567) using a prism. Since two beams are used for imaging, asymmetry in the amplitude between 1st and −1st orders does not imply inaccuracy, and moreover contrast and overlay measurement may be less sensitive to the focal position (overlay focus independence requires the target sample layers to be of a PQQP type). In this embodiment, signal DC is minimized (e.g., DC is of the same magnitude as the collected non-zero harmonics). The image generated by this configuration may include Moiré pitch harmonics and additional harmonics of a different pitch. Thus, when the image is generated, non-Moiré harmonics may be removed algorithmically (e.g., using any analog of a Fourier low-path filter).

The configurations of FIGS. 21 and 22 each include a prism configured to split the image into a number of images based on the location of the collection pupil. By splitting the collection pupil, a blocker (e.g., blocker 523) is not required since the splitting may move the undesired signal (e.g., undesired diffraction orders) into another optical path (such that there is no interference between the undesired signals and other signals). Thus, in FIGS. 21 and 22, the undesirable 0-order diffraction is removed by splitting the collection pupil. In general, any of the configurations described with respect to FIGS. 5-9B and FIGS. 12-22 may include pupil splitting in place of a blocker.

Figure 26B:
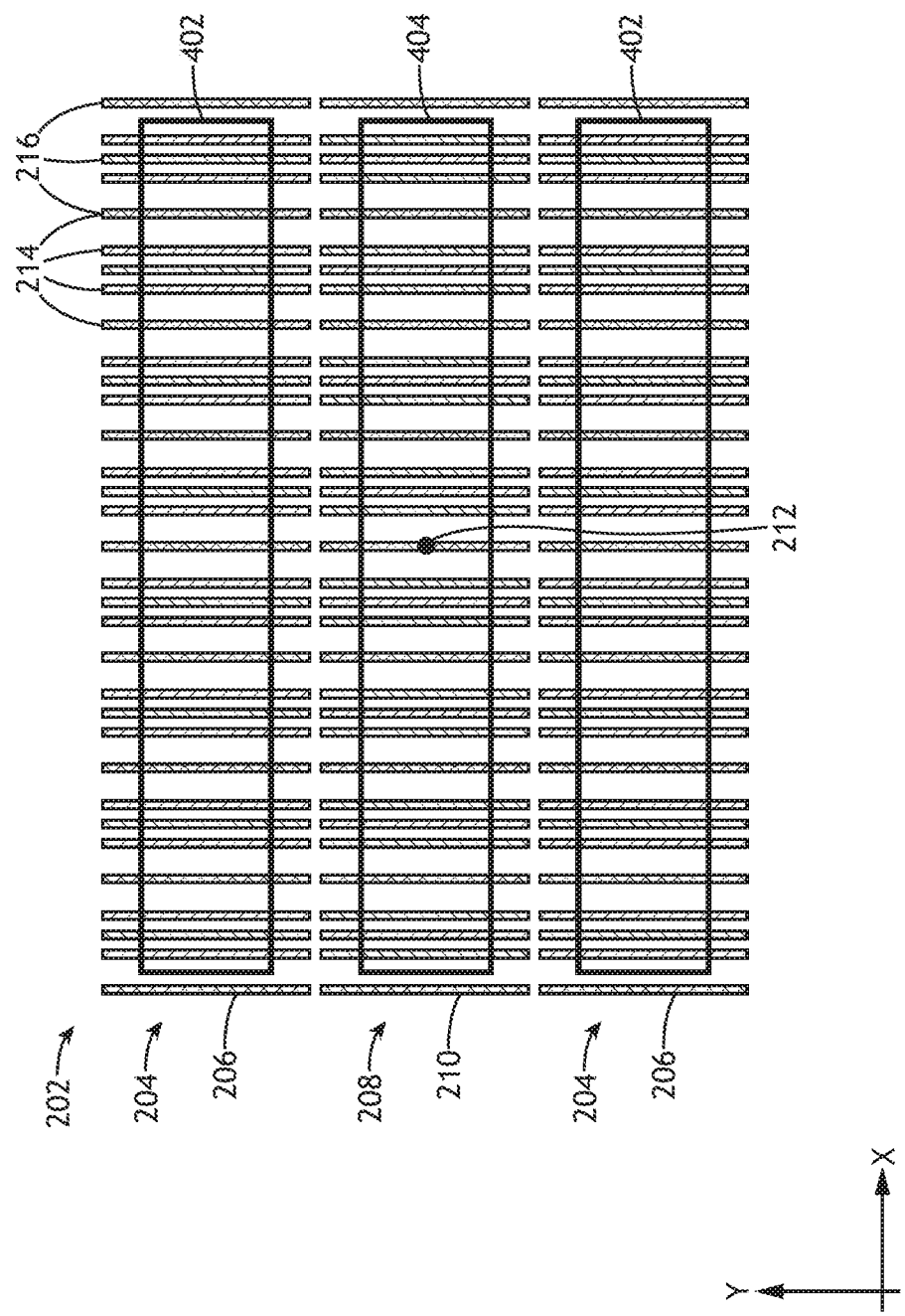
FIG. 26B is a top view of the metrology target of FIG. 26A with additional markings illustrating the application of the method, in accordance with one or more embodiments of the present disclosure.
Figure 27:
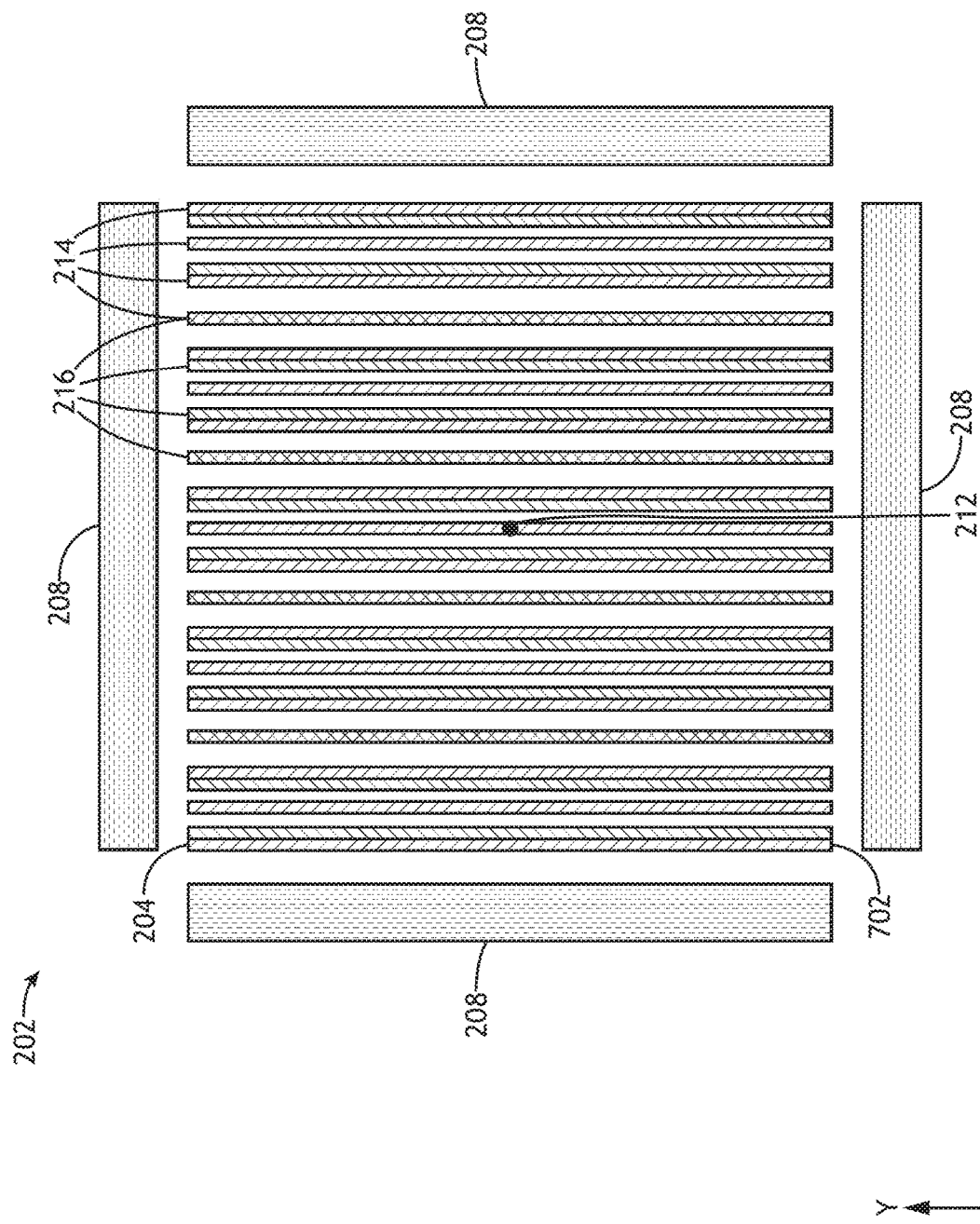
FIG. 27 is a top view of a Moiré-in-box metrology target, where the first working zone includes a single instance of a Moiré pattern and the second working zone includes non-periodic single-layer structures surrounding the Moiré pattern, in accordance with one or more embodiments of the present disclosure.
Figure 28A:
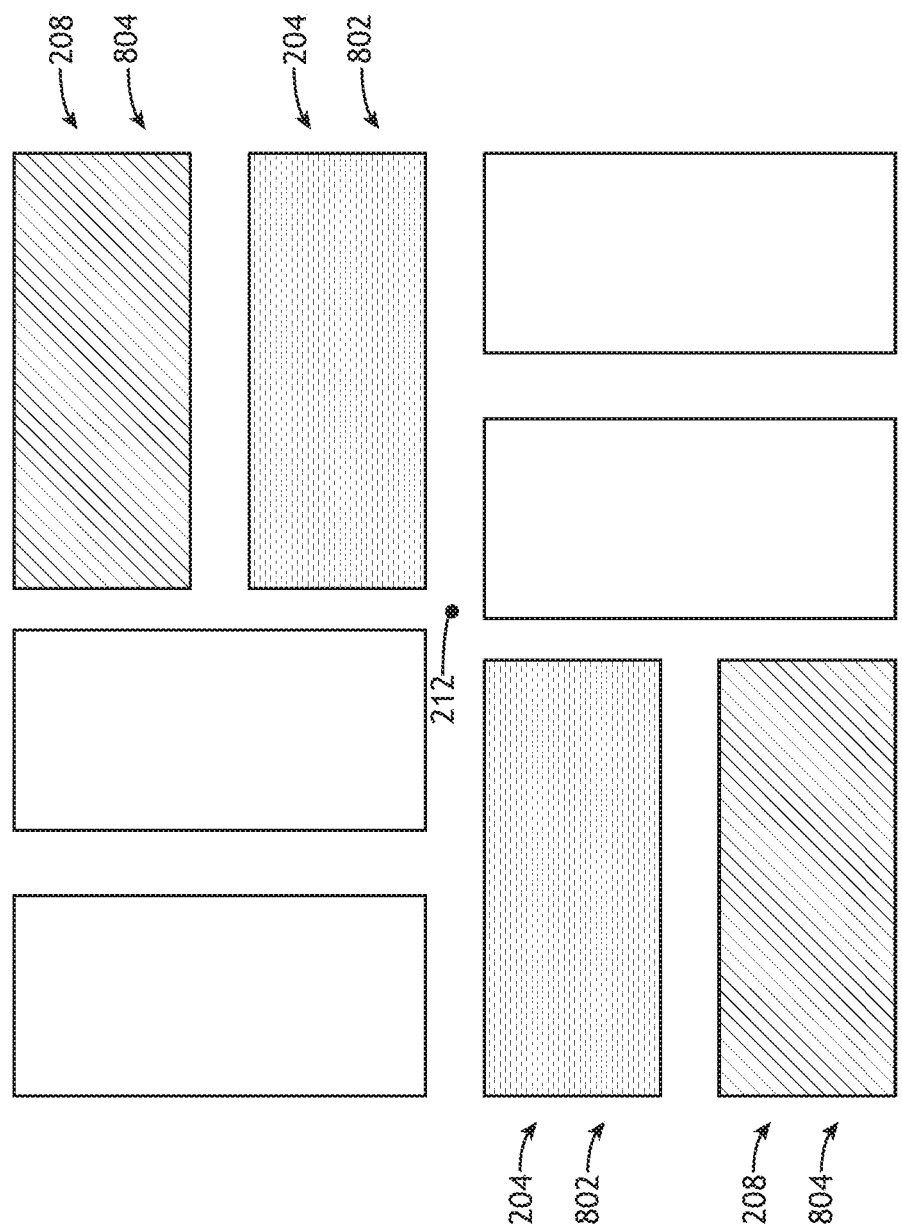
FIG. 28A is a top block diagram view of a three-layer metrology target having Moiré patterns based on grating-over-grating structures across multiple layers, in accordance with one or more embodiments of the present disclosure.
Figure 28B:
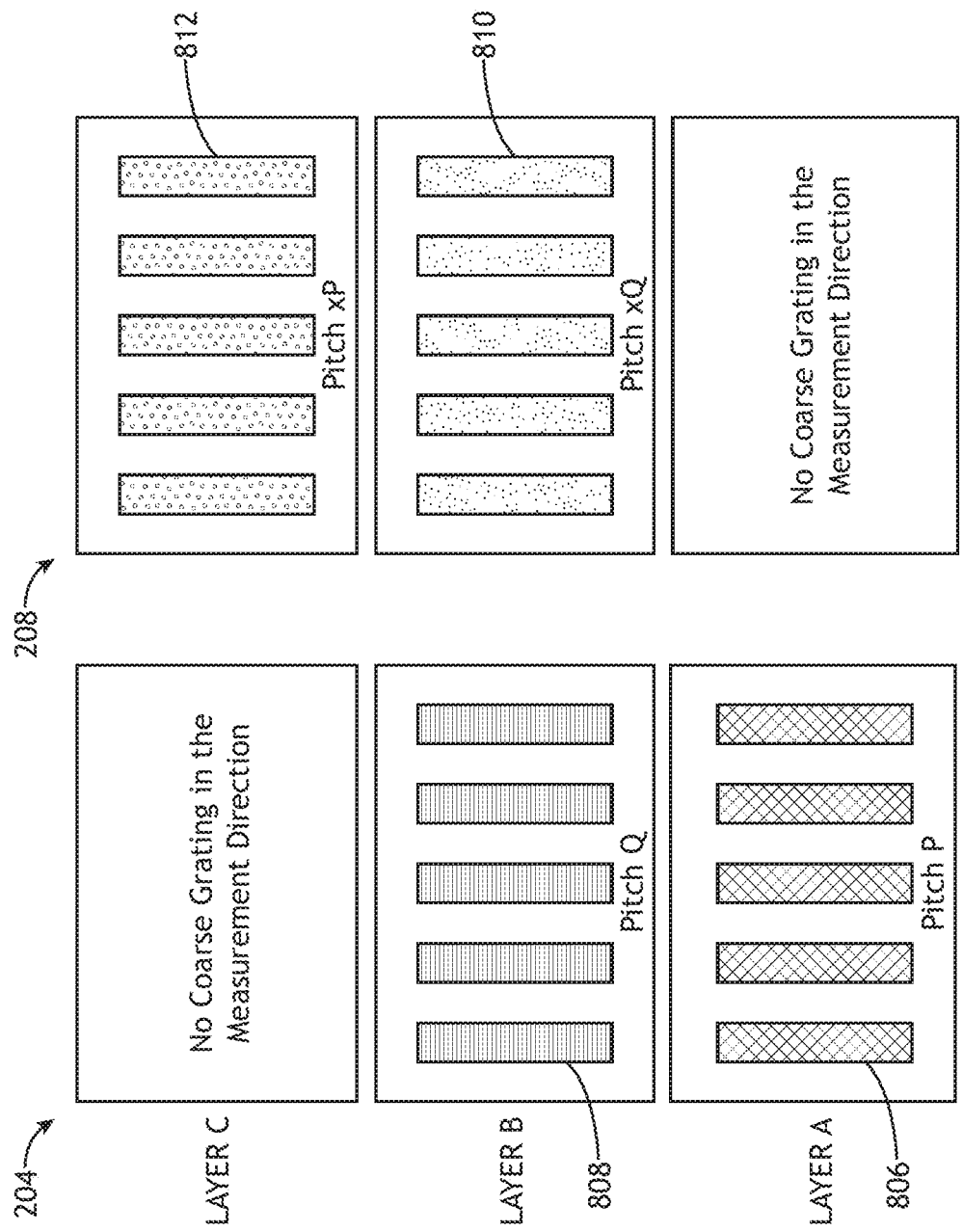
FIG. 28B is a conceptual view of multi-layer grating structures in the Moiré patterns of FIG. 28A, in accordance with one or more embodiments of the present disclosure.
Figure 29A:
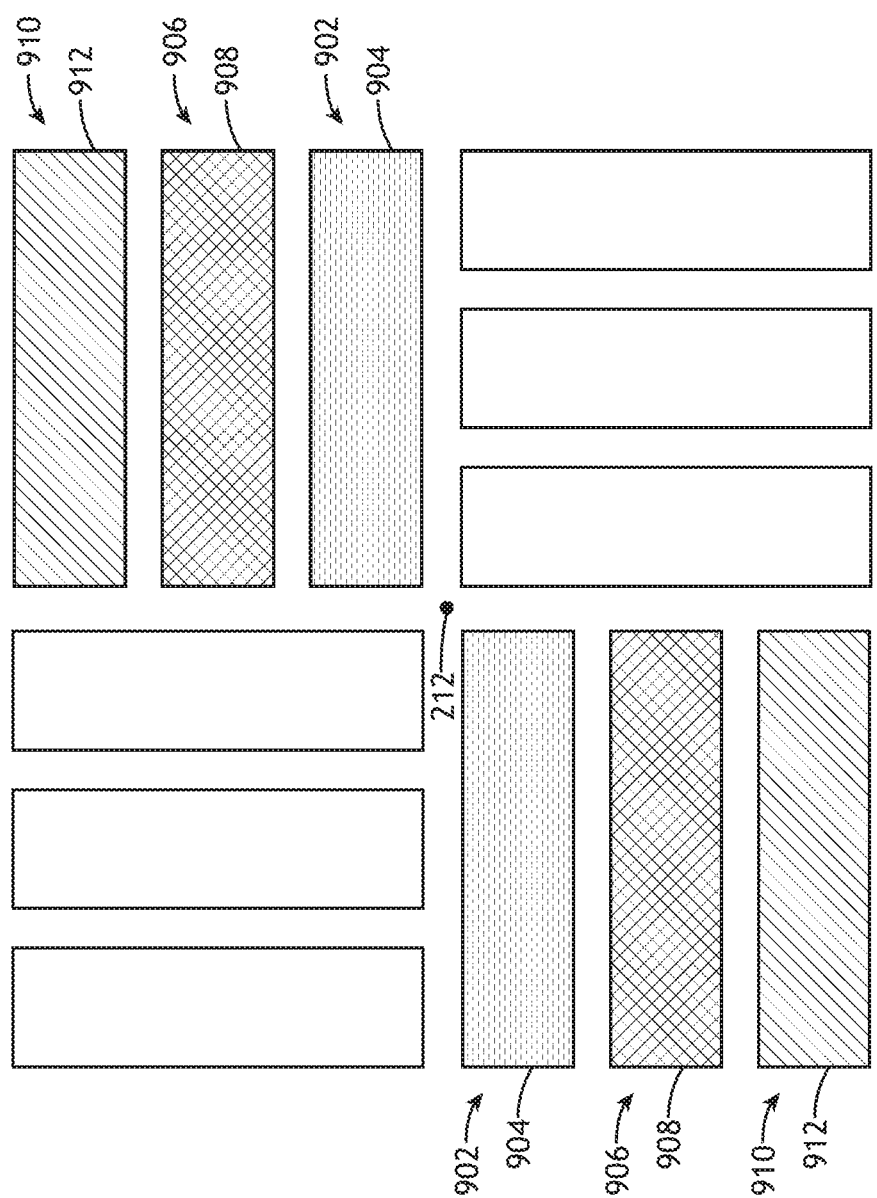
FIG. 29A is a top block diagram view of a triple-Moiré metrology target, in accordance with one or more embodiments of the present disclosure.
Figure 29B:
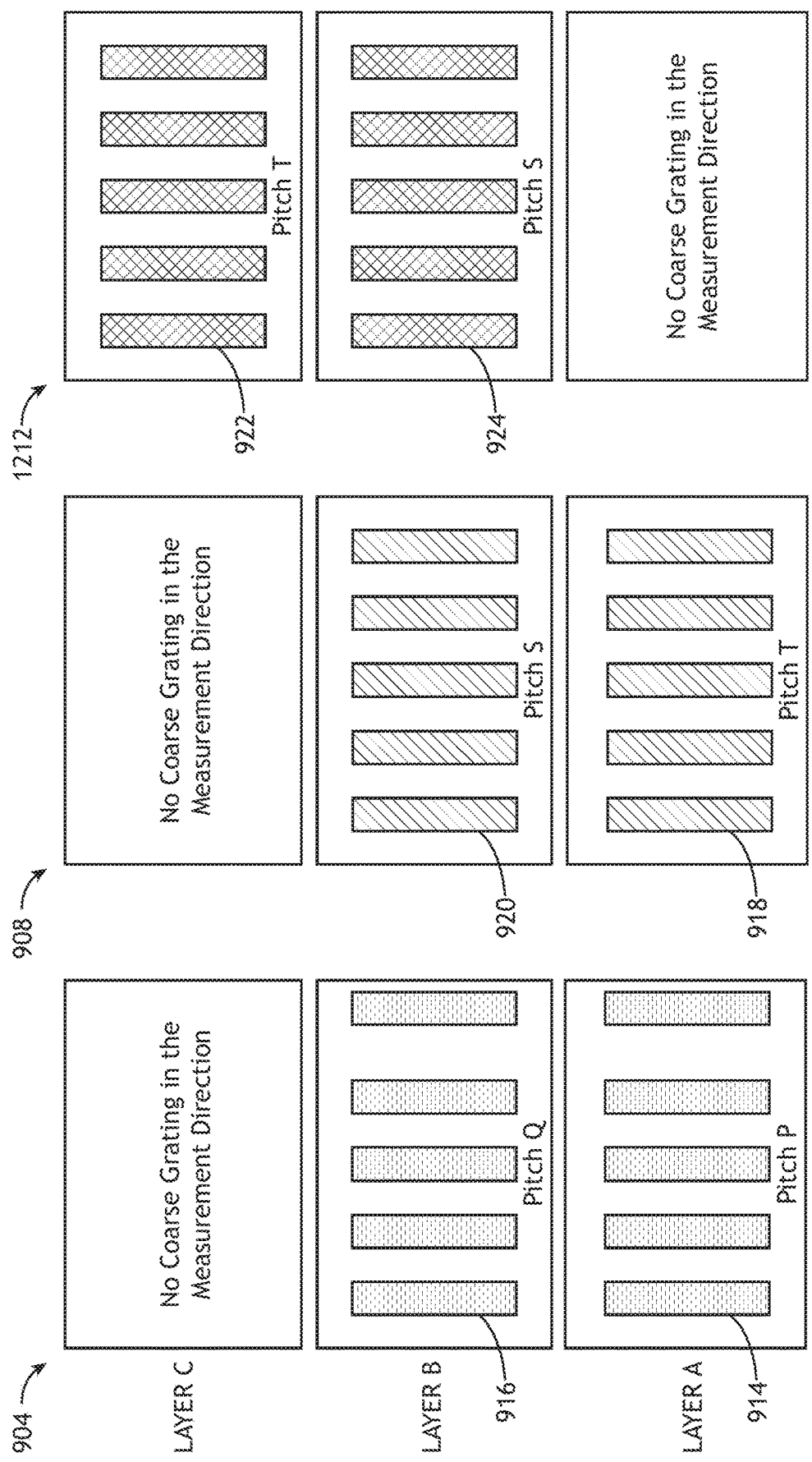
FIG. 29B is a conceptual view of multi-layer grating structures in the Moiré patterns of FIG. 29A, in accordance with one or more embodiments of the present disclosure.

Referring now to FIGS. 23A-29B, various metrology targets and methods of measuring overlay are described in detail. FIGS. 23A-B are flow diagrams illustrating methods to calculate overlay by exploiting the symmetry of working zones. FIGS. 24A through 26B illustrate overlay using metrology targets having Moiré patterns in two working zones. FIGS. 27 through 28C illustrate overlay using metrology targets having Moiré patterns in one working zone and single-layer structures (e.g., not a grating over grating structure) in a second working zone. FIGS. 29A and 29B illustrate overlay using metrology targets with three or more layers having Moiré patterns in two working zones, where one layer serves as a reference layer. It is noted herein that the samples and metrology targets described with respect to the configurations of FIGS. 3-22 may be the same or substantially identical to any of the samples and metrology targets as described with respect to FIGS. 23A-29B. For example, any of the samples described with respect to FIGS. 3-22 may include a metrology target having the sample layers 806 and 808 of FIG. 28B, or a metrology target having the sample layers 914 and 916 of FIG. 29B, etc.

FIG. 23A is a flow diagram illustrating steps performed in a method 2300 for measuring overlay, in accordance with one or more embodiments of the present disclosure. For example, the method 2300 may be applied to measure overlay based on a metrology target such as, but not limited to, metrology target 202 illustrated in FIGS. 2A-2C. Applicant notes that the embodiments and enabling technologies described previously herein in the context of the metrology system 100 should be interpreted to extend to the method 2300. It is further noted, however, that the method 2300 is not limited to the architecture of the metrology system 100. Further, the method 2300 may be applied to measure overlay along one or more measurement directions.

In one embodiment, the method 2300 includes a step 2302 of receiving an image of a first working zone of a metrology target, the first working zone including one or more instances of a first Moiré pattern including gratings in two sample layers. In another embodiment, the method 2300 includes a step 2304 of receiving an image of a second working zone of a metrology target, the second working zone including one or more instances of a second Moiré pattern including gratings in the two sample layers.

The images of the first Moiré pattern 206 and the second Moiré pattern 210 may be associated with separate images or a single, common image. In one embodiment, an image of the entire metrology target 202 is obtained (e.g., with the metrology system 100) such that the first working zone 204 and the second working zone 208 may be analyzed based on the same image. In another embodiment, separate images of the metrology target 202 (or portions thereof) are generated for the analysis of the first working zone 204 and the second working zone 208. In this regard, images may be generated using different imaging conditions (e.g., different wavelengths of illumination, angles of illumination incidence, polarization, focus, or the like).

In another embodiment, the method 2300 includes a step 2306 of determining a first axis of symmetry orthogonal to a measurement direction associated with the first working zone. In another embodiment, the method 2300 includes a step 2308 of determining a second axis of symmetry orthogonal to the measurement direction associated with the second working zone. In another embodiment, the method 2300 includes a step 2310 of measuring a difference between the first axis of symmetry and the second axis of symmetry. Further, a center of symmetry 212 of one or more working zones may be found by determining axes of symmetry orthogonal to different directions (e.g., orthogonal directions) and finding an intersection point.

The axes of symmetry of the first working zone 204 and the second working zone 208 may be determined using any technique known in the art in step 2302 or step 2304. For example, techniques suitable for the measurement of the centers of symmetry of typical AIM targets without Moiré patterns may be used.

Figure 24A:
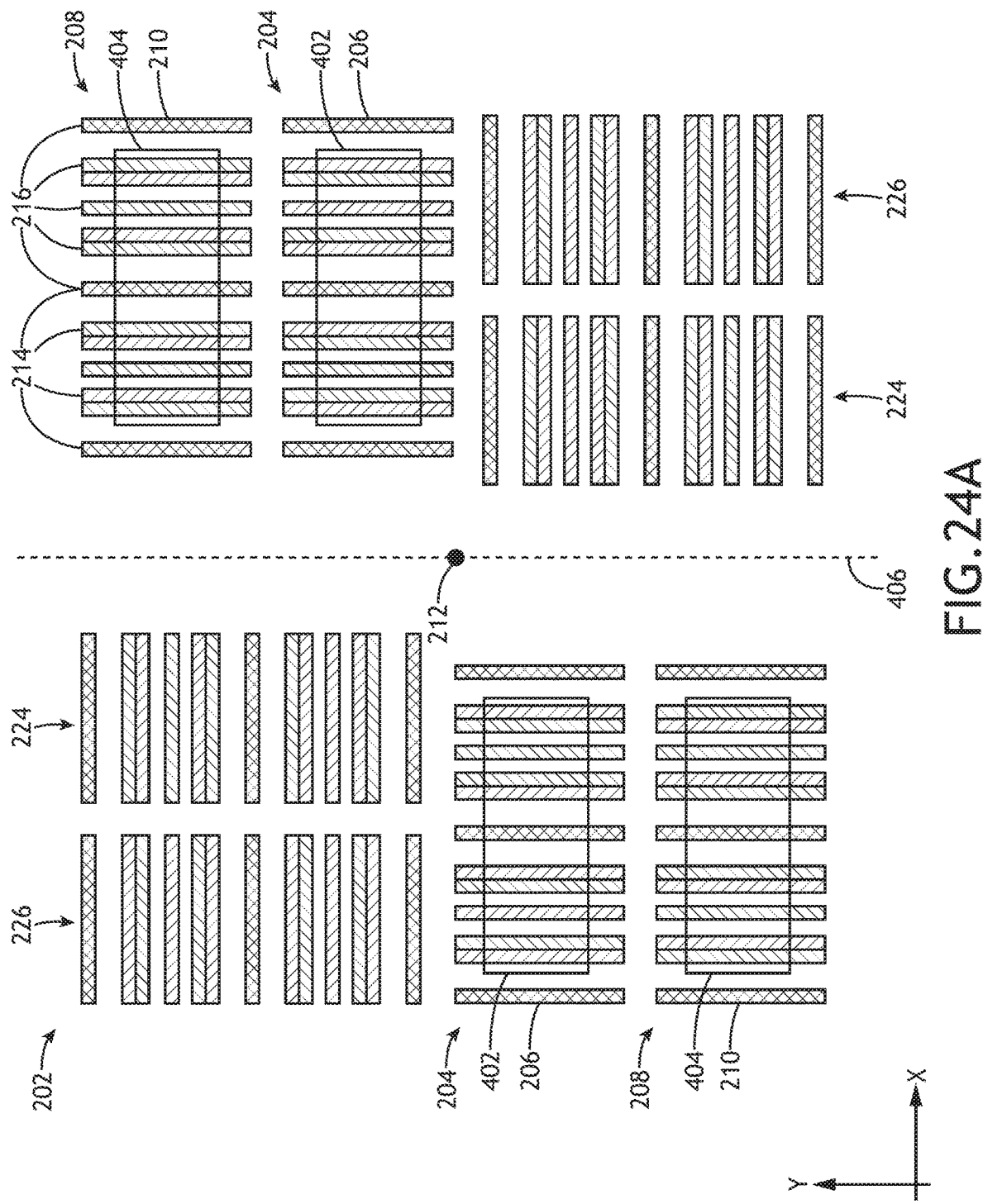
FIG. 24A is a top view of the metrology target of FIG. 2C with additional markings illustrating the application of the method, in accordance with one or more embodiments of the present disclosure.

FIG. 23B is a flow diagram illustrating a method 2312 for determining an axis of symmetry of a working group orthogonal to a measurement direction. In this regard, the method 2312 may be associated with step 2306 and/or step 2308. FIG. 24A is a top view of the metrology target 202 of FIG. 2C with additional markings illustrating the application of the method 2312, in accordance with one or more embodiments of the present disclosure.

In one embodiment, a step 2314 includes selecting a region of interest (ROI) including at least a portion of elements within a working group. For example, the solid boxes in FIG. 24A represent a ROI 402 selecting portions of the first Moiré pattern 206 in the first working zone 204 and the dashed boxes represent a ROI 404 selecting portions of the second Moiré pattern 210 in the second working zone 208.

In another embodiment, a step 2316 includes generating a measurement signal based on the ROI. For example, each value of a measurement signal along the measurement direction may include average (or cumulative) intensity values in the ROI along an orthogonal direction.

It is contemplated herein that the Moiré fringes associated with a Moiré pattern (e.g., the first Moiré pattern 206 or the second Moiré pattern 210) may have a relatively low contrast with respect to the grating structures forming the Moiré pattern that may be visible in an image of the metrology target 202. In another embodiment, a step 2318 includes isolating Moiré fringes in the measurement signal. For example, the step 2318 may include one or more orders of Moiré fringes (e.g., $1^{st}$-order, $2^{nd}$-order, or the like). Isolating the Moiré fringes may decrease noise and increase the accuracy and/or sensitivity of the determination of the axes of symmetry in step 2306 and/or 2308 and may thus improve the accuracy and/or robustness of the determination of the axis of symmetry.

The Moiré fringes may be isolated in step 2318 using any technique known in the art. In one embodiment, the measurement signal is filtered to isolate the Moiré fringes. For example, the spatial frequency content of the measurement signal may be analyzed using a 1D or 2D Fourier filtering or other frequency-based decomposition technique (e.g., decomposition of the measurement signal into sin and/or cos signals). Further, a frequency-selective filter may be used to isolate the spatial frequency of the Moiré fringes (e.g., $1^{st}$-order Moiré fringes, $2^{nd}$-order Moiré fringes, or the like).

In another embodiment, the method 2312 may include a step 2320 of determining an axis of symmetry 406 of the working zone orthogonal to the measurement direction based on the measurement signal. An axis of symmetry 406 of a working zone orthogonal to the measurement direction may be determined using any technique known in the art (e.g., in step 2306 or step 2308 of method 2300 or step 2320 of method 2312). In one embodiment, a portion of the image of the first Moiré pattern 206 (e.g., the ROI of step 314) is correlated with a symmetric version of itself to determine the axis of symmetry. For example, an axis of symmetry 406 of the first working zone 204 may be determined by generating a copy of the portion of the image including the first working zone 204, rotating the image copy by the relevant rotational symmetry of the metrology target 202 (e.g., 90°, 180°, or the like) and performing a correlation between the original image and the image copy at various locations as a function of position along the measurement direction. In this regard, the location along the measurement direction providing the highest correlation between the original image and the rotated version may correspond to the axis of symmetry 406 of the first working zone 204. By way of another example, in the case of a working zone having reflection symmetry (or mirror symmetry), the axis of symmetry 406 of a working zone may be determined by correlating a reflected copy of the working zone with itself.

As described previously herein, the steps associated with the method 2312 may be applied to determine the axis of symmetry 406 of any number of working zones. For example, both step 2306 and step 2308 may include the application of the method 2312.

It is to be understood, however, that the method 2312 for determining an axis of symmetry 406 of a working zone along a measurement direction is provided solely for illustrative purposes and should not be interpreted as limiting. Rather, an axis of symmetry 406 may be determined using any technique known in the art. In one embodiment, an axis of symmetry 406 of a working group along a measurement direction may be applied by first determining regions of interest (e.g., ROI 402 in step 314), isolating one or more orders of Moiré fringes along the measurement direction by performing a spatial frequency filtering operation on the entire ROI (e.g., by treating the features as having infinite dimensions along an orthogonal direction and applying a 1D filtering operation similar to step 318), and correlating the ROI with a rotated version of itself to determine the axis of symmetry 406.

In another embodiment, the method 2300 includes a step 2322 of calculating an overlay error between the two sample layers along the measurement direction by dividing the difference between the axes of symmetry of the first and second working zones 204 orthogonal to the measurement direction with a Moiré gain factor. For example, in FIG. 24A, both the first working zone 204 and the second working zone 208 have overlapping axes of symmetry 406 orthogonal to the measurement direction (e.g., the X-direction) since FIG. 24A illustrates a case with no overlay error. However, in the case of a physical overlay error, the axis of symmetry 406 will not overlap.

Figure 24B:
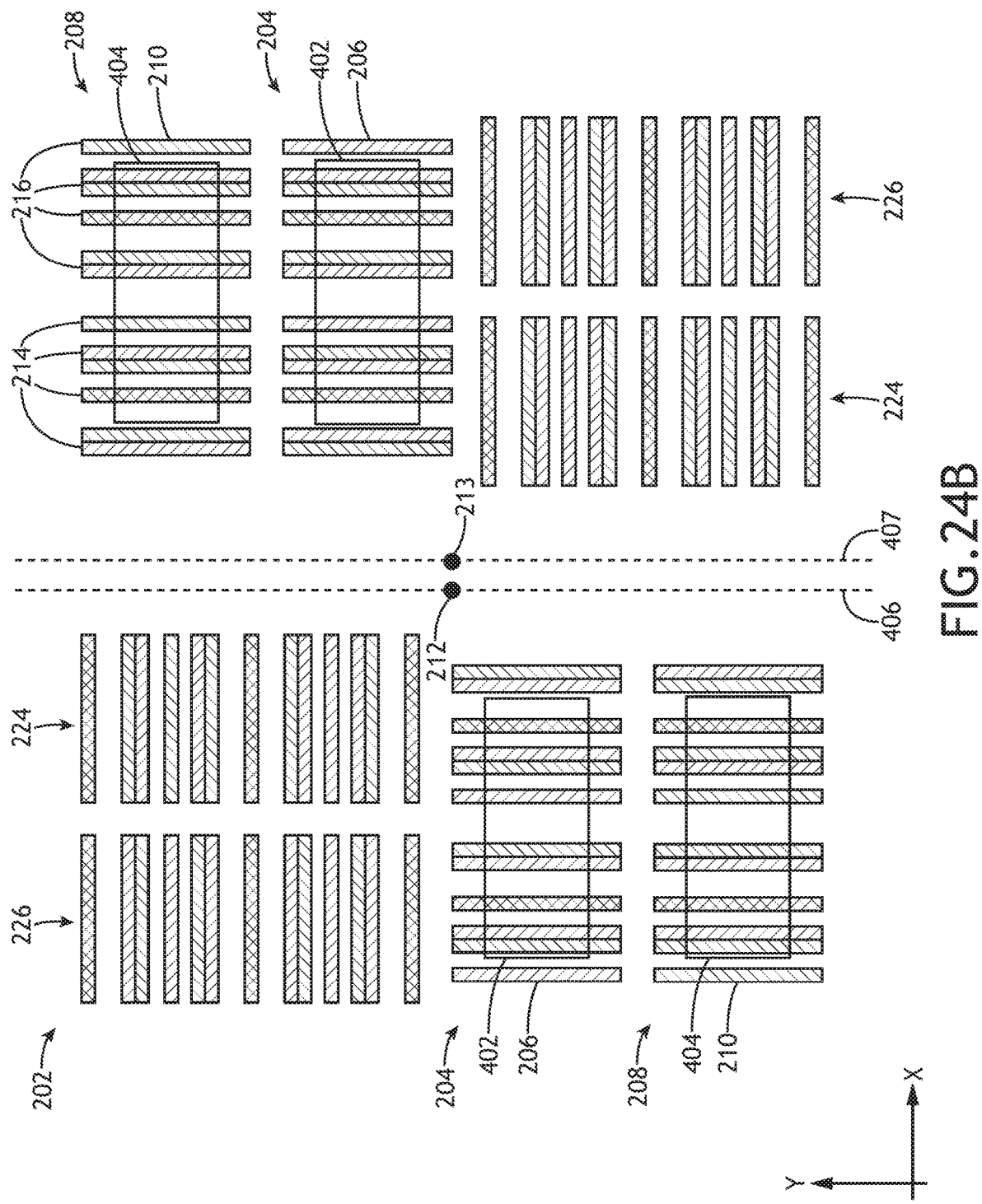
FIG. 24B is a top view of FIG. 24A that illustrates a case where axes of symmetry do not overlap and overlay error exists, in accordance with one or more embodiments of the present disclosure.

For example, in FIG. 24B, the first working zone 204 and the second working zone 208 do not have overlapping axes of symmetry. In FIG. 24B, the first working zone 204 has an axis of symmetry 406 with a center of rotational symmetry 212, while the second working zone 208 has an axis of symmetry 407 with a center of rotational symmetry 213. The axis of symmetry 406 does not overlap with the axis of symmetry 407, and the center of rotational symmetry 212 does not overlap with the center of rotational symmetry 213. Thus, FIG. 24B illustrates a case with overlay error.

Due to the presence of the Moiré fringes, the difference between the axes of symmetry determined in step 2310 is not equal to the physical overlay error between the first and second sample layers. Rather, the difference between the axes of symmetry corresponds to relative shifts of the Moiré fringes. Accordingly, the physical overlay error along a measurement direction may be determined by dividing the difference between the axes of symmetry orthogonal to the measurement direction by a Moiré gain associated with the particular layout of the metrology target 202.

It is recognized herein that the Moiré gain depends on the particular layout of the metrology target 202. For example, the Moiré gain factor ($M_g$) associated with the metrology target 202 in FIG. 2A, where overlay is related to a shift of layer A with respect to layer B, may be characterized as:

$$M_g = M_1 - M_2 = \frac{P}{P-Q} - \frac{S}{S-T} = -\left(\frac{Q}{Q-P} - \frac{T}{T-S}\right). \quad (7)$$

Similarly, the Moiré gain factor associated with a shift of layer A with respect to layer B may be characterized as $-M_g = M_2 - M_1$.

As is evident by equation (7), the Moiré gain is impacted by the conditional Moiré factors associated with the first Moiré pattern 206 and the second Moiré pattern 210, which are in turn functions of the particular values of the grating pitches P, Q, S, and T. Accordingly, the values of the grating pitches P, Q, S, and T may be selected to increase or otherwise optimize the combined Moiré gain and thus the sensitivity to physical overlay errors. For example, the combined Moiré gain may generally be increased by selecting values of the grating pitches P, Q, S, and T such that the Moiré gains of the first working zone 204 and the second working zone 208 have different signs.

Figure 25:
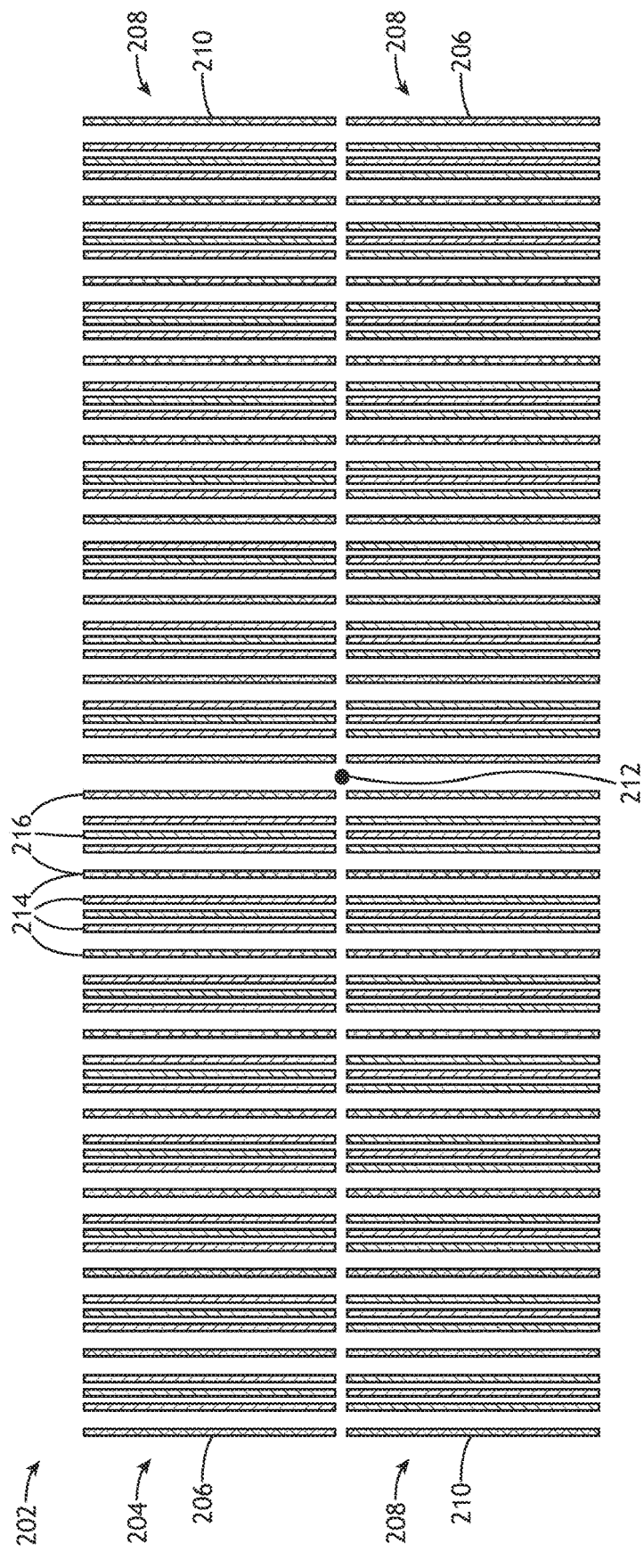
FIG. 25 is a top view of a metrology target including a first working zone including two instances of a first Moiré pattern and a second working zone including a two instances of a second Moiré pattern, in accordance with one or more embodiments of the present disclosure.

Referring now to FIGS. 25 and 26A-B, it is contemplated herein that the method 2300 is not limited to the particular geometry of the metrology target 202 illustrated in FIG. 2A. In a general sense, a working zone (e.g., the first working zone 204 or the second working zone 208) may include any number of instances of a Moiré pattern (e.g., the first Moiré pattern 206 or the second Moiré pattern 210), provided that the working zone is rotation and/or reflection symmetric.

FIG. 25 is a top view of a metrology target 202 including a first working zone 204 including two instances of a first Moiré pattern 206 and a second working zone 208 including two instances of a second Moiré pattern 210, in accordance with one or more embodiments of the present disclosure.

FIG. 26A is a top view of a metrology target 202 including a first working zone 204 including two instances of a first Moiré pattern 206 and a second working zone 208 including a single instance of a second Moiré pattern 210, in accordance with one or more embodiments of the present disclosure.

FIG. 26B is a top view of the metrology target of FIG. 26A with additional markings illustrating the application of the method 2312 of FIG. 23B. The solid boxes in FIG. 26A represent a ROI 402 selecting portions of the first Moiré pattern 206 in the first working zone 204 and the dashed boxes represent a ROI 404 selecting portions of the second Moiré pattern 210 in the second working zone 208 (e.g., step 2314 of method 2312). The ROI 402 and the ROI 404 are used to generate a measurement signals based (e.g., step 2316 of method 2312).

FIG. 27 is a top view of a Moiré-in-box metrology target 202, where the first working zone 204 includes a single instance of a Moiré pattern 702 and the second working zone 208 includes non-periodic single-layer structures surrounding the Moiré pattern 702, in accordance with one or more embodiments of the present disclosure. In FIG. 27, the Moiré pattern 702 includes grating-over-grating structures having periodicity in the X-direction only such that the metrology target 202 in FIG. 7 may be used to provide overlay measurements in the X direction (e.g., in accordance with method 300). However, it is to be understood that the example metrology target 202 in FIG. 7 is provided solely for illustrative purposes and should not be interpreted as limiting. In one embodiment, though not shown, a Moiré-in-box target includes a 2D Moiré pattern with grating-over-grating structures having periodicity along both the X and Y directions to provide overlay measurements along both the X and Y directions.

Referring now to FIGS. 28A-29B, in some embodiments, the metrology target 202 includes a reference layer. In this regard, the structures in the reference layer may interact optically with structures in the additional layers to provide device-like metrology targets (e.g., targets having features having similar size, density, and/or pitch as device features). Device-like metrology targets including a reference layer are generally described in U.S. Pat. Appl. Publ. No. 2018/0188663, published on Jul. 5, 2018, which is incorporated herein by reference in its entirety.

FIG. 28A is a top block diagram view of a three-layer metrology target 202 having Moiré patterns based on grating-over-grating structures across multiple layers, in accordance with one or more embodiments of the present disclosure. FIG. 28B is a conceptual view of multi-layer grating structures in the Moiré patterns of FIG. 28A, in accordance with one or more embodiments of the present disclosure. In one embodiment, the metrology target 202 includes a first working zone 204 including two instances of a first Moiré pattern 802 and a second working zone 208 including two instances of a second Moiré pattern 804.

As illustrated in FIG. 28B, the first Moiré pattern 802 is formed from a grating structure 806 having a pitch P in a first layer (layer A), a grating structure 808 having a pitch Q in a reference layer (layer B), and no grating structure in a third layer (layer C), where P≠Q. Further, the second Moiré pattern 804 is formed from a grating structure 810 having a pitch x·Q in the reference layer (layer B) and a grating structure 812 having a pitch x·P in the third layer (layer A), where x is a positive number (e.g., a rational number). In this regard, both the first Moiré pattern 802 and the second Moiré pattern 804 incorporate structures in the reference layer. Further, the reference layer structures need not have the same pitch in the first Moiré pattern 802 and the second Moiré pattern 804.

It is contemplated herein that the metrology target 202 in FIG. 28A is suitable for providing overlay measurements between layers A and C. The Moiré gain ($M_g$) associated with a shift of layer A with respect to layer B for this metrology target 202 is:

$$M_g = \frac{Q}{P-Q}. \quad (9)$$

FIG. 28C is a top view of a metrology target 202 based on FIGS. 28A and 28B for measurement along two orthogonal directions, in accordance with one or more embodiments of the present disclosure. In particular, the metrology target 202 illustrated in FIG. 28C represents an example in which x=1.

It is to be understood that FIGS. 28A-28C and the associated descriptions are provided solely for illustrative purposes and should not be interpreted as limiting. In some embodiments, the metrology target 202 includes at least one working zone with a Moiré pattern having three overlapping gratings in three layers, where one layer is a reference layer. In this regard, the overlays between the other two pairs of layers may be recovered either algorithmically (e.g., by filtering one or more measurement signals to isolate or suppress desired spatial frequencies and/or Moiré fringes) or physically (e.g., using additional working zones).

FIG. 29A is a top block diagram view of a triple-Moiré metrology target 202, in accordance with one or more embodiments of the present disclosure. FIG. 29B is a conceptual view of multi-layer grating structures in the Moiré patterns of FIG. 29A, in accordance with one or more embodiments of the present disclosure. In one embodiment, the metrology target 202 includes a first working zone 902 including two instances of a first Moiré pattern 904, a second working zone 906 including two instances of a second Moiré pattern 908, and a third working zone 910 with two instances of a third Moiré pattern 912. As illustrated in FIG. 29B, the first Moiré pattern 904 is formed from a grating structure 914 having a pitch Q in a first layer (layer A), a grating structure 916 having a pitch P in a second layer (layer B), and no grating structure in a third layer (layer C), where P≠Q. The second Moiré pattern 908 is formed from a grating structure 918 having a pitch T in the first layer (layer A) and a grating structure 920 having a pitch S in the second layer (layer B), where T≠S. The third Moiré pattern 912 is formed from a grating structure 922 having a pitch T in the third layer (layer C) and a grating structure 924 having a pitch S in the second layer (layer B).

It is contemplated herein that the metrology target 202 in FIG. 29A is suitable for providing overlay measurements between layers A and C or between layers A and B. The Moiré gain ($M_g$) associated with a shift of layer A with respect to layer B for this metrology target 202 is:

$$M_g = \frac{P}{P-Q} - \frac{S}{S-T}. \quad (10)$$

The Moiré gain ($M_g$) associated with a shift of layer A with respect to layer C for this metrology target 202 is:

$$M_g = \frac{T}{S-T}. \quad (11)$$

It is to be understood that FIGS. 29A and 29B and the associated descriptions are provided solely for illustrative purposes and should not be interpreted as limiting. For example, a triple Moiré metrology target 202 may generally include additional variations of arrangements of grating structures spanning the three-layers. In one embodiment, a triple Moiré metrology target 202 includes a first working zone 902 having a Moiré pattern based on grating structures on layers A and B, a second working zone 906 having grating structures on layers B and C, and a third working zone 910 including grating structures on layers A and C. Such a target may also be suitable for overlay measurements between layers A and B as well as between layers B and C. Further, a metrology target 202 may generally have any number of layers. For example, a N-tuple metrology target 202 may have N layers with grating structures on selected layers to provide overlay measurements between the selected layers.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
    an imaging system comprising:
        an illumination sub-system configured to illuminate an overlay target with at least one illumination, the overlay target including at least a first working zone and a second working zone for overlay measurements along a measurement direction, wherein at least the first working zone includes a Moiré pattern formed from overlapping periodic structures along the measurement direction on two sample layers, wherein periods of the periodic structures on the two sample layers are different;
        a collection sub-system configured to collect 0-order diffraction and one Moiré diffraction order associated with diffraction of each of the at least one illumination lobe by the first working zone, wherein the collection sub-system is further configured to collect 0-order diffraction and one additional diffraction order associated with diffraction of each of the at least one illumination lobe by the second working zone; and
        a detector configured to generate an image of the overlay target using light collected by the collection sub-system; and
    a controller configured to be coupled to the imaging system, the controller including one or more processors configured to execute program instructions causing the one or more processors to:
        receive the image of the overlay target, wherein an apparent period of the first working zone in the image is based on Moiré interference;
        determine an apparent overlay between the first working zone and the second working zone along the measurement direction based on the image; and
        calculate an overlay between the two sample layers by dividing the apparent overlay by a Moiré gain to compensate for the Moiré interference.

2. The metrology system of claim 1, wherein the at least one illumination lobe is configured to illuminate the overlay target at an angle of about 90° with respect to the overlay target.

3. The metrology system of claim 2, wherein the at least one illumination lobe is configured to illuminate the overlay target at or near at least one of a central portion of the first working zone or the second working zone.

4. The metrology system of claim 1, wherein the at least one illumination lobe comprises two illumination lobes at two oblique illumination angles with respect to the overlay target.

5. The metrology system of claim 4, wherein the illumination sub-system illuminates the overlay target with the two illumination lobes simultaneously.

6. The metrology system of claim 4, wherein the illumination sub-system illuminates the overlay target with the two illumination lobes sequentially.

7. The metrology system of claim 4, wherein the two illumination lobes are oriented along the measurement direction.

8. The metrology system of claim 4, wherein the two illumination lobes are oriented at a non-zero angle with respect to the measurement direction.

9. The metrology system of claim 1, wherein the collection sub-system generates a first image of the overlay target based on the 0-order diffraction and one Moiré diffraction order associated with diffraction of each of the at least one illumination lobe by the first working zone, wherein the collection sub-system generates a second image of the overlay target based on the 0-order diffraction and one additional diffraction order associated with diffraction of each of the at least one illumination lobe by the second working zone, wherein the controller is further configured to determine the apparent overlay by averaging apparent overlays associated with the first image and the second image.

10. The metrology system of claim 9, wherein the at least one illumination lobe comprises two illumination lobes at two oblique illumination angles with respect to the overlay target.

11. The metrology system of claim 10, wherein the illumination sub-system illuminates the overlay target with the two illumination lobes simultaneously, wherein the collection sub-system generates the first image and the second image simultaneously by separating collected light associated with the first working zone from collected light associated with the second working zone.

12. The metrology system of claim 10, wherein the illumination sub-system illuminates the overlay target with the two illumination lobes sequentially.

13. The metrology system of claim 1, wherein the Moiré pattern of the first working zone is a first Moiré pattern, wherein the second working zone includes a second Moiré pattern formed from overlapping periodic structures along the measurement direction on the two sample layers, wherein periods of the periodic structures on the two sample layers in the second working zone are different, wherein the second Moiré pattern is different than the first Moiré pattern.

14. A metrology method comprising:
receiving an image of an overlay target on a sample based on illumination of the overlay target with at least one illumination lobe, the overlay target including at least a first working zone and a second working zone for overlay measurements along a measurement direction, wherein at least the first working zone includes a Moiré pattern formed from overlapping periodic structures along the measurement direction on two sample layers, wherein periods of the periodic structures on the two sample layers are different,
wherein the image is based on 0-order diffraction and one Moiré diffraction order associated with diffraction of each of the at least one illumination lobe by the first working zone, wherein the image is further based on 0-order diffraction and one additional diffraction order associated with diffraction of each of the at least one illumination lobe by the second working zone, wherein an apparent period of the first working zone in the image is based on Moiré interference;
determining an apparent overlay between the first working zone and the second working zone along the measurement direction based on the image; and
calculating an overlay between the two sample layers by dividing the apparent overlay by a Moiré gain to compensate for the Moiré interference.

15. The metrology method of claim 14, wherein the at least one illumination lobe is configured to illuminate the overlay target at an angle of about 90° with respect to the overlay target.

16. The metrology method of claim 15, wherein the at least one illumination lobe is configured to illuminate the overlay target at or near at least one of a central portion of the first working zone or the second working zone.

17. The metrology method of claim 14, wherein the at least one illumination lobe comprises two illumination lobes at two oblique illumination angles with respect to the overlay target.

18. A metrology system comprising:
an imaging system comprising:
an illumination sub-system configured to illuminate an overlay target with at least one illumination lobe, the overlay target including at least a first working zone and a second working zone for overlay measurements along a measurement direction, wherein at least the first working zone includes a Moiré pattern formed from overlapping periodic structures along the measurement direction on two sample layers, the two sample layers including a first sample layer and a second sample layer, wherein periods of the periodic structures on the two sample layers are different;
a collection sub-system configured to collect 1st-order diffraction from each of the two sample layers associated with the first working zone, wherein the collection sub-system is further configured to collect 1st-order diffraction from each of the two sample layers associated with the second working zone; and
a detector configured to generate an image of the overlay target using light collected by the collection sub-system; and
a controller configured to be coupled to the imaging system, the controller including one or more processors configured to execute program instructions causing the one or more processors to:
receive the image of the overlay target, wherein an apparent period of the first working zone in the image is based on Moiré interference at the detector;
filter the image to isolate the Moiré interference;
determine an apparent overlay between the first working zone and the second working zone along the measurement direction based on the image; and
calculate an overlay between the two sample layers by dividing the apparent overlay by a Moiré gain to compensate for the Moiré interference.

19. The metrology system of claim 18, wherein the at least one illumination lobe is configured to illuminate the overlay target at an angle of about 90° with respect to the overlay target.

20. The metrology system of claim 19, wherein the at least one illumination lobe is configured to illuminate the overlay target at or near at least one of a central portion of the first working zone or the second working zone.

21. The metrology system of claim 18, wherein the collection sub-system includes one or more blockers to block 0-order diffraction from at least one of the first working zone or the second working zone.

22. The metrology system of claim 18, wherein a numerical aperture of the collection sub-system is smaller than a numerical aperture of the illumination sub-system to prevent collection of 0-order diffraction from at least one of the first working zone or the second working zone.

23. The metrology system of claim 18, wherein the at least one illumination lobe comprises two illumination lobes at two oblique illumination angles with respect to the overlay target.

24. The metrology system of claim 23, wherein the illumination sub-system illuminates the overlay target with the two illumination lobes simultaneously.

25. The metrology system of claim 23, wherein the illumination sub-system illuminates the overlay target with the two illumination lobes sequentially.

26. The metrology system of claim 23, wherein the two illumination lobes are oriented along the measurement direction.

27. The metrology system of claim 23, wherein the two illumination lobes are oriented at a non-zero angle with respect to the measurement direction.

28. The metrology system of claim 18, wherein the collection sub-system generates a first image of the overlay target based on the 1st-order diffraction from each of the two sample layers associated with the first working zone, wherein the collection sub-system generates a second image of the overlay target based on the 1st-order diffraction from each of the two sample layers associated with the second working zone, wherein the controller is further configured to determine the apparent overlay by averaging apparent overlays associated with the first image and the second image.

29. The metrology system of claim 18, wherein the at least one illumination lobe comprises two illumination lobes at two oblique illumination angles with respect to the overlay target.

30. The metrology system of claim 29, wherein the illumination sub-system illuminates the overlay target with the two illumination lobes simultaneously, wherein the collection sub-system generates a first image and a second image simultaneously by separating collected light associated with the first working zone from collected light associated with the second working zone.

31. The metrology system of claim 30, wherein the illumination sub-system illuminates the overlay target with the two illumination lobes sequentially.

32. A metrology method comprising:
  receiving an image of an overlay target on a sample based on illumination of the overlay target with at least one illumination lobe, the overlay target including at least a first working zone and a second working zone for overlay measurements along a measurement direction, wherein at least the first working zone includes a Moiré pattern formed from overlapping periodic structures along the measurement direction on two sample layers, wherein periods of the periodic structures on the two sample layers are different,
  wherein the image is based on 1st-order diffraction from each of the two sample layers associated with the first working zone, wherein the image is further based on 1st-order diffraction from each of the two sample layers associated with the second working zone, wherein an apparent period of the first working zone in the image is based on Moiré interference;
  determining an apparent overlay between the first working zone and the second working zone along the measurement direction based on the image; and
  calculating an overlay between the two sample layers by dividing the apparent overlay by a Moiré gain to compensate for the Moiré interference.

33. The metrology method of claim 32, wherein the at least one illumination lobe is configured to illuminate the overlay target at an angle of about 90° with respect to the overlay target.

34. The metrology method of claim 33, wherein the at least one illumination lobe is configured to illuminate the overlay target at or near at least one of a central portion of the first working zone or the second working zone.

35. The metrology method of claim 32, wherein the at least one illumination lobe comprises two illumination lobes at two oblique illumination angles.

\* \* \* \* \*